(12) United States Patent
Kurokawa

(10) Patent No.: US 9,837,457 B2
(45) Date of Patent: Dec. 5, 2017

(54) IMAGING DEVICE

(71) Applicant: Semiconductor Energy Laboratory Co., Ltd., Atsugi-shi, Kanagawa-ken (JP)

(72) Inventor: Yoshiyuki Kurokawa, Sagamihara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/327,678

(22) PCT Filed: Jul. 16, 2015

(86) PCT No.: PCT/IB2015/055375
§ 371 (c)(1),
(2) Date: Jan. 20, 2017

(87) PCT Pub. No.: WO2016/012911
PCT Pub. Date: Jan. 28, 2016

(65) Prior Publication Data
US 2017/0207268 A1    Jul. 20, 2017

(30) Foreign Application Priority Data
Jul. 25, 2014    (JP) .................................. 2014-151795

(51) Int. Cl.
*H01L 29/12* (2006.01)
*H01L 27/146* (2006.01)
(Continued)

(52) U.S. Cl.
CPC ...... *H01L 27/14625* (2013.01); *G01J 3/2803* (2013.01); *G01J 3/2823* (2013.01);
(Continued)

(58) Field of Classification Search
CPC .................................................. H01L 27/14616
(Continued)

(56) References Cited

U.S. PATENT DOCUMENTS 8,384,079 B2 *  2/2013  Yamazaki ........... H01L 29/7869
                                                     257/43
8,384,818 B2    2/2013  Hiramoto et al.
(Continued)

FOREIGN PATENT DOCUMENTS

CN    101779288 A    7/2010
CN    102577395 A    7/2012
(Continued)

OTHER PUBLICATIONS

International Search Report (Application No. PCT/IB2015/055375) dated Nov. 24, 2015.
(Continued)

*Primary Examiner* — Chandra Chaudhari
(74) *Attorney, Agent, or Firm* — Robinson Intellectual Property Law Office; Eric J. Robinson

(57) ABSTRACT

An imaging device which does not include a color filter and does not need arithmetic processing using an external processing circuit is provided. A first circuit includes a first photoelectric conversion element, a first transistor, and a second transistor; a second circuit includes a second photoelectric conversion element, a third transistor, and a fourth transistor; a third circuit includes a fifth transistor, a sixth transistor, a seventh transistor, and a second capacitor; the spectroscopic element is provided over the first photoelectric conversion element or the second photoelectric conversion element; and the first circuit and the second circuit is connected to the third circuit through a first capacitor.

10 Claims, 42 Drawing Sheets

(51) Int. Cl.
*G01J 3/28* (2006.01)
*H04N 9/04* (2006.01)
*H04N 9/07* (2006.01)
H01L 29/786 (2006.01)
H04N 5/353 (2011.01)

(52) U.S. Cl.
CPC .. *H01L 27/14603* (2013.01); *H01L 27/14616* (2013.01); *H01L 27/14645* (2013.01); *H01L 27/14689* (2013.01); *H04N 9/045* (2013.01); *H04N 9/07* (2013.01); *H01L 29/7869* (2013.01); *H04N 5/353* (2013.01)

(58) Field of Classification Search
USPC ........................................................ 257/229
See application file for complete search history.

(56) References Cited

U.S. PATENT DOCUMENTS

| | | |
|---|---|---|
| 8,514,319 B2 | 8/2013 | Hiramoto et al. |
| 8,759,931 B2 | 6/2014 | Toshikiyo et al. |
| 8,901,541 B2 * | 12/2014 | Nishiyama ........ H01L 27/14621 257/40 |
| 2010/0188537 A1 | 7/2010 | Hiramoto et al. |
| 2012/0206637 A1 | 8/2012 | Hiramoto et al. |

FOREIGN PATENT DOCUMENTS

| | | |
|---|---|---|
| JP | 11-313334 A | 11/1999 |
| JP | 2012-015424 A | 1/2012 |
| JP | 2012-049619 A | 3/2012 |
| JP | 5325117 | 10/2013 |
| WO | WO-2009/153937 | 12/2009 |
| WO | WO-2012/026051 | 3/2012 |

OTHER PUBLICATIONS

Written Opinion (Application No. PCT/IB2015/055375) dated Nov. 24, 2015.

* cited by examiner $X = W + (R/2) + (B/2)$ $Y = W - (R/2) - (B/2)$ $X = W + (R/2) + (B/2)$
$Y = W - (R/2) - (B/2)$ FIG. 4A  Pixel-R
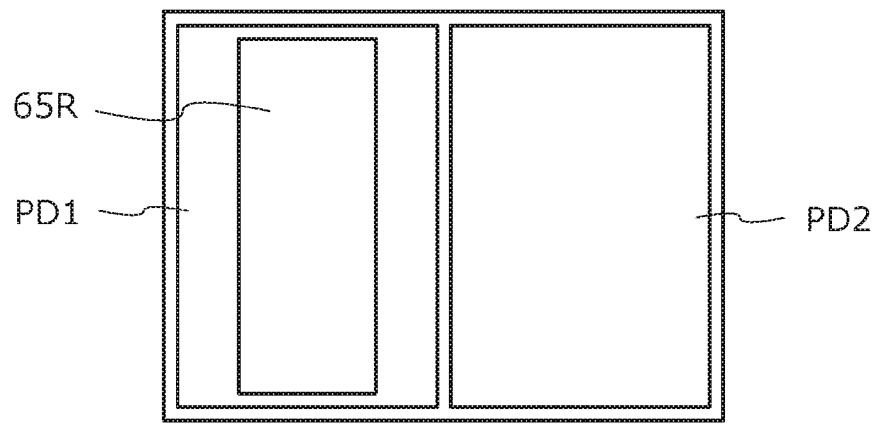
FIG. 4B  Pixel-G
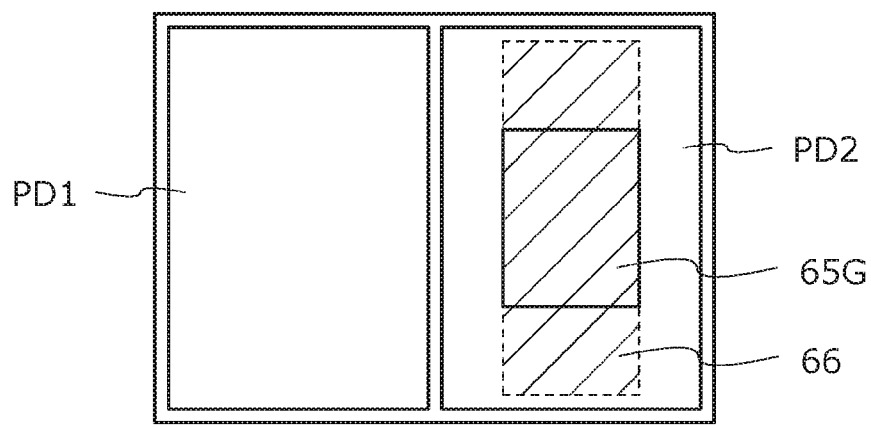
FIG. 4C  Pixel-R
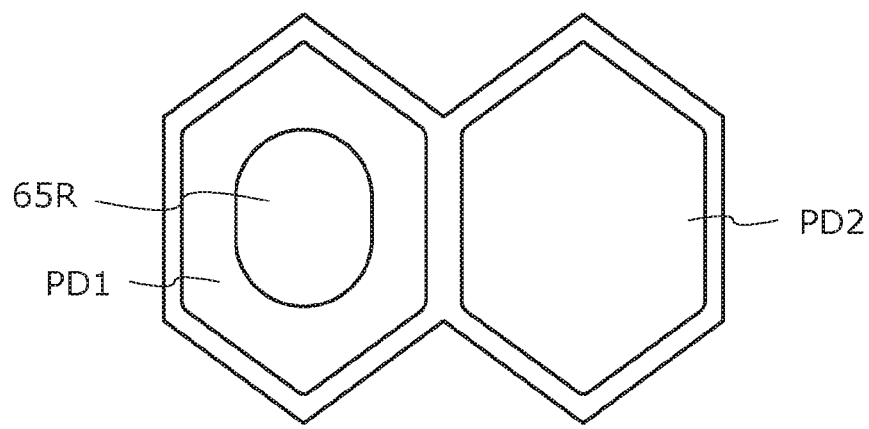

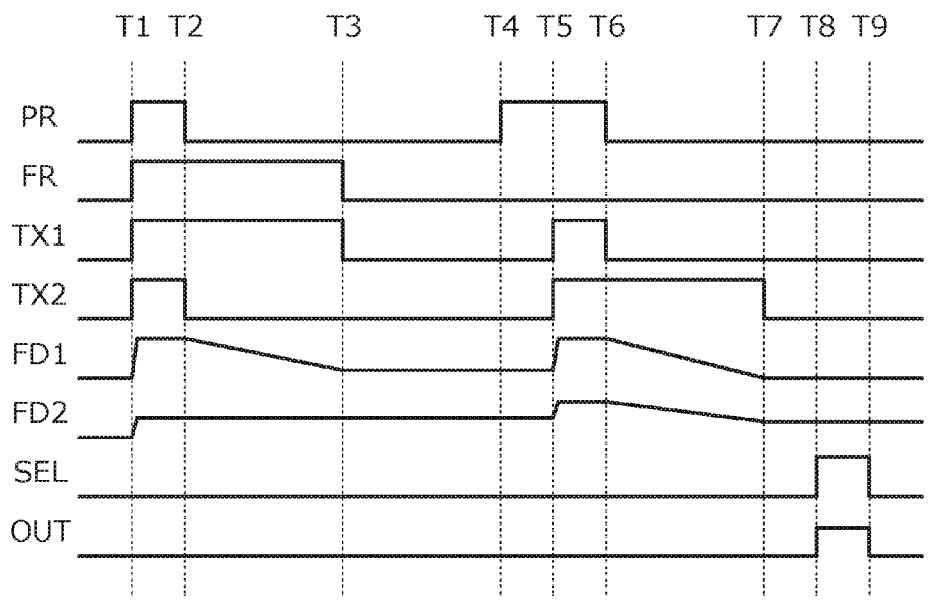
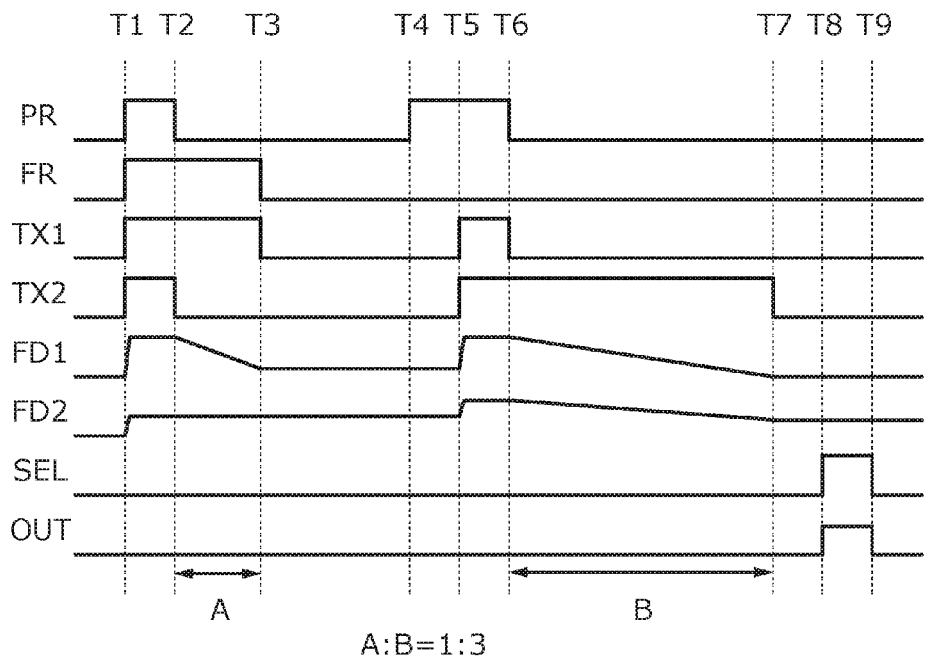

FIG. 9A

| 65R | 65R | 65R |
| 65G | 65G | 65G |
| 65B | 65B | 65B |

FIG. 9B

| 65R | 65R | 65R |
| 65G | 65G | 65G |
| 65B | 65B | 65B |

FIG. 9C

| R | R | R |
| 65G | 65G | 65G |
| 65B | 65B | 65B |

FIG. 9D

| R | R | R |
| G | G | G |
| 65B | 65B | 65B |

FIG. 9E

| 65R | 65R | 65R |
| 65G | 65G | 65G |
| 65B | 65B | 65B |

FIG. 11A1
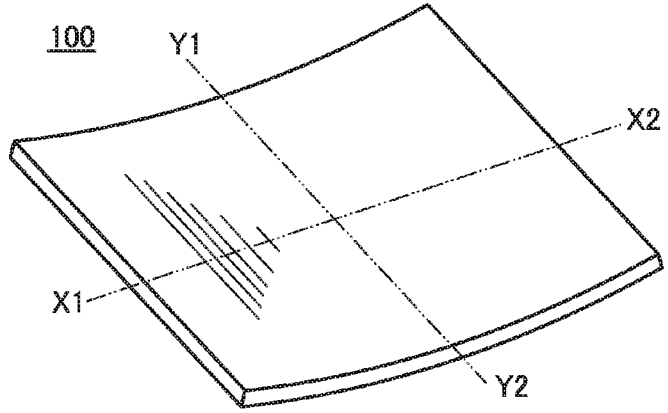
FIG. 11A2
FIG. 11A3
FIG. 11B1
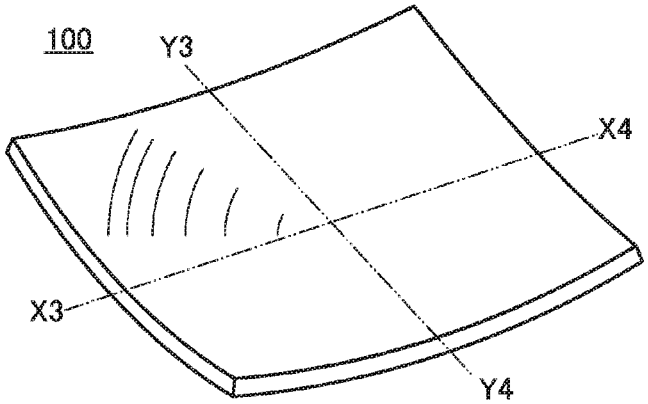
FIG. 11B2
FIG. 11B3

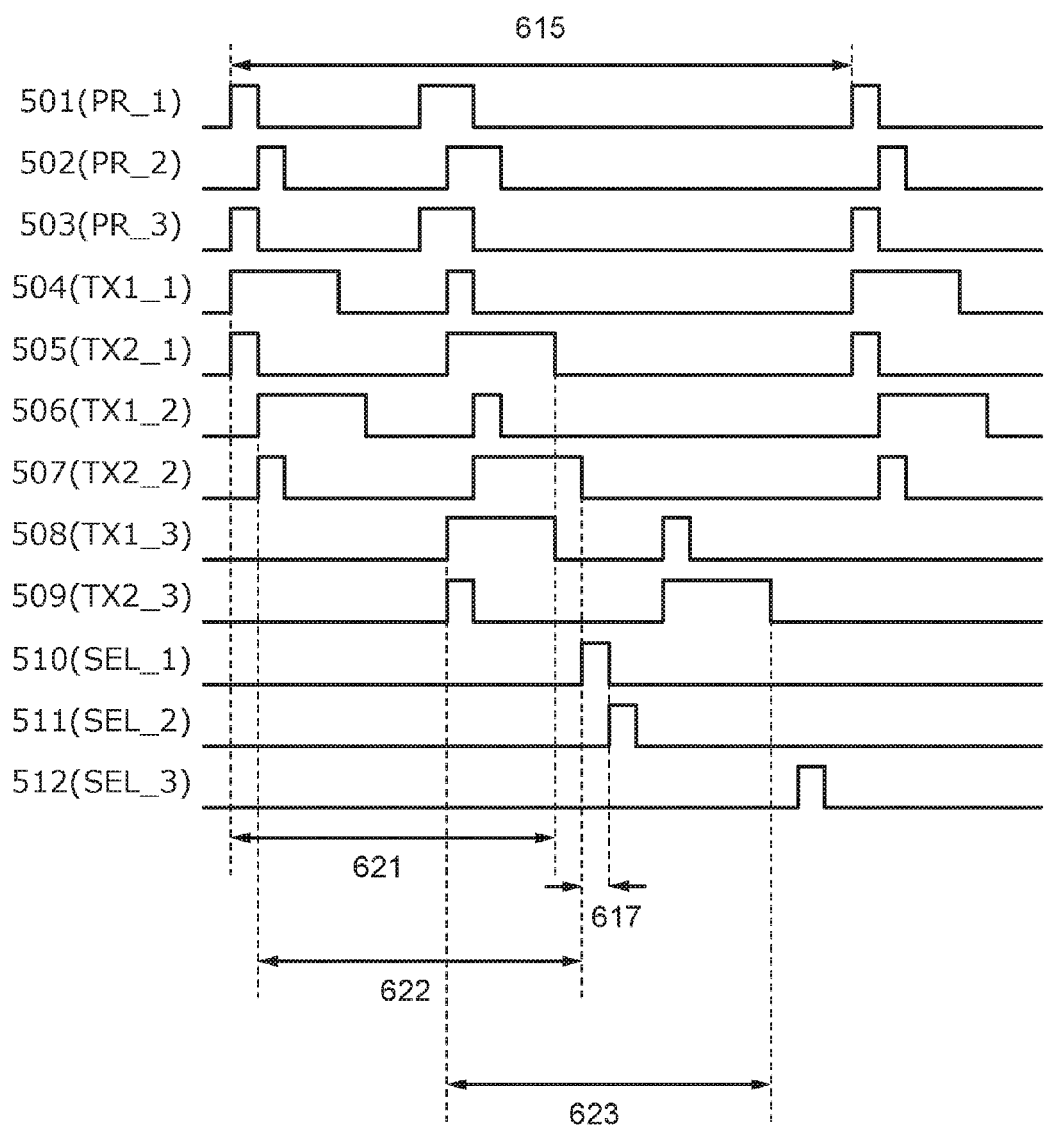

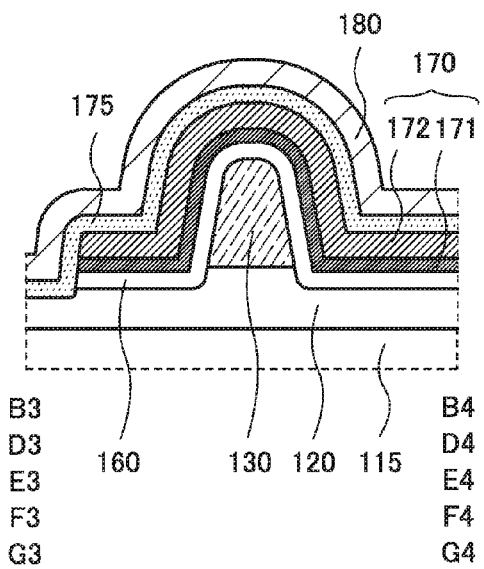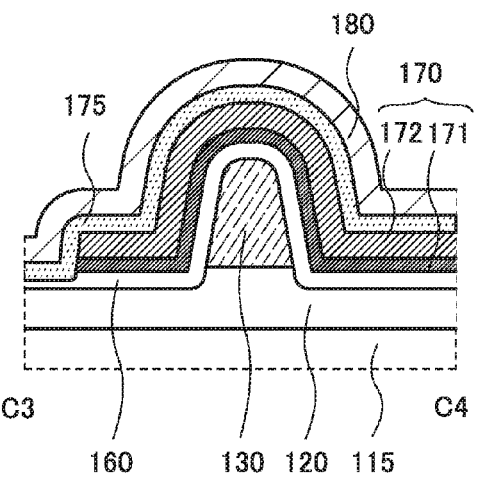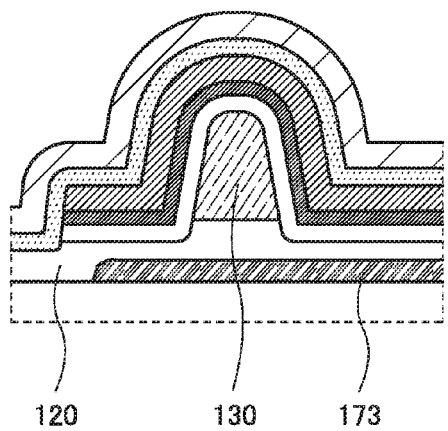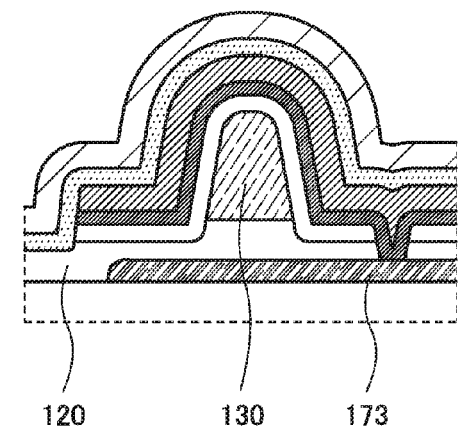

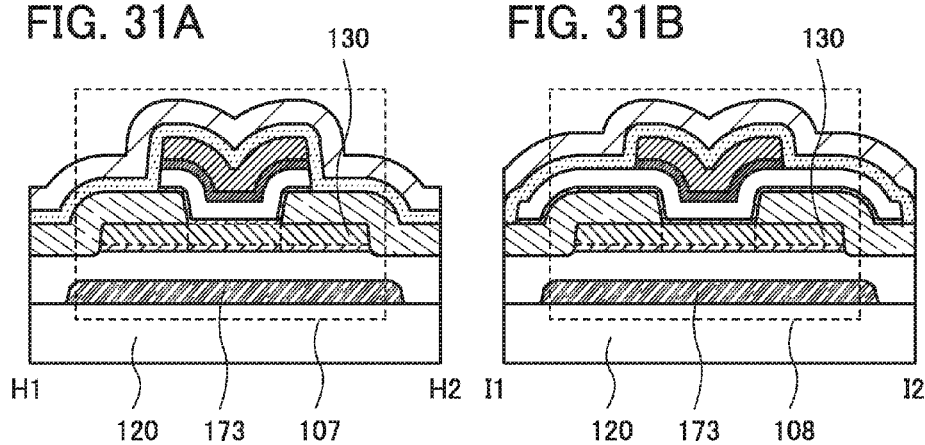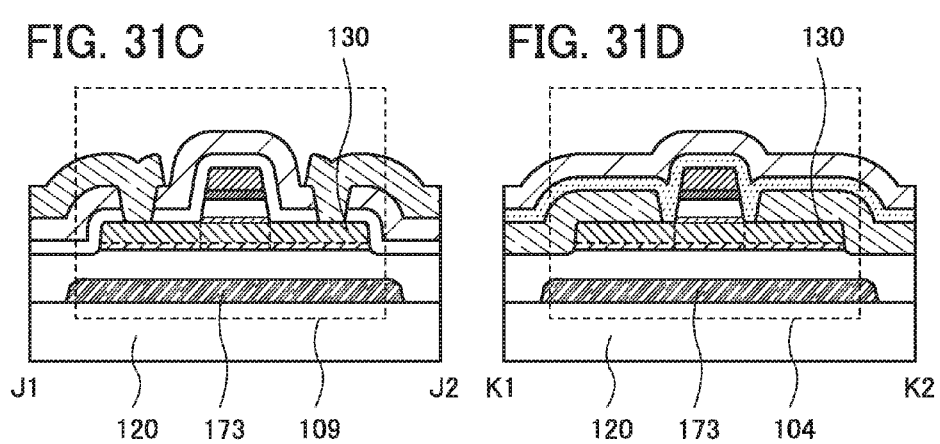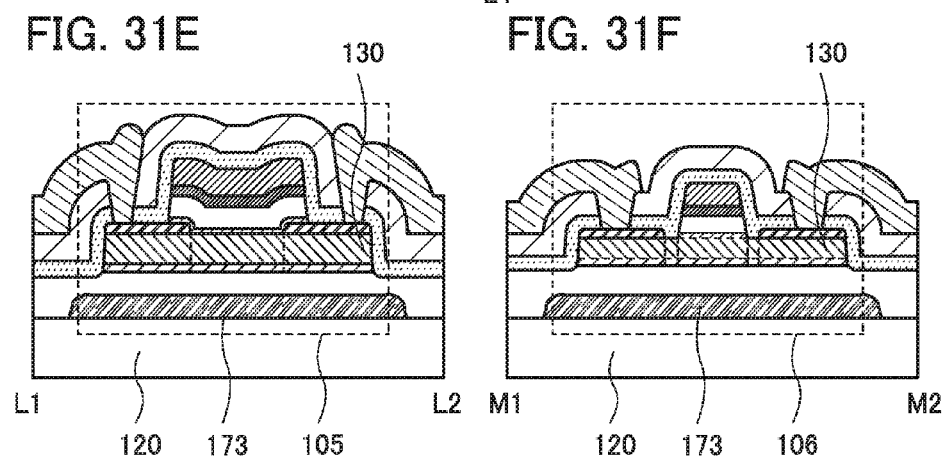

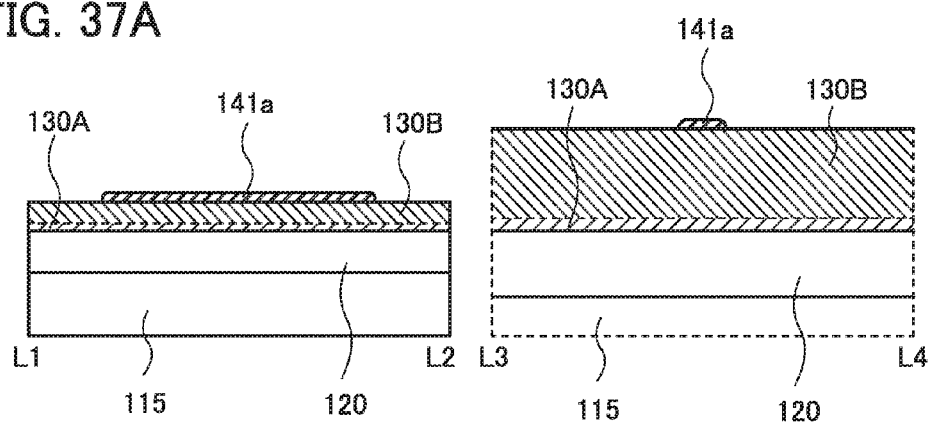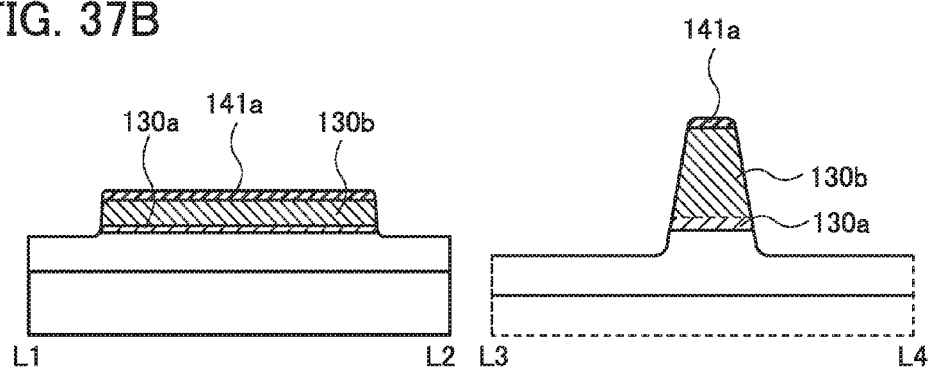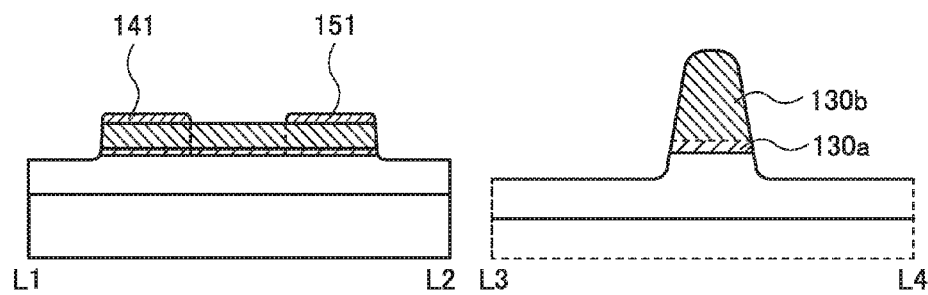

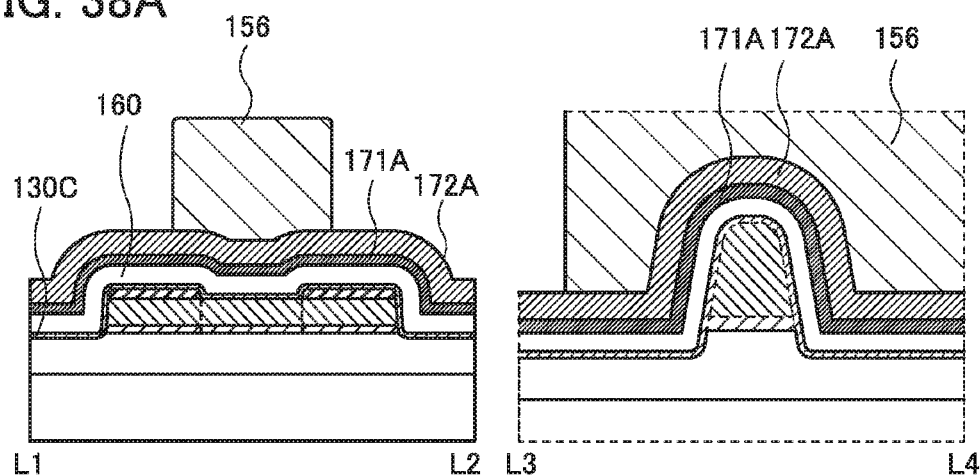
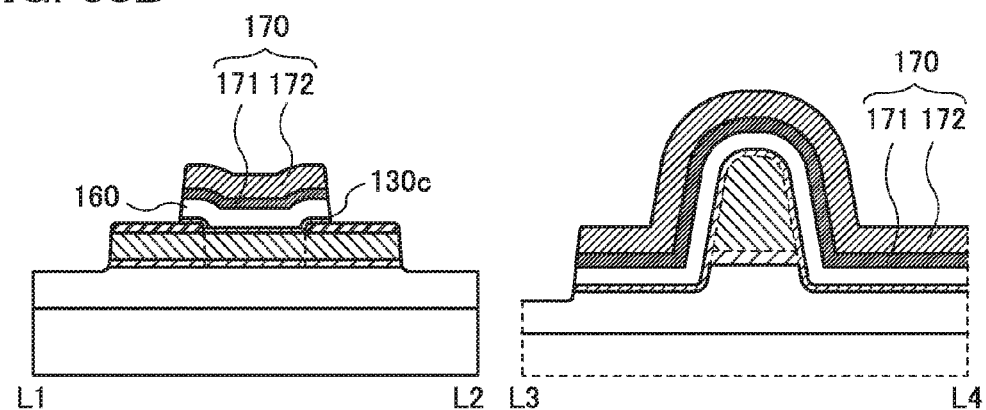
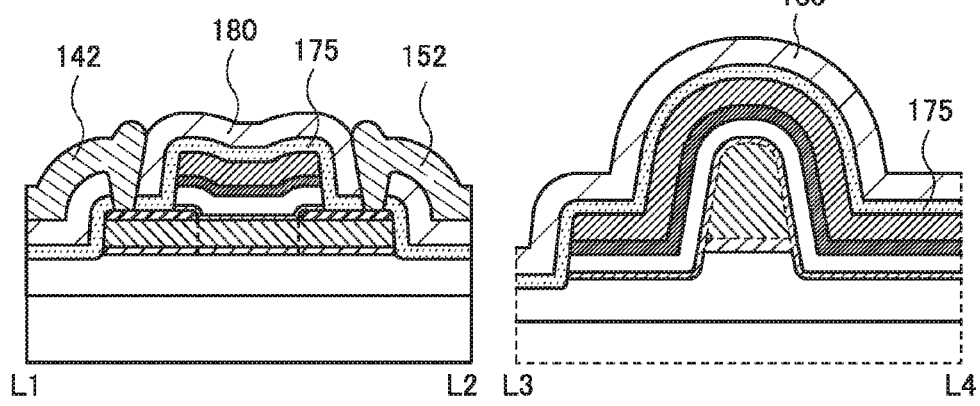

IMAGING DEVICE

TECHNICAL FIELD

One embodiment of the present invention relates to an imaging device.

Note that one embodiment of the present invention is not limited to the above technical field. The technical field of one embodiment of the invention disclosed in this specification and the like relates to an object, a method, or a manufacturing method. Furthermore, one embodiment of the present invention relates to a process, a machine, manufacture, or a composition (a composition of matter). Therefore, more specifically, as examples of the technical field of one embodiment of the present invention disclosed in this specification, a semiconductor device, a display device, a liquid crystal display device, a light-emitting device, a lighting device, a power storage device, a storage device, an imaging device, a method for driving them, or a method for manufacturing them can be given.

Note that in this specification and the like, a semiconductor device generally means a device that can function by utilizing semiconductor characteristics. A transistor and a semiconductor circuit are embodiments of semiconductor devices. In some cases, a storage device, a display device, an imaging device, or an electronic device includes a semiconductor device.

BACKGROUND ART

As a semiconductor device in which pixels each including a photosensor are arranged in a matrix, a CMOS image sensor is known. CMOS image sensors are provided in many portable devices such as digital cameras or cellular phones as imaging elements. In recent years, a pixel in the CMOS image sensor has been made smaller in accordance with the increase in definition of imaging and the reduction in size and power consumption of portable devices.

A color imaging data is obtained in a CMOS image sensor in such a manner that color filters are formed over photosensors, incident light is dispersed by the color filters, and then light with each color is detected by the photosensor. However, a color filter transmits light in a specific wavelength range and absorbs light having the other wavelengths, and thus the use efficiency of incident light is low. Therefore, Patent Document 1 discloses a technique in which a component for dispersing incident light is used instead of a color filter.

PRIOR ART DOCUMENT

Patent Document

[Patent Document 1] International Publication WO 2009/153937 pamphlet

SUMMARY OF THE INVENTION

Problems to be Solved by the Invention

In a structure in Patent Document 1, in order to obtain imaging data of respective colors of RGB, arithmetic processing using an external processing circuit needs to be performed on data obtained directly. Therefore, a structure in which the above arithmetic processing or the like can be omitted is preferable in order to achieve lower power consumption or higher speed of an imaging device.

Accordingly, an object of one embodiment of the present invention is to provide an imaging device which does not need arithmetic processing using an external processing circuit in order to obtain imaging data of respective colors. Alternatively, an object is to provide an imaging device with which a color image can be taken without using a color filter. Alternatively, an object is to provide an imaging device with low power consumption. Alternatively, an object is to provide an imaging device suitable for high-speed operation. Alternatively, an object is to provide an imaging device with high sensitivity. Alternatively, an object is to provide an imaging device with a wide dynamic range. Alternatively, an object is to provide an imaging device with high resolution. Alternatively, an object is to provide an low-cost imaging device. Alternatively, an object is to provide an imaging device with high reliability. Alternatively, an object is to provide a novel imaging device or the like. Alternatively, an object is to provide a novel semiconductor device or the like.

Note that the descriptions of these objects do not disturb the existence of other objects. Note that in one embodiment of the present invention, there is no need to achieve all the objects. Note that other objects will be apparent from the description of the specification, the drawings, the claims, and the like and can be derived from the description of the specification, the drawings, the claims, and the like.

One embodiment of the present invention relates to an imaging device including a spectroscopic element.

One embodiment of the present invention is an imaging device including a pixel circuit and a spectroscopic element. The imaging device is characterized in that the pixel circuit includes a first circuit, a second circuit, a third circuit, and a first capacitor; the first circuit includes a first photoelectric conversion element, a first transistor, and a second transistor; the second circuit includes a second photoelectric conversion element, a third transistor, and a fourth transistor; the third circuit includes a fifth transistor, a sixth transistor, a seventh transistor, and a second capacitor; the spectroscopic element is provided over the first photoelectric conversion element or the second photoelectric conversion element; one of terminals of the first photoelectric conversion element is electrically connected to one of a source and a drain of the first transistor; one of a source and a drain of the second transistor is electrically connected to the one of the source and the drain of the first transistor; the other of the source and the drain of the first transistor is electrically connected to one of terminals of the first capacitor; one of terminals of the second photoelectric conversion element is electrically connected to one of a source and a drain of the third transistor; one of a source and a drain of the fourth transistor is electrically connected to the one of the source and the drain of the third transistor; the other of the source and the drain of the fourth transistor is electrically connected to the one of the terminals of the first capacitor; one of a source and a drain of the fifth transistor is electrically connected to the other of the terminals of the first capacitor; one of terminals of the second capacitor is electrically connected to the other of the terminals of the first capacitor; a gate of the sixth transistor is electrically connected to the other of the terminals of the first capacitor; and one of a source and a drain of the sixth transistor is electrically connected to one of a source and a drain of the seventh transistor.

The first photoelectric conversion element and the second photoelectric conversion element preferably have the same structure.

The first capacitor preferably has a higher capacitance value than the second capacitor.

The capacitance value between the one of the terminals of the first photoelectric conversion element, the one of the source and the drain of the first transistor, and the one of the terminals of the first capacitor is preferably the same as the capacitance value between the one of the terminals of the second photoelectric conversion element, the one of the source and the drain of the third transistor, and the one of the terminals of the first capacitor.

The spectroscopic element is provided over the first photoelectric conversion element, and thus a structure can be employed in which light of W−R, W−G, or W−B obtained by excluding any one of light components of wavelengths corresponding to red (R), green (G), and blue (B) from light (W) which enters the pixel circuit enters the first photoelectric conversion element; and light of W+R, W+G, or W+B obtained by synthesizing light (W) which enters the pixel circuit and the excluded light enters the second photoelectric conversion element.

In the above structure, part of the above excluded light in an adjacent pixel may enter the second photoelectric conversion element.

Furthermore, the spectroscopic element is provided over the second photoelectric conversion element, and thus a structure can be employed in which light of W−(R/2)−(B/2), W−(R/2)−(G/2), or W−(B/2)−(G/2) obtained by excluding any two of ½ light components of wavelengths corresponding to red (R), green (G), and blue (B) from light (W) which enters the pixel circuit enters the second photoelectric conversion element; and W+(R/2)+(B/2), W+(R/2)+(G/2), or W+(B/2)+(G/2) obtained by synthesizing light (W) which enters the pixel circuit and the excluded light enters the first photoelectric conversion element.

Some or all of the first to seventh transistors preferably include oxide semiconductors in active layers, and the oxide semiconductor preferably includes In, Zn, and M (M is Al, Ti, Ga, Sn, Y, Zr, La, Ce, Nd, or Hf).

According to one embodiment of the present invention, an imaging device which does not need arithmetic processing using an external processing circuit in order to obtain imaging data of respective colors can be provided. Alternatively, an imaging device with which a color image can be taken without using a color filter can be provided. Alternatively, an imaging device with low power consumption can be provided. Alternatively, an imaging device suitable for high-speed operation can be provided. Alternatively, an imaging device with high sensitivity can be provided. Alternatively, an imaging device with a wide dynamic range can be provided. Alternatively, an imaging device with high resolution can be provided. Alternatively, a low-cost imaging device can be provided. Alternatively, an imaging device with high reliability can be provided. Alternatively, a novel imaging device or the like can be provided. Alternatively, a novel semiconductor device or the like can be provided.

Note that the description of these effects does not preclude the existence of other effects. Note that one embodiment of the present invention does not necessarily have all of these effects. Note that other effects will be apparent from the description of the specification, the drawings, the claims, and the like and can be derived from the description of the specification, the drawings, the claims, and the like.

BRIEF DESCRIPTION OF DRAWINGS

FIG. 4 Top views illustrating modes of pixels.

FIG. 6 Timing charts illustrating operation of a pixel circuit.

FIG. 9 Diagrams illustrating arrangements of pixels.

FIG. 11 Diagrams illustrating a bent imaging device.

FIG. 13 A timing chart showing an operation of a rolling shutter system.

FIG. 20 Diagrams illustrating cross sections of transistors in a channel width direction.

FIG. 31 Diagrams illustrating cross sections of transistors in a channel length direction.

FIG. 37 Diagrams illustrating a method for manufacturing a transistor.

FIG. 38 Diagrams illustrating a method for manufacturing a transistor.

MODE FOR CARRYING OUT THE INVENTION

Figure 1:
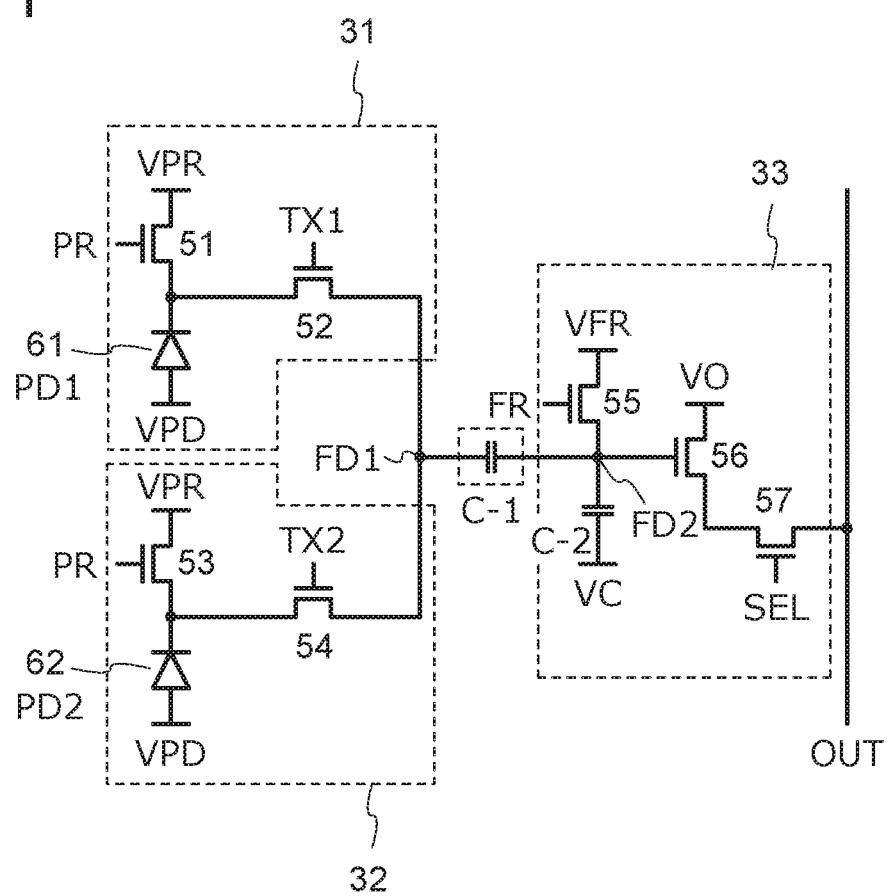
FIG. 1 A circuit diagram of a pixel included in an imaging device.

Embodiments will be described in detail with reference to the drawings. Note that the present invention is not limited to the following description and it will be readily appreciated by those skilled in the art that modes and details thereof can be modified in various ways without departing from the spirit and the scope of the present invention. Therefore, the present invention should not be interpreted as being limited to the description of embodiments below. Note that in structures of the present invention described below, the same portions or portions having similar functions are denoted by the same reference numerals in different drawings, and their repetitive description may sometimes be omitted. Note that hatching patterns of the same components included in drawings are omitted or changed in different drawings as appropriate in some cases.

For example, in the case where it is explicitly described in this specification and the like that "X and Y are connected", the case where X and Y are electrically connected, the case where X and Y are functionally connected, and the case where X and Y are directly connected are supposed to be disclosed in this specification and the like. Accordingly, without being limited to a predetermined connection relation, for example, a connection relation shown in drawings or texts, a connection relation other than that shown in the drawings or text is supposed to be described in the drawings or the text.

Here, X and Y each denote an object (e.g., a device, an element, a circuit, a wiring, an electrode, a terminal, a conductive film, a layer, or the like).

As an example of the case where X and Y are directly connected, there are the case where an element that allows an electrical connection between X and Y (e.g., a switch, a transistor, a capacitor, an inductor, a resistor, a diode, a display element, a light-emitting element, a load, and the like) is not connected between X and Y, and the case where X and Y are connected without the element that allows the electrical connection between X and Y (e.g., a switch, a transistor, a capacitor, an inductor, a resistor, a diode, a display element, a light-emitting element, a load, and the like) provided therebetween.

As an example of the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch has a function of being controlled to be turned on or off. That is, the switch is in a conducting state (in an on state) or in non-conducting state (in an off state) and has a function of determining whether current flows therethrough or not. Alternatively, the switch has a function of selecting and changing a current path. Note that the case where X and Y are electrically connected includes the case where X and Y are directly connected.

As an example of the case where X and Y are functionally connected, one or more circuits that enable a functional connection between X and Y (e.g., a logic circuit (an inverter, a NAND circuit, a NOR circuit, or the like); a signal converter circuit (a D/A converter circuit, an A/D converter circuit, a gamma correction circuit, or the like); a potential level converter circuit (a power supply circuit (a step-up circuit, a step-down circuit, or the like), a level shifter circuit or the like for changing the potential level of a signal; a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; a control circuit, or the like) can be connected between X and Y. Note that for example, in the case where a signal output from A is transmitted to B even when another circuit is interposed between X and Y, X and Y are functionally connected. Note that the case where X and Y are functionally connected includes the case where X and Y are directly connected and the case where X and Y are electrically connected.

Note that, in the case where it is explicitly described that "X and Y are electrically connected", the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are supposed to be disclosed in this specification and the like. That is, in the case where it is explicitly described that "they are electrically connected", the same contents as the case where it is simply described just that they are connected are supposed to be disclosed in this specification and the like.

Note that for example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

For example, it is possible to express "X, Y, a source (or a first terminal or the like) and a drain (or a second terminal or the like) of a transistor are electrically connected to each other, and X, the source (or the first terminal or the like) of the transistor, the drain (or the second terminal or the like) of the transistor, and Y are electrically connected to each other in this order". Alternatively, it is possible to express "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order". Alternatively, it is possible to express "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to these examples, a source (or a first terminal or the like) and a drain (or a second terminal or the like) of a transistor can be distinguished from each other to specify the technical scope.

Alternatively, as another expression, for example, it is possible to express "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". Alternatively, it is possible to express "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path". Alternatively, it is possible to express "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to these examples, a source (or a first terminal or the like) and a drain (or a second terminal or the like) of a transistor can be distinguished from each other to specify the technical scope.

Note that these expressions are examples and there is no limitation on these expressions. Here, X, Y, Z1, and Z2 denote an objects (e.g., a device, an element, a circuit, a wiring, an electrode, a terminal, a conductive film, a layer, and the like).

Note that even when independent components are electrically connected to each other in a circuit diagram, one component has functions of a plurality of components in some cases. For example, when part of a wiring also functions as an electrode, one conductive film has functions as both the components, a function as the wiring and a function as the electrode. Thus, "electrical connection" in this specification includes in its category such a case where one conductive film has functions of a plurality of components.

Note that the term "film" and the term "layer" can be interchanged with each other depending on the case or depending on circumstances. For example, the term "conductive layer" can be changed into the term "conductive film" in some cases. Also, the term "insulating film" can be changed into the term "insulating layer" in some cases.

Embodiment 1

In this embodiment, an imaging device that is one embodiment of the present invention is described with reference to drawings.

In the imaging device that is one embodiment of the present invention, a spectroscopic element can be used instead of a color filter. Therefore, loss of absorption by a color filter light can be suppressed, and the amount of light entering a photoelectric conversion element can be increased. In other words, the sensitivity of the imaging device can be increased.

Furthermore, a method of detecting a difference between signals obtained from two photoelectric conversion elements is used in order to extract imaging data of red (R), green (G), and blue (B) from dispersed light. In other words, arithmetic using an external circuit is not necessary, and thus the imaging device can have lower power consumption and operate at higher speed.

FIG. 1 is a circuit diagram of a pixel circuit that can be used for an imaging device of one embodiment of the present invention. The pixel circuit is broadly divided into a photoelectric conversion portion and a signal generation portion. For simple description, the description is made on the assumption of a structure in which the photoelectric conversion portion includes a circuit 31 and a circuit 32. Furthermore, the description is made on the assumption of a structure in which the signal generation portion includes a circuit 33. Moreover, the description is made on the assumption of a structure in which the photoelectric conversion portion and the signal generation portion are connected through a capacitor C-1.

The circuit 31 in the photoelectric conversion portion includes a photodiode 61, a transistor 51, and a transistor 52. Furthermore, the circuit 32 includes a photodiode 62, a transistor 53, and a transistor 54.

A diode element in which a pn or a pin junction is formed in a silicon substrate can be used as each of the photodiodes 61 and 62. Alternatively, a pin diode element formed using an amorphous silicon film, a microcrystalline silicon film, or the like may be used. Note that although a structure in which the circuit 31 and the circuit 32 include the photodiodes is described as an example, different photoelectric conversion elements may be used. For example, a diode-connected transistor may be used. Alternatively, a variable resistor or the like utilizing a photoelectric effect may be formed using silicon, germanium, selenium, or the like.

Alternatively, a photoelectric conversion element that includes selenium utilizing a phenomenon called avalanche multiplication may be used. In the photoelectric conversion element, a highly sensitive sensor in which amplification of electrons with respect to the amount of incident light is large can be obtained.

Amorphous selenium or crystalline selenium can be used as a selenium-based material. Crystalline selenium may be obtained by, for example, depositing amorphous selenium and then performing heat treatment. When the crystal grain size of crystalline selenium is smaller than a pixel pitch, variation in characteristics between pixels can be reduced.

The circuit 33 included in the signal generation portion includes a transistor 55, a transistor 56, a transistor 57, and a capacitor C-2.

In the circuit 31, one terminal of the photodiode 61 is electrically connected to one of a source and a drain of the transistor 51 and one of a source and a drain of the transistor 52. Furthermore, the other of the source and the drain of the transistor 52 is electrically connected to one terminal of the capacitor C-1.

In the circuit 32, one terminal of the photodiode 62 is electrically connected to one of a source and a drain of the transistor 53 and one of a source and a drain of the transistor 54. Furthermore, the other of the source and the drain of the transistor 54 is electrically connected to the one terminal of the capacitor C-1.

Here, a node to which each of the other of the source and the drain of the transistor 52, the other of the source and the drain of the transistor 54, and the one terminal of the capacitor C-1 is connected is referred to as a first charge accumulation portion (FD1).

In the circuit 33, one of a source and a drain of the transistor 55, a gate of the transistor 56, and one terminal of the capacitor C-2 are electrically connected to the other terminal of the capacitor C-1. Furthermore, one of a source and a drain of the transistor 56 is electrically connected to one of a source and a drain of the transistor 57.

Here, a node to which the one of the source and the drain of the transistor 55, the gate of the transistor 56, the one terminal of the capacitor C-2, and the other terminal of the capacitor C-1 are each connected is referred to as a second charge accumulation portion (FD2).

The capacitance value of the capacitor C-1 is preferably larger than that of the capacitor C-2. Furthermore, the capacitance value between the one terminal of the photodiode 61, the one of the source and the drain of the transistor 51, and the one terminal of the capacitor C-1 is preferably equal to the capacitance value between the one terminal of the photodiode 62, the one of the source and the drain of the transistor 53, and the one terminal of the capacitor C-1.

The other terminals of the photodiodes 61 and 62 are each electrically connected to a wiring VPD. Furthermore, the others of the sources and the drains of the transistors 51 and 53 are each electrically connected to a wiring VPR. Moreover, the other of the source and the drain of the transistor 55 is electrically connected to a wiring VFR. In addition, the other terminal of the capacitor C-2 is electrically connected to a wiring VC. Furthermore, the other of the source and the drain of the transistor 56 is electrically connected to the wiring VO. Note that the wiring VPD and the wiring VC can be a common wiring. Moreover, in the structure of FIG. 1, the wiring VPR, the wiring VFR, and the wiring VO can be a common wiring.

Furthermore, each of gates of the transistors 51 and 53 is electrically connected to a wiring PR. Moreover, a gate of the transistor 52 is electrically connected to a wiring TX1, and a gate of the transistor 54 is electrically connected to a wiring TX2. In addition, a gate of the transistor 55 is electrically connected to a wiring FR. Furthermore, a gate of the transistor 57 is connected to a wiring SEL, and the other of the source and the drain is electrically connected to a wiring OUT.

Note that a potential such as GND, VSS, or VDD may be supplied through the wiring VO. Here, a potential or a voltage is relative. Therefore, the level of the potential of GND is not always 0 volts.

The photodiode 61 (PD1) and the photodiode 62 (PD2) are light-receiving elements and can have a function of generating current corresponding to light entering the pixel circuit. The transistors 52 and 54 can have a function of controlling accumulation of charge in the charge accumulation portion (FD1) by the photodiodes 61 and 62. The transistors 51 and 53 can have a function of executing an operation of resetting the potential of the charge accumulation portion (FD1). The transistor 55 can have a function of executing an operation of resetting the potential of the charge accumulation portion (FD2). The transistor 56 can have a function of executing an operation of outputting a signal based on the potential of the charge accumulation portion (FD2). The transistor 57 can have a function of executing an operation of controlling selection of the pixel circuit at the time of reading.

Note that the wiring VPR, the wiring VPD, the wiring VC, the wiring VFR, and the wiring VO can have a function of a power supply line. Furthermore, the wiring PR, the wiring TX1, the wiring TX2, the wiring FR, the wiring SEL, and the wiring OUT can have a function of a signal line.

Figure 2A:
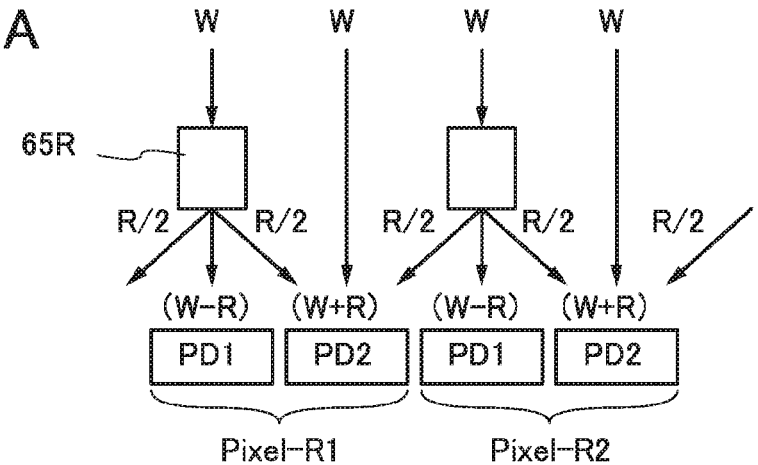
FIG. 2 Schematic views each illustrating a positional relationship between spectroscopic elements and photoelectric conversion elements included in an imaging device.

FIGS. 2(A), (B), and (C) are schematic views illustrating a positional relationship between spectroscopic elements and photoelectric conversion elements included in an imaging device of one embodiment of the present invention.

FIG. 2(A) illustrates a state in which two pixels (Pixel-R1 and Pixel-R2) for detecting imaging data of red (R) are adjacent to each other. Here, PD1 corresponds to the photodiode 61 illustrated in FIG. 1, and PD2 corresponds to the photodiode 62.

A spectroscopic element 65R is provided over PD1. Light that is an object of imaging (W: corresponding to white light including light components of RGB) enters the spectroscopic element 65R. W entering the spectroscopic element 65R is dispersed into light (R) mainly including wavelength components of R and light (W−R) obtained by excluding light mainly including wavelength components of R from W.

W−R is emitted from the spectroscopic element 65R so as to travel in the spectroscopic element 65R almost in a straight line and enters PD1. Furthermore, R is emitted from the spectroscopic element 65R at a different angle from W−R and enters PD2.

Note that FIG. 2(A) illustrates a case in which R/2 is emitted from an end of the spectroscopic element 65R in two directions. In this case, PD2 in Pixel-R1 is irradiated with R by synthesis with R/2 emitted from the spectroscopic element 65R in the adjacent pixel, Pixel-R2. Furthermore, W+R obtained by synthesis with the R and W not passing through the spectroscopic element 65R enters PD2.

Figure 3A:
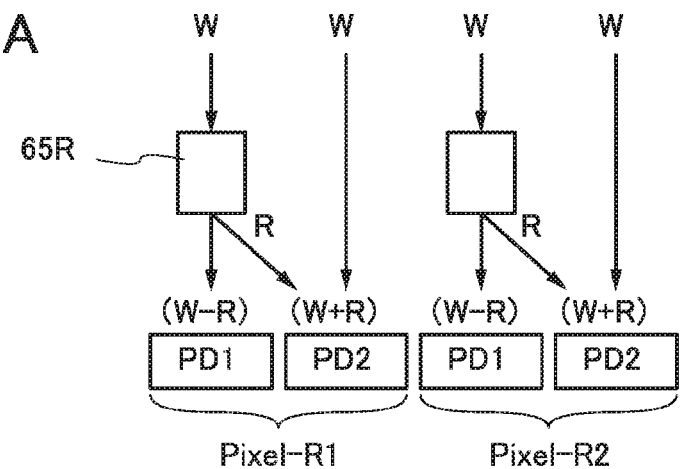
FIG. 3 Schematic views illustrating a positional relationship between spectroscopic elements and photoelectric conversion elements included in an imaging device.

Furthermore, although FIG. 2(A) illustrates a structure in which R/2 is emitted from the spectroscopic element 65R in two directions, a structure in which R is emitted in one direction may be employed as illustrated in FIG. 3(A).

Figure 2B:
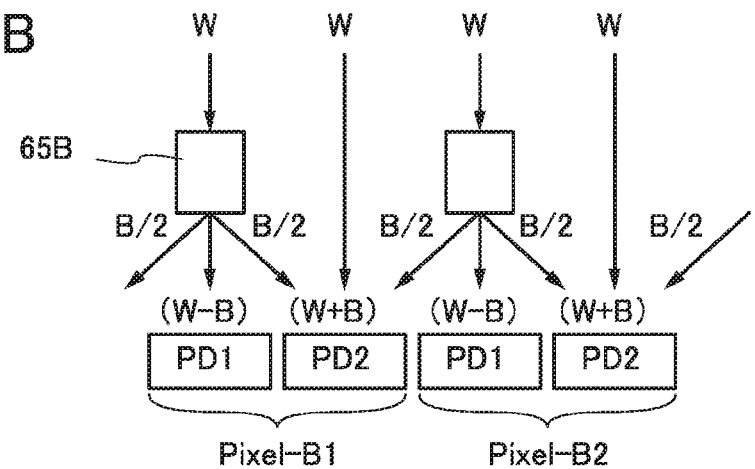

FIG. 2(B) illustrates a state in which two pixels (Pixel-B1 and Pixel-B2) for detecting data of blue (B) are adjacent to each other. Here, PD1 corresponds to the photodiode 61 illustrated in FIG. 1, and PD2 corresponds to the photodiode 62.

A spectroscopic element 65B is provided over PD1. Incident light (W) that is an object of imaging enters the spectroscopic element 65B. W entering the spectroscopic element 65B is dispersed into light (B) mainly including wavelength components of B and light (W−B) obtained by excluding light mainly including wavelength components of B from W.

Figure 3B:
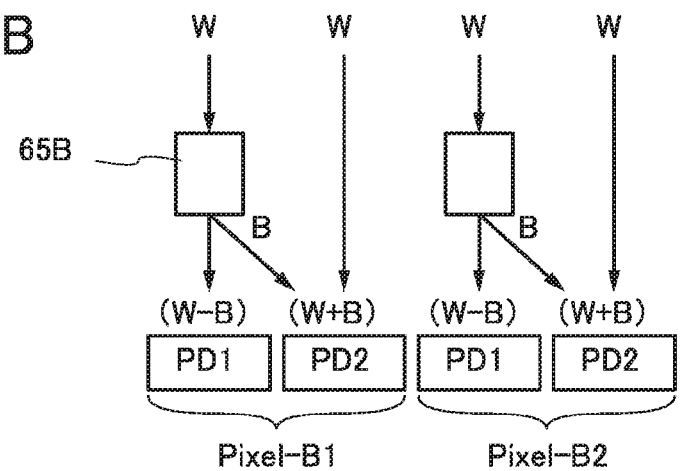

In FIG. 2(B), a description of entry of W−B into PD1 and a description of entry of W+B into PD2 are the same as the above description of the pixel for detecting the imaging data of R. Furthermore, a structure of FIG. 3(B) may be employed instead of the structure of FIG. 2(B).

Figure 2C:
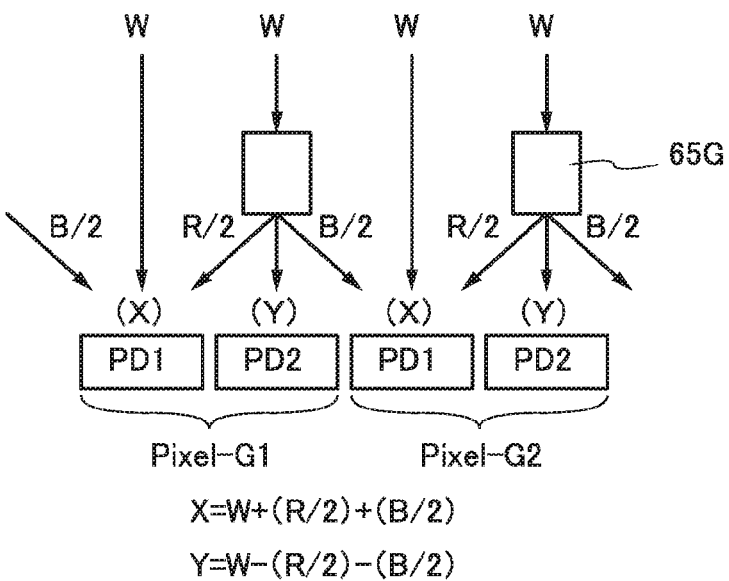

FIG. 2(C) illustrates a state in which two pixels (Pixel-G1 and Pixel-G2) for detecting imaging data of green (G) are adjacent to each other. Here, PD1 corresponds to the photodiode 61 illustrated in FIG. 1, and PD2 corresponds to the photodiode 62.

A spectroscopic element 65G is provided over PD1. Light that is an object of imaging (W: corresponding to white light obtained by synthesis of RGB) enters the spectroscopic element 65G. W entering the spectroscopic element 65G is dispersed into part of light (R/2) mainly including wavelength components of R, part of light (B/2) mainly including wavelength components of B, and light (W−(R/2)−(B/2)) obtained by excluding R/2 and B/2 from W.

Figure 3C:
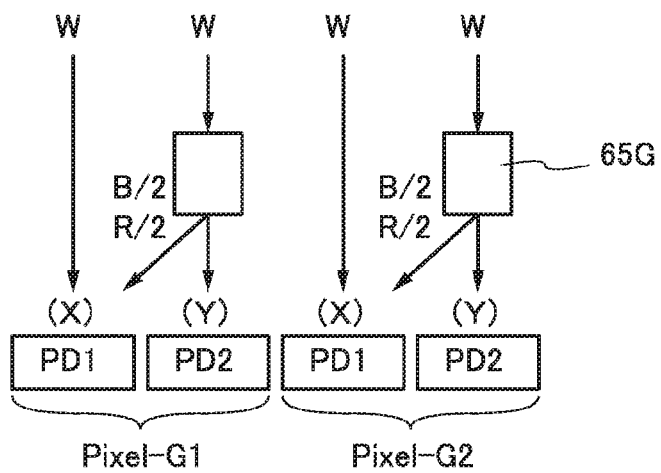

W−(R/2)−(B/2) is emitted from the spectroscopic element 65R so as to travel in the spectroscopic element 65R almost in a straight line and enters PD1. Furthermore, each of R/2 and B/2 is emitted from the spectroscopic element 65G at a different angle from W−(R/2)−(B/2). For example, as illustrated in FIG. 2(C), R/2 emitted from the spectroscopic element 65G in Pixel-G1 enters PD1 in Pixel-G1 and B/2 enters PD1 in adjacent Pixel-G2. Alternatively, as illustrated in FIG. 3(C), a structure in which R/2 and B/2 are emitted from the spectroscopic element 65G in the same direction can also be employed.

Note that although FIGS. 2(A) and (B) and FIGS. 3(A) and (B) are described as modes for obtaining imaging data of R or B, a change of the spectroscopic element enables a mode for obtaining imaging data of G. Furthermore, although FIG. 2(C) and FIG. 3(C) are each described as a mode for obtaining imaging data of G, a change of the spectroscopic element enables a mode for obtaining imaging data of R or B.

FIGS. 4(A) and (B) each illustrate an example of a mode of a top surface of a pixel. Although FIG. 4(A) illustrates a pixel for obtaining imaging data of R illustrated in FIG. 2(A) or FIG. 3(A), a pixel for obtaining imaging data of B illustrated in FIG. 2(B) or FIG. 3(B) can also have the same structure.

In one embodiment of the present invention, because a difference between signals output from PD1 and PD2 is used, it is preferable that the both electrical characteristics be the same. In other words, PD1 and PD2 preferably have the same structure. Note that the structures may be different as long as the electrical characteristics of the two are the same.

The spectroscopic element 65R is provided over the vicinity of the center of PD1, and light dispersed from the spectroscopic element 65R and mainly including wavelength components of R is emitted in a direction in which PD2 is provided. The pixels are minute, and of external light with which all the pixels are irradiated, substantially the same amount of light enters the upper part of PD1 and the upper part of PD2. The light entering the above of PD1 is led by the spectroscopic element 65R and dispersed into W−R and R. Accordingly, in the structure of FIG. 2(A), W−R enters PD1, and R/2 enters each of PD2 and PD2 in the adjacent pixel. In the structure of FIG. 3(A), R enters PD2 in the same pixel.

FIG. 4(B) illustrates a pixel for obtaining imaging data of G illustrated in FIG. 2(C) or FIG. 3(C). The spectroscopic element 65R is provided over the vicinity of the center of PD2, and light dispersed from the spectroscopic element 65G and mainly including wavelength components of R and B is emitted in a direction in which PD1 is provided. As in the pixel for obtaining imaging data of R, substantially the same amount of light enters the above of PD1 and the above of PD2. Light entering the above of PD2 is led to a region 66 illustrated in FIG. 4(B), and half of the light entering the region enters the spectroscopic element 65G. In other words, the light emitted from the spectroscopic element 65G and mainly including wavelength components of R and B becomes R/2 and B/2. Accordingly, in the structure of FIG. 2(C), W−(R/2)−(B/2) enters PD2, and R/2 and B/2 enter PD1 and PD1 in the adjacent pixel, respectively. In the structure of FIG. 3(C), R/2 and B/2 enter PD1 in the same pixel.

Note that although a mode in which the top surface shapes of the pixel, the photodiode, and the spectroscopic element are rectangular is illustrated in FIGS. 4(A) and (B), there is no limitation thereto. The top surface shapes of the above components may each be a circular shape, a polygonal shape such as a hexagon, or the like. For example, as in a modification example of FIG. 4(A) which is illustrated in FIG. 4(C), the pixel may have a polygonal shape in which two hexagons are adjacent to each other, the photodiode may have a substantially hexagonal shape, and the spectroscopic element may have a substantially circular shape. Furthermore, a corner portion included in the component having a polygonal shape such as a rectangular shape or a hexagonal shape may have curvature.

Figure 5A:
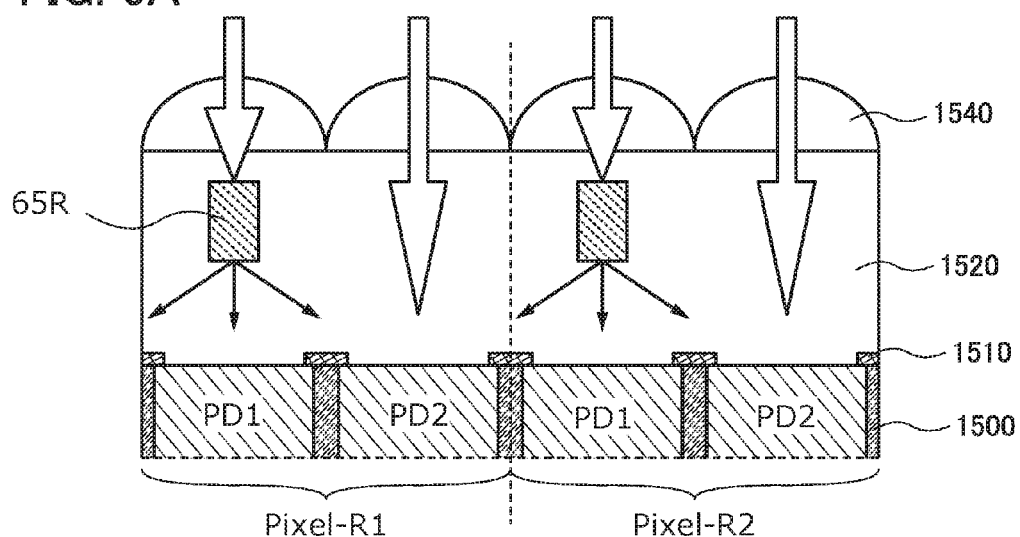
FIG. 5 Diagrams illustrating cross-sections of a pixel.

FIG. 5(A) is an example of a cross section of a pixel for obtaining imaging data of R. PD1 and PD2 are separated from each other with an element isolation layer 1500 interposed therebetween, and a light-blocking layer 1510 for inhibiting color mixing is provided over the element isolation layer 1500. An insulating layer 1520 having a high light-transmitting property with respect to visible light is provided over the photodiodes (PD1 and PD2), and a microlense 1540 is provided over the insulating layer 1520 so as to pair off with the photodiodes.

Then, the spectroscopic element 65R is provided on an optical path of light passing through the microlense 1540. There is no limitation on the kind of the spectroscopic element 65R, and for example, an optical element such as a prism or a diffraction grating can be used. Alternatively, a plate-like body or the like having a light-transmitting property with respect to visible light and a high refractive index can be used as the spectroscopic element. For example, the plate-like body having a high refractive index can be formed with a silicon nitride film or the like. Furthermore, another component may be combined with the spectroscopic element. For example, a spectroscopic element such as a prism, a diffraction grating, or a plate-like body having a high refractive index may be combined with a component such as a mirror or a light guide plate.

Figure 5B:
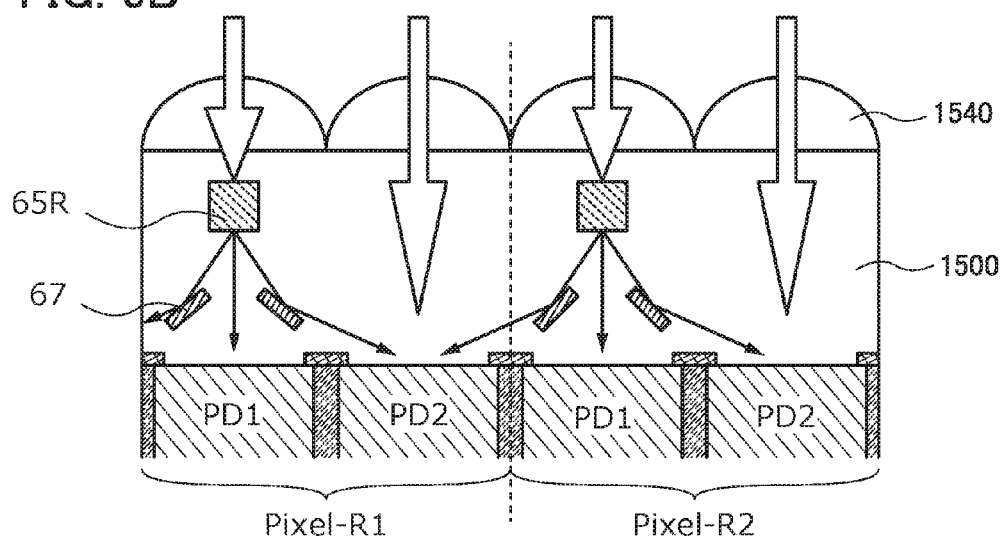
Figure 42:
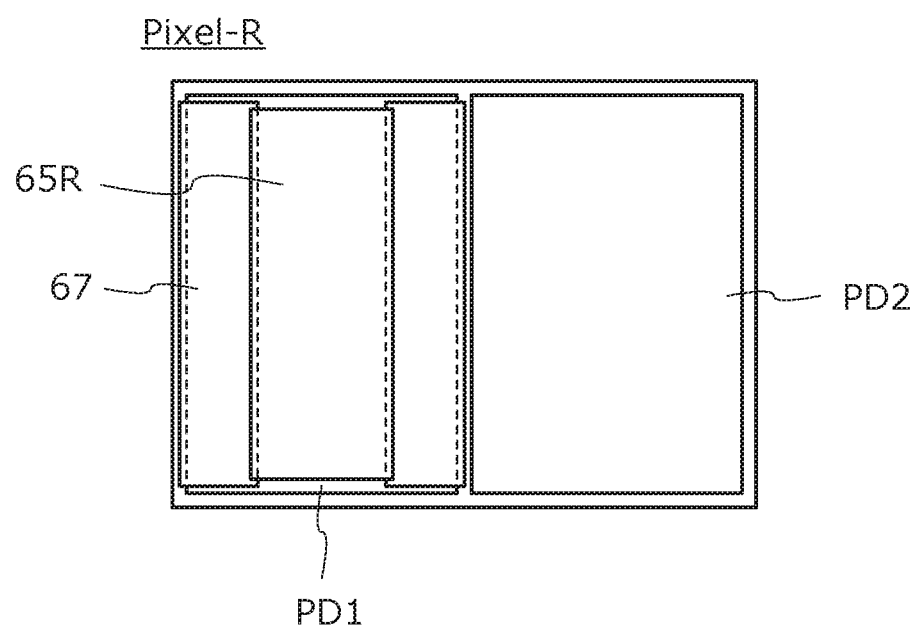
FIG. 42 A top view illustrating a mode of a pixel.

FIG. 5(B) illustrates a mode in which the spectroscopic element 65R and a mirror 67 are combined as an example. By using the mirror 67, the degree of freedom of the optical path of the light emitted from the spectroscopic element 65R can be increased. Note that the mirror can be formed with a material having high reflectivity, such as a metal, and furthermore, may have a structure with which total reflection is caused by combining materials having different refractive indexes. In addition, FIG. 42 is an example of a top view of the pixel in FIG. 5(B).

Figure 5C:
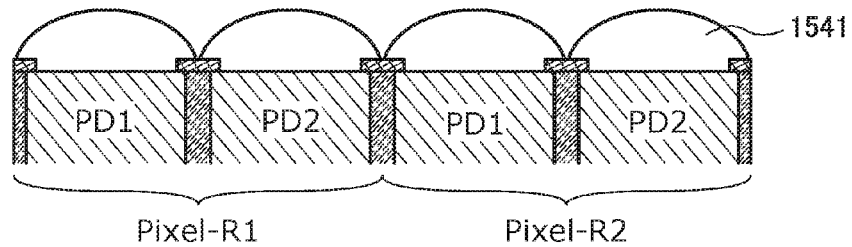

Moreover, as illustrated in FIG. 5(C), microlenses 1541 may also be provided over the photodiodes.

Note that although FIGS. 5(A), (B), and (C) illustrate a pixel for obtaining imaging data of R, a pixel for obtaining imaging data of B and a pixel for obtaining imaging data of G can also have the same structure. Furthermore, there is no limitation on the structure of the above pixel, and an insulating layer other than the above, a light-blocking layer other than the above, a passivation layer film, an adhesive layer, an anti-reflection film, a light absorption layer, or the like may be included. Furthermore, a coloring layer may be provided between the microlense 1540 and the photodiodes (PD1 and PD2).

Next, an operation of the pixel for obtaining imaging data of R which includes the circuit illustrated in FIG. 1 is described. FIG. 6(A) is a timing chart showing an operation of the pixel. Here, the wiring VPD, the wiring VPR, the wiring VC, the wiring VFR, and the wiring VO are set at a low potential, a high potential, a low potential, a high potential, and a high potential, respectively.

From Time T1 to Time T2, the wiring PR, the wiring FR, the wiring TX1, and the wiring TX2 are set at "H", "H", "H", and "H", respectively. At this time, the potential of the node FD2 is set at the potential of the wiring VFR, and the potential of the node FD1 is set at the potential of the wiring VPR (reset operation).

From Time T2 to Time T3, the wiring PR, the wiring FR, the wiring TX1, and the wiring TX2 are set at "L", "H", "H", and "L", respectively. At this time, in proportion to the light intensity (I(W−R)) of light with which the photodiode 61 (PD1) is irradiated, that is, W−R, the potential of the node FD1 is lowered by ΔV1' (see Formula (1), and α' is a proportionality coefficient). Note that as light with which the photodiode 61 (PD1) is irradiated becomes stronger, the potential of the node FD1 is lowered more quickly (accumulation operation 1).

[Formula 1]

$$\Delta V1' = \alpha' \cdot (W-R) \quad (1)$$

In Time T3, the wiring FR and the wiring TX1 are set at "L" and "L", respectively. At this time, the potential of the node FD2 is held at the potential of the wiring VPR. Furthermore, the potential of the node FD1 is held at the potential lower than the potential of the wiring VPR by ΔV1'.

From Time T4 to Time T5, the wiring PR is set at "H". At this time, the potential of a cathode of the photodiode 61 (PD1) and the potential of a cathode of the photodiode 62 (PD2) are set at the potential of the wiring VPR (reset operation 2). From Time T3 to Time T5, because the potentials of the cathodes of the photodiode 61 (PD1) and the photodiode 62 (PD2) are lowered, it is preferable that the potentials of the cathodes be set at the potential of the wiring VPR before Time T5 (the wiring TX1 and the wiring TX2 are set at "H"). In this manner, a phenomenon in which the potential of the node FD1 is drastically lowered, that is, a phenomenon of a noise, does not occur right after Time T5, so that imaging data can be obtained with high accuracy.

Note that for the purpose of obtaining the same effect, it is preferable that the capacitance value of the capacitor C-1 be sufficiently larger than the capacitance value of the cathode of the photodiode 61 (PD1) and the capacitance value of the cathode of the photodiode 62 (PD2).

From Time T5 to Time T6, the wiring PR, the wiring FR, the wiring TX1, and the wiring TX2 are set at "H", "L", "H", and "H", respectively. At this time, the potential of the node FD1 is set at the potential of the wiring VPR. In other words, the potential of the node FD1 is increased by ΔV1' as compared to that in Time T3 to Time T4. Here, the potential of the node FD2 is increased by ΔV1 owing to capacitive coupling between a capacitance C1 of the capacitor C-1 and the combined capacitance of a capacitance C2 of the capacitor C-2 and a gate capacitance Cg of the transistor 56 (see Formula (2), and α is a proportionality coefficient).

[Formula 2]

$$\Delta V1 = \Delta V1' \cdot \frac{C1}{C1+C2+Cg} = \alpha \cdot I(W-R) \quad (2)$$

From Time T6 to Time T7, the wiring PR, the wiring FR, the wiring TX1, and the wiring TX2 are set at "L", "L", "L", and "H", respectively. At this time, in proportion to the light intensity (I(W+R)) of light with which the photodiode 62 (PD2) is irradiated, that is, W+R, the potential of the node FD1 is lowered by ΔV2' (see Formula (3)). Note that as light with which the photodiode 62 (PD2) is irradiated becomes stronger, the potential of the node FD1 is lowered (accumulation operation 2).

[Formula 3]

$$\Delta V2' = \alpha' \cdot I(W+R) \quad (3)$$

Furthermore, the potential of the node FD2 is lowered by ΔV2 (see Formula (4)). In other words, the potential of the node FD2 becomes a potential lower than the potential of the wiring VFR by ΔV2−ΔV1. Here, on the assumption that Formula (5) is satisfied, ΔV2−ΔV1=2αIR (see Formula (6)), and thus the potential of the node FD2 becomes a potential that depends on a R component of incident light W.

[Formula 4]

$$\Delta V2 = \Delta V2' \cdot \frac{C1}{C1+C2+Cg} = \alpha \cdot I(W+R) \quad (4)$$

[Formula 5]

$$I(W+R) - I(W-R) = I(2R) = 2I(R) \quad (5)$$

[Formula 6]

$$\Delta V2 - \Delta V1 = \alpha \cdot I(W+R) - \alpha \cdot I(W-R) = 2\alpha I(R) \quad (6)$$

From Time T8 to Time T9, the wiring SEL is set at "H" (selection operation). At this time, a potential corresponding to the potential of the node FD2 is output to the wiring OUT. In other words, imaging data that depends on a R component of incident light W can be obtained. Here, as the potential of the node FD2 is higher, the potential of the wiring OUT becomes higher. In other words, as the light intensity of a R component of incident light W becomes stronger, the potential of the wiring OUT becomes higher.

Although the above is described as an operation for obtaining imaging data of R, an operation for obtaining imaging data of B can also be performed in a similar manner.

Next, an operation of a pixel for obtaining imaging data of G is described. FIG. 6(B) is a timing chart showing an operation of the pixel. In the pixel for obtaining imaging data of G, W+(R/2)+(B/2) enters the photodiode 61 (PD1), and W−(R/2)−(B/2) enters the photodiode 62 (PD2).

The timing chart of FIG. 6(B) differs from the timing chart of FIG. 6(A) in that a period from Time T6 to Time T7 is three times as long as Time T2 to Time T3 (A:B=1:3). In other words, ΔV1 and ΔV2 in the description of FIG. 6(A) can be replaced as in Formulae (7) and (8).

[Formula 7]

$$\Delta V1 = \alpha \cdot I\left(W + \frac{R}{2} + \frac{B}{2}\right) \quad (7)$$

[Formula 8]

$$\Delta V2 = 3\alpha \cdot I\left(W - \frac{R}{2} - \frac{B}{2}\right) \quad (8)$$

Accordingly, the potential of the node FD2 becomes a potential lower than the potential of the wiring VFR by ΔV2−ΔV1. Here, on the assumption that Formula 9 is satisfied, ΔV2−ΔV1=2αIG (see Formula (10)), and thus the potential of the node FD2 becomes a potential that depends on a G component of incident light W.

[Formula 9]

$$3I\left(W - \frac{R}{2} - \frac{B}{2}\right) - I\left(W + \frac{R}{2} + \frac{B}{2}\right) = \quad (9)$$
$$I\left(3W - \frac{3R}{2} - \frac{3B}{2}\right) - I\left(W + \frac{R}{2} + \frac{B}{2}\right) =$$
$$I(2W - 2R - 2B) = I(2G) = 2I(G)$$

[Formula 10]

$$\Delta V2 - \Delta V1 = 3\alpha I\left(W - \frac{R}{2} - \frac{B}{2}\right) - \alpha I\left(W + \frac{R}{2} + \frac{B}{2}\right) = \quad (10)$$
$$\alpha I(2W - 2R - 2B) = 2\alpha I(W - R - B) = 2\alpha I(G)$$

Note that although the amount of received light is adjusted by adjustment of the period in the above, the amount of received light can also be adjusted by adjustment of a light-receiving area of the photodiode. For example, imaging data of G can be obtained by performing an operation with the light-receiving area ratio of PD1: PD2=1:3 and A:B=1:1.

A structure in which data of the wiring OUT is converted into digital data by an A/D converter circuit in a reading circuit and then output as image data is possible. Note that although a structure in which difference arithmetic is performed by a reading circuit outside the pixel is also possible, when the difference arithmetic is performed in the pixel, light exposure time can be made long easily.

Furthermore, as some or all of the transistors included in the pixel, a transistor having an excellent off-state current and including an oxide semiconductor is preferably used. When the transistor is used, a pixel with excellent charge retention characteristics can be formed. Such a structure facilitates retention of data to be subtracted and is suitable for a structure in which difference arithmetic is performed in a pixel.

Furthermore, the use of a transistor including an oxide semiconductor in a pixel circuit can broaden the dynamic range of imaging. In the circuit structure in FIG. 1(A), when the intensity of light entering the photodiodes 61 and 62 is high, the potential of the node FD1 is low. Since the transistor using an oxide semiconductor has an extremely low off-state current, a current corresponding to the gate potential can be accurately output even when the gate potential is extremely low. Thus, it is possible to widen the detection range of illuminance, i.e., the dynamic range.

A period during which charge can be held in the node FD1 and the node FD2 can be extremely long owing to the low off-state current characteristics of the transistor including an oxide semiconductor. Thus, a global shutter system, in which a charge accumulation operation is performed in all the pixels at the same time, can be used without a complicated circuit structure and operation method. Therefore, an image with little distortion can be easily obtained even in the case where an object is a moving object. Furthermore, exposure time (a period in which a charge accumulation operation is conducted) can be long in a global shutter system, which is also suitable for imaging in a low illuminance environment.

Moreover, as a transistor or the like for controlling the potentials of the node FD1 and the node FD2, a low noise transistor is required. The channel of a transistor including two or three oxide semiconductor layers to be described later is buried and significantly high resistance to noise is included. Thus, the use of the transistor leads to an image with low noise.

According to one embodiment of the present invention described above, imaging data of each of R, G, and B components can be obtained from incident light W without using a color filter. Note that although a mode in which G is obtained by difference detection with a spectroscopic element which performs dispersion into R and B is described in the above, a mode in which B is obtained by difference detection with a spectroscopic element which performs dispersion into R and G can be also employed. Furthermore, a mode in which R is obtained by difference detection with a spectroscopic element which performs dispersion into B and G can also be employed.

Figure 40A:
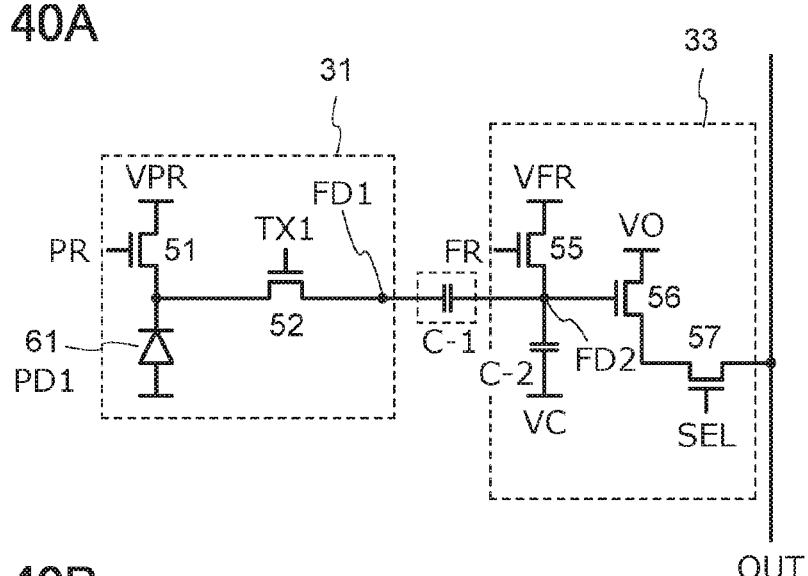
FIG. 40 Circuit diagrams of pixels each included in an imaging device.

In addition, the pixel circuit which can be used for the imaging device of one embodiment of the present invention may have a mode in which the photoelectric conversion portion includes one circuit 31 as illustrated in FIG. 40(A). In this case, PD1 illustrated in FIG. 40(A) is alternately irradiated with light with which PD1 is irradiated and light with which PD2 is irradiated in the description of the operation of the circuit in FIG. 1, whereby imaging data of each color can be obtained.

Figure 40B:
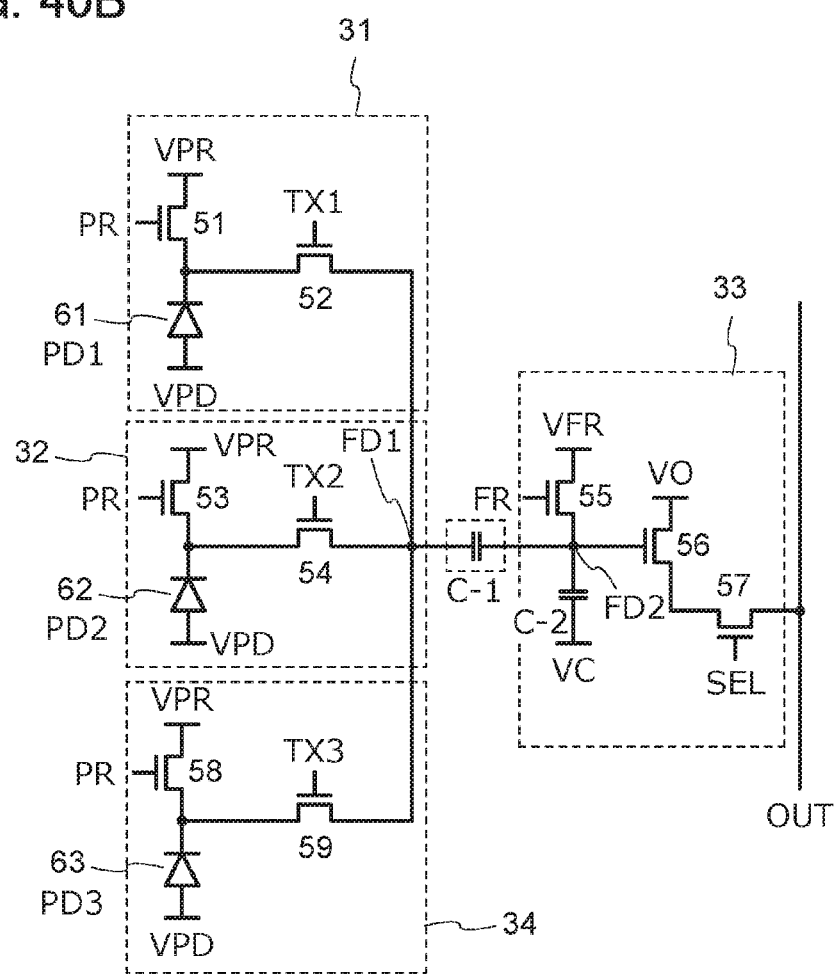

Furthermore, a structure in which the photoelectric conversion portion includes three or more circuits may also be employed. For example, in the pixel circuit illustrated in FIG. 40(B), the photoelectric conversion portion includes the circuit 31, the circuit 32, and a circuit 34 having a photodiode 63 (PD3), a transistor 58, and a transistor 59.

Figure 7A:
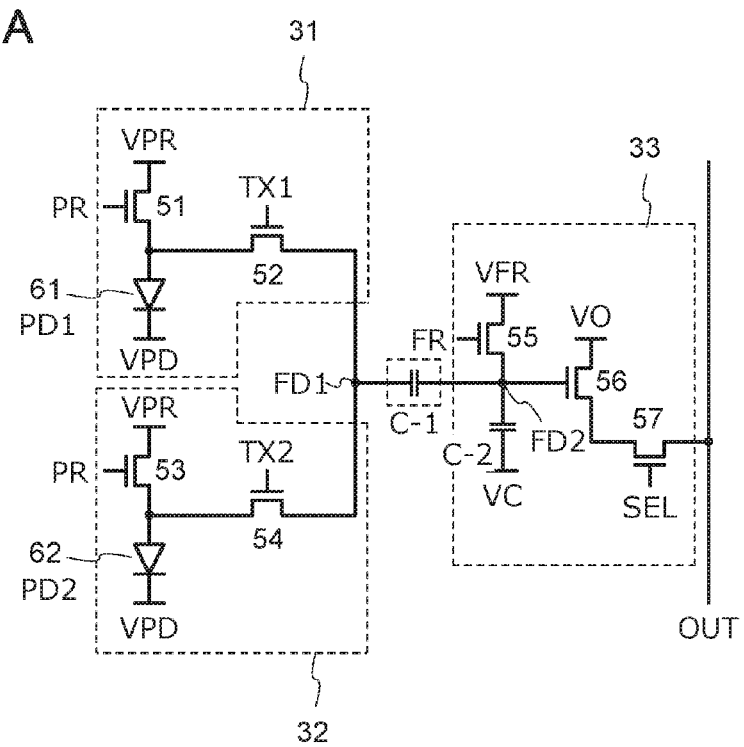
FIG. 7 A pixel circuit and a timing chart illustrating an operation of the pixel circuit.

Furthermore, in the pixel circuit which can be used for the imaging device of one embodiment of the present invention, as illustrated in FIG. 7(A), the connection direction of the photodiode may be different from that in the circuit illustrated in FIG. 1. In this case, the wiring VPD, the wiring VPR, the wiring VC, the wiring VFR, and the wiring VO are set at a high potential, a low potential, a low potential, a high potential, and a high potential, respectively.

Figure 7B:
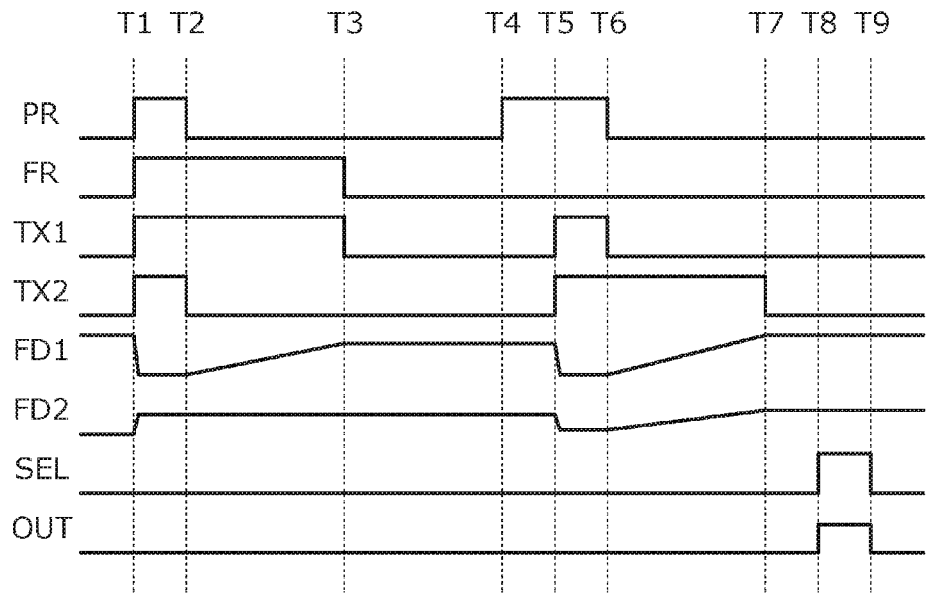

As for the operation of the pixels for obtaining imaging data of R and B, a signal can be input as in the timing chart shown in FIG. 6(A), and the potentials of the FD1 and the FD2 are changed as shown in the timing chart of FIG. 7(B). In Time T7, the potential of the node FD2 becomes a potential higher than the potential of the wiring VFR by ΔV2−ΔV1. Furthermore, in order to obtain imaging data of G, as in the timing chart of FIG. 6(B), the period from Time T6 to Time T7 may be three times as long as Time T2 to Time T3 also in the timing chart of FIG. 7(B). Alternatively, the light-receiving areas of the photodiodes may be set at PD1:PD2=1:3.

Figure 8:
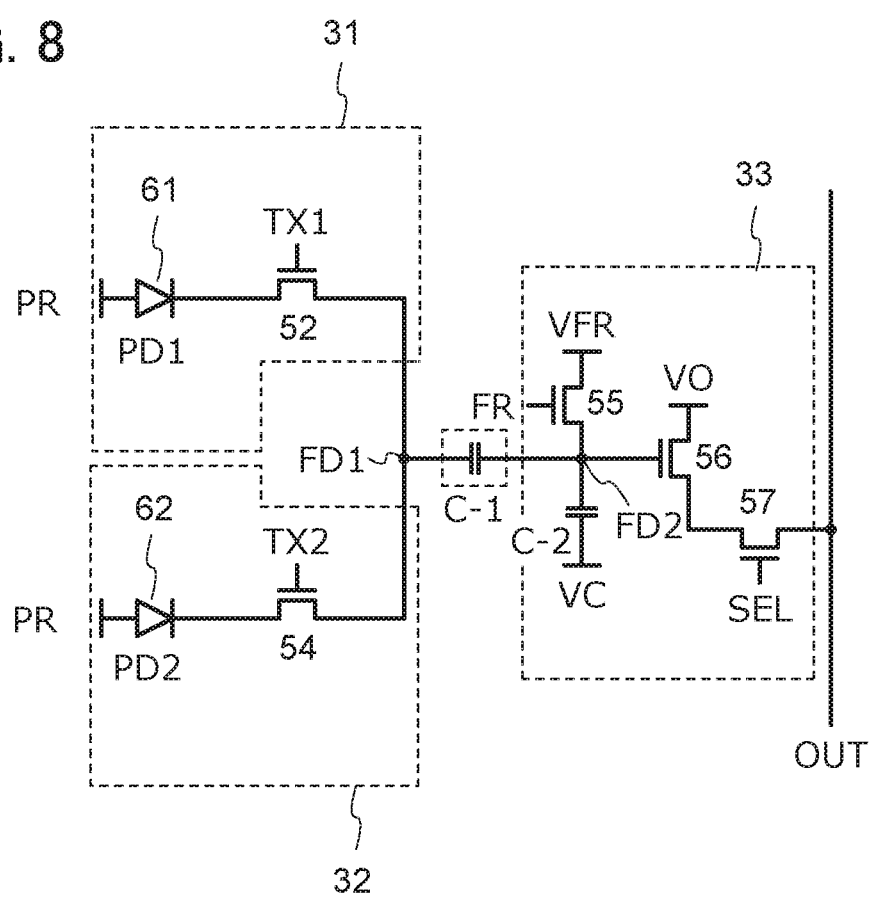
FIG. 8 A circuit diagram of a pixel included in an imaging device.

Alternatively, as illustrated in FIG. 8, the pixel circuit which can be used for the imaging device of one embodiment of the present invention can have a structure excluding the transistor 51 and the transistor 53 from the circuit illustrated in FIG. 1. In this case, the wiring VC, the wiring VFR, and the wiring VO are set at a low potential, a high potential, and a high potential, respectively. Note that the wiring PR also functions as a power supply line.

In this case, a reset operation of the node FD1 can be performed by setting the wiring PR at a high potential. In a predetermined period, when the wiring PR is set at a high potential, a forward bias is applied to PD1 and PD2. In the period, TX1 and TX2 are set at "H", whereby the node FD1 can be set at the potential of the wiring PR. Furthermore, in a predetermined period, when the wiring PR is set at a low potential, a reverse bias is applied to PD1 and PD2. In the period, when TX1 and TX2 are set at "H", an accumulation operation can be performed. Note that for these operations, the timing charts shown in FIGS. 6(A) and (B) can be used.

Figure 41A:
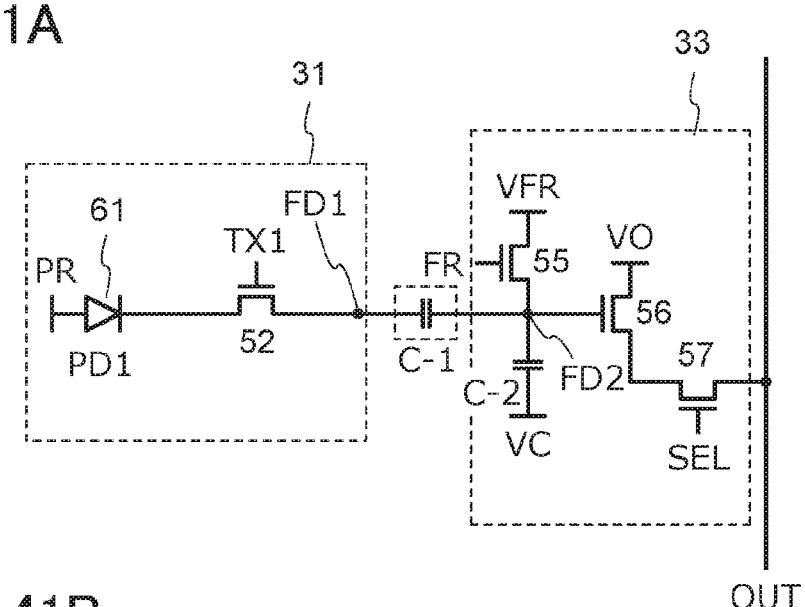
FIG. 41 Circuit diagrams of pixels each included in an imaging device.
Figure 41B:
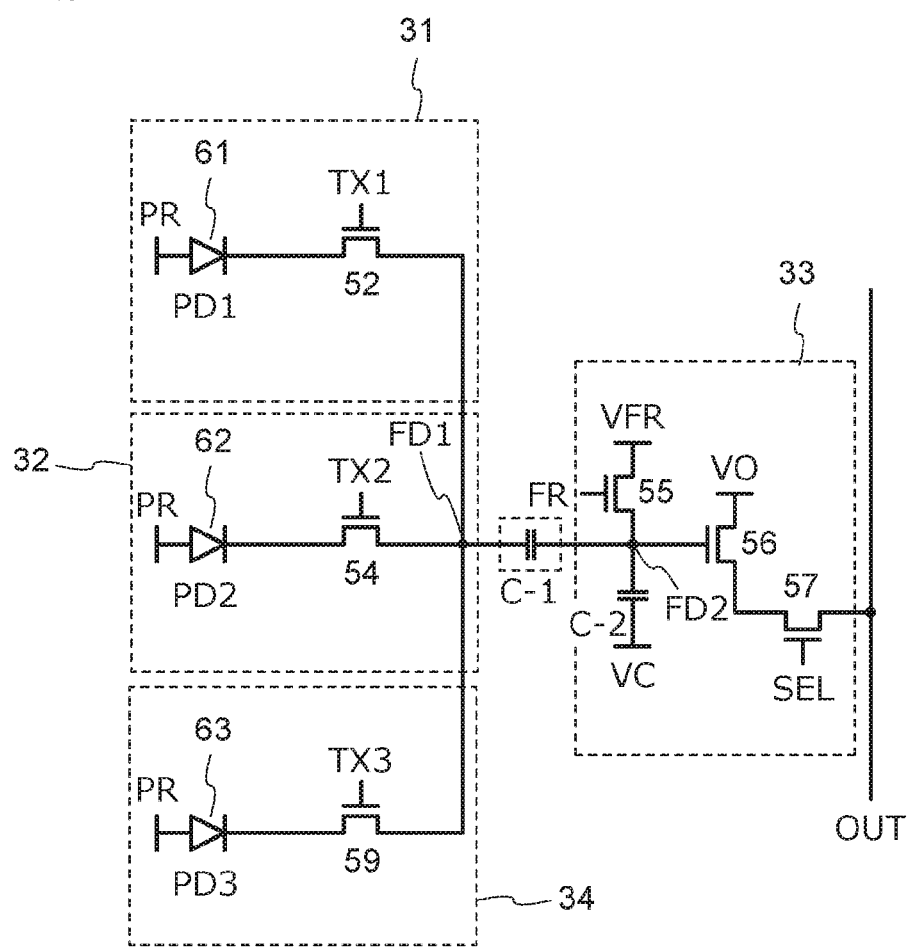

Furthermore, in a structure of the pixel circuit illustrated in FIG. 8, the photoelectric conversion portion may be formed with one circuit 31 as illustrated in FIG. 41(A). Alternatively, the photoelectric conversion portion may be formed with three or more circuits as illustrated in FIG. 41(B).

Note that as the arrangement of the above pixels for obtaining imaging data of R, G, and B, for example, any of modes illustrated in FIGS. 9(A) and (B) can be employed. FIGS. 9(A) and (B) each illustrate an example of a mode of a top surface of 3×3 pixels, and there is no limitation on the order of RGB. In the pixels for obtaining imaging data of R and B, PD1 is provided under the reference numerals of the spectroscopic elements. Furthermore, in the pixels for obtaining the imaging data of G, PD2 is provided under the reference numerals of the spectroscopic elements.

Alternatively, a structure in which any one component of R, G, and B is dispersed with a color filter may be employed. FIG. 9(C) illustrates an example and a mode in which color filters (R) are provided over the pixels for obtaining imaging data of R. Alternatively, a structure in which any two components of R, G, and B are dispersed with a color filter may be employed. FIG. 9(D) illustrates an example and a mode in which color filters (R) and color filters (G) are provided over the pixels for obtaining imaging data of R and G. Such a structure facilitates fabrication of the spectroscopic element or the color filter and facilitates miniaturization and a reduction in cost.

Note that although FIG. 9(A) to FIG. 9(D) each illustrate a mode in which RGB are arranged in a vertical direction, a mode in which RGB are arranged in a horizontal direction may be employed. Alternatively, a structure including pixels shifted by a half pitch may be employed as illustrated in FIG. 9(E). The structure of FIG. 9(E) can be also applied to a structure including a color filter.

Figure 10A:
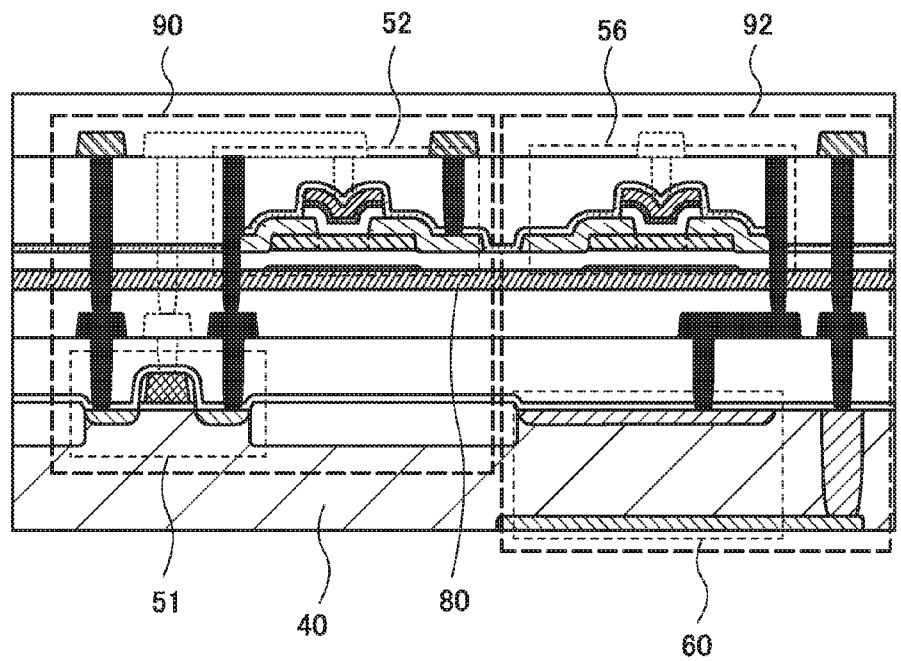
FIG. 10 Cross-sectional views of imaging devices including circuit portions.

FIG. 10(A) is an example of a cross-sectional view of an imaging device including a circuit portion. A circuit portion 90 is a combination of a transistor 51 that includes an active region in a silicon substrate and a transistor 52 that includes an oxide semiconductor as an active layer, and can form, for example, an inverter circuit or a memory circuit. Furthermore, a circuit portion 92 is a combination of a photodiode 60 formed in a silicon substrate 40 and the transistor 56 that includes an oxide semiconductor as an active layer, and can form, for example, the circuit 31 or the circuit 32 illustrated in FIG. 1. Note that wirings and contact plugs indicated by broken lines show that placement is different from that of other wirings and contact plugs in a depth direction.

Here, the circuit portion 92 corresponds to part of the photoelectric conversion portion illustrated in FIG. 1, and the photodiode 60 corresponds to the photodiode 61 or the photodiode 62 illustrated in FIG. 1, for example. Furthermore, the transistor 56 corresponds to the transistor 51 or the transistor 53 illustrated in FIG. 1.

In FIG. 10(A), the photodiode 60 and the transistor 56 can be formed to overlap with each other; thus, the integration degree of pixels can be increased. In other words, the resolution of the imaging device can be increased. Furthermore, since the silicon substrate 40 is not provided with a transistor formed in the occupation area of the circuit portion 92, the area of the photodiode can be large. Thus, an image with low noise can be obtained even in a low illuminance environment.

Figure 10B:
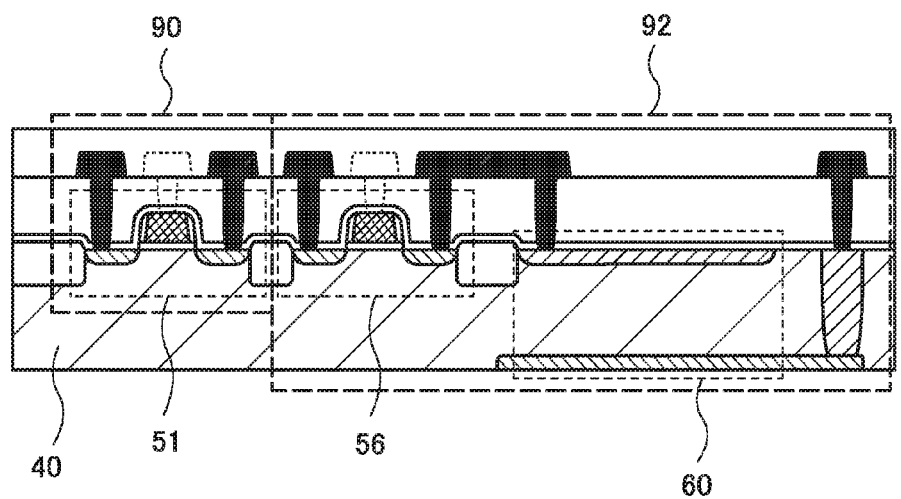

Note that although FIG. 10 illustrates a structure where the photodiode 60 and the transistor 51 are provided in the same silicon substrate 40, there is no limitation thereto. For example, the transistor 51 may be provided in the substrate 40, and a photodiode provided in another substrate may be attached. Alternatively, without providing the transistor 51 in the silicon substrate 40, a transistor that includes an oxide semiconductor as an active layer may be provided in a manner similar to that of the transistors 52 and 56. Alternatively, as illustrated in FIG. 10(B), the transistors 51, 52, and 56 may be provided in the silicon substrate 40 (the transistor 52 is not illustrated). Furthermore, an element other than the transistor 51 may be formed in the silicon substrate 40. For example, a capacitor, a diode, a resistor, or the like may be provided in the silicon substrate 40.

Note that when the transistor 51 and the photodiode 60 are included in the structure illustrated in FIG. 10(A), an insulating layer 80 is provided between the transistor 52 and the transistor 56.

Dangling bonds of silicon are terminated with hydrogen in an insulating layer provided in the vicinity of the active region of the transistor 51. Therefore, the hydrogen has an effect of improving the reliability of the transistor 51. Meanwhile, hydrogen in insulating layers which are provided in the vicinities of the oxide semiconductor layers that are the active layers of the transistors 52 and 56 and the like is one of causes of generation of carriers in the oxide semiconductor layers. Therefore, the hydrogen may be a cause of a reduction in the reliability of each of the transistor 52 and the transistor 56 and the like. Therefore, in the case where one layer including the transistor using a silicon-based semiconductor material and the other layer including the transistor using an oxide semiconductor are stacked, it is preferable that the insulating layer 80 having a function of preventing diffusion of hydrogen be provided between them. Hydrogen is confined in the one layer by the insulating layer 80, so that the reliability of the transistor 51 can be improved. Furthermore, diffusion of hydrogen from the one layer to the other layer is prevented, whereby the reliability of each of the transistors 52 and 56 and the like can also be increased.

As the insulating layer 80, for example, aluminum oxide, aluminum oxynitride, gallium oxide, gallium oxynitride, yttrium oxide, yttrium oxynitride, hafnium oxide, hafnium oxynitride, yttria-stabilized zirconia (YSZ), or the like can be used.

Furthermore, the silicon substrate 40 is not limited to a bulk silicon substrate and may be an SOI substrate. Furthermore, instead of the silicon substrate 40, a substrate using germanium, silicon germanium, silicon carbide, gallium arsenide, aluminum gallium arsenide, indium phosphide, gallium nitride, or an organic semiconductor as a material can also be used.

Note that the transistor 51 can be a transistor of various types without being limited to a planar-type transistor. For example, a FIN (fin)-type transistor, a TRI-GATE (tri-gate)-type transistor, or the like can be used.

The transistor 56 can include various types of semiconductors as well as an oxide semiconductor depending on conditions. For example, silicon, germanium, silicon germanium, silicon carbide, gallium arsenide, aluminum gallium arsenide, indium phosphide, gallium nitride, an organic semiconductor, or the like can be included.

Furthermore, as illustrated in FIG. 11(A1) and FIG. 11(B1), the imaging device may be bent. FIG. 11(A1) illustrates a state in which the imaging device is bent in the direction of dashed-two dotted line X1-X2 in the same drawing. FIG. 11(A2) is a cross-sectional view illustrating a portion indicated by dashed-two dotted line X1-X2 in FIG. 11(A1). FIG. 11(A3) is a cross-sectional view illustrating a portion indicated by dashed-two dotted line Y1-Y2 in FIG. 11(A1).

FIG. 11(B1) illustrates a state where the imaging device is bent in the direction of dashed-two dotted line X3-X4 in the same drawing and the direction of dashed-two dotted line Y3-Y4 in the same drawing. FIG. 11(B2) is a cross-sectional view illustrating a portion indicated by dashed-two dotted line X3-X4 in FIG. 11(B1). FIG. 11(B3) is a cross-sectional view illustrating a portion indicated by dashed-two dotted line Y3-Y4 in FIG. 11(B1).

The bent imaging device enables the curvature of field and astigmatism to be reduced. Thus, the optical design of lens and the like, which is used in combination with the imaging device, can be facilitated. For example, the number of lenses used for aberration correction can be reduced; accordingly, the size or weight of semiconductor devices or the like including the imaging device can be easily reduced. In addition, the quality of a captured image can be improved.

Note that in this embodiment, one embodiment of the present invention has been described. Alternatively, in other embodiments, embodiments of the present invention are described. Note that one embodiment of the present invention is not limited to these. Although an example in which one embodiment of the present invention is applied to an imaging device is described, one embodiment of the present invention is not limited thereto. Depending on circumstances or depending on conditions, one embodiment of the present invention is not necessarily applied to an imaging device. One embodiment of the present invention may be applied to a semiconductor device with another function, for example.

This embodiment can be implemented in appropriate combination with any of the structures described in the other embodiments.

Embodiment 2

In this embodiment, an example of a driving method of a pixel circuit is described.

As described in Embodiment 1, the operation of the pixel circuit is repetition of the reset operation, the accumulation operation, and the selection operation. As imaging modes in which the whole pixel matrix is controlled, a global shutter system and a rolling shutter system are known.

Figure 12:
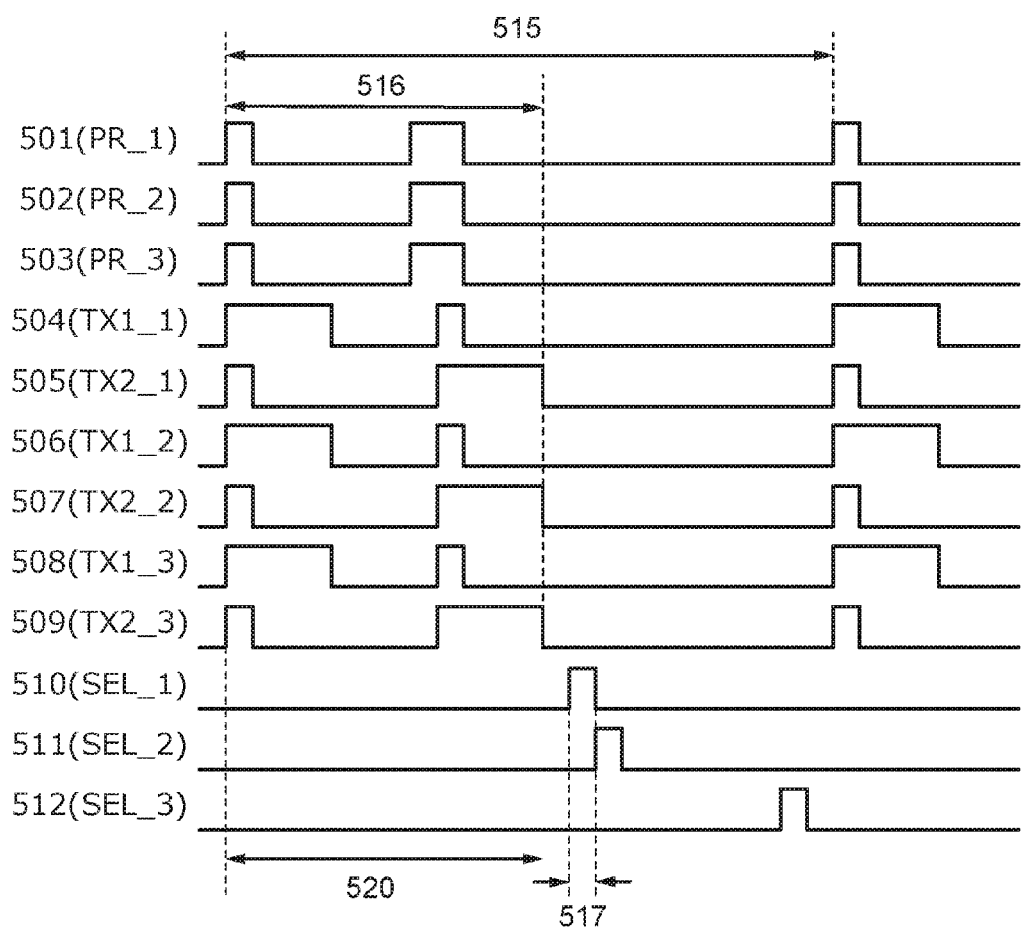
FIG. 12 A timing chart showing an operation of a global shutter system.

FIG. 12 shows a timing chart in a global shutter system. Note that FIG. 12 shows, using an imaging device including a plurality of pixel circuits in matrix and including the circuits of FIG. 1 in the pixel circuits as an example, operations of the pixel circuits from the first row to the n-th row (n is a natural number of three or more).

In FIG. 12, a signal 501, a signal 502, and a signal 503 are signals input to the wirings PR connected to the pixel circuits in the first row, the second row, and the n-th row, respectively. Furthermore, a signal 504, a signal 506, and a signal 508 are signals input to the wirings TX1 connected to the pixel circuits in the first row, the second row, and the n-th row, respectively. Moreover, a signal 505, a signal 507, and a signal 509 are signals input to the wirings TX2 connected to the pixel circuits in the first row, the second row, and the n-th row, respectively. In addition, a signal 510, a signal 511, and a signal 512 are signals input to the wirings SEL connected to the pixel circuits in the first row, the second row, and the n-th row, respectively.

A period 515 is a period required for one imaging. Furthermore, a period 516 is a period in which the pixel circuits in each row perform the reset operation and the accumulation operation at the same timing. The selection operation is sequentially performed in the pixel circuits for each row. As an example, a period 517 is a period in which the selection operation is performed in the pixel circuits in the first row. In this manner, in the global shutter system, the reset operation and the accumulation operation are performed in all the pixel circuits substantially at the same time, and the read operation is sequentially performed for each row.

That is, in the global shutter system, since the accumulation operation is performed in all the pixel circuits substantially at the same time, simultaneity of imaging in the pixel circuits in each row is secured. Therefore, an image with little distortion can be obtained even in the case where an object is a moving object.

On the other hand, FIG. 13 is a timing chart of the case where a rolling shutter system is used. The description of FIG. 10 can be referred to for the signals 501 to 512. A period 615 is a period required for one imaging. A period 621 is a period in which the pixels in the first row perform the reset operation and the accumulation operation. A period 622 is a period in which the pixels in the second row perform the reset operation and the accumulation operation. A period 623 is a period in which the pixels in the n-th row perform the reset operation and the accumulation operation. A period 617 is a period in which the pixel circuits in the first row perform the selection operation. In this manner, in the rolling shutter system, the accumulation operation is not performed at the same time in all the pixel circuits but is sequentially performed for each row; thus, simultaneity of imaging in the pixel circuits in each row is not secured. Therefore, the timing of imaging in the first row is different from that of imaging in the last row, and thus an image with large distortion is obtained in the case where a moving object is an object.

To perform the global shutter system, the potential of the charge storage portion (FD2) needs to be kept for a long time until sequential reading of signals from the pixels is terminated. When a transistor including a channel formation region formed of an oxide semiconductor and having an extremely small off-state current is used as the transistor 55 and the like, the potential of the charge storage portion (FD2) can be kept for a long time. In contrast, In the case where a transistor including a channel formation region formed of silicon or the like is used as the transistor 55 and the like, the potential of the charge storage portion (FD2) cannot be kept for a long time because of a high off-state current, which makes it difficult to use the global shutter system.

The use of transistors including a channel formation region formed of an oxide semiconductor in the pixel circuits facilitates the global shutter system.

This embodiment can be implemented in an appropriate combination with any of the structures described in the other embodiments.

Embodiment 3

In this embodiment, a transistor including an oxide semiconductor that can be used in one embodiment of the present invention is described with reference to drawings. Note that in the drawings in this embodiment, some components are enlarged, reduced in size, or omitted for simplicity.

Figure 14A:
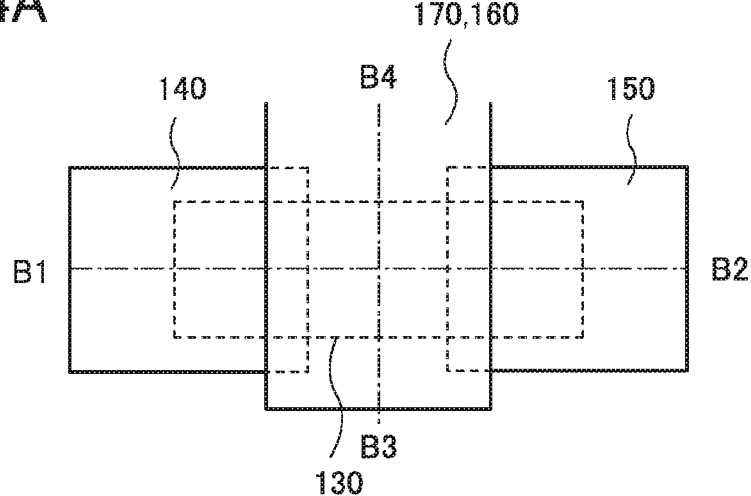
FIG. 14 A top view and a cross-sectional view illustrating a transistor.
Figure 14B:
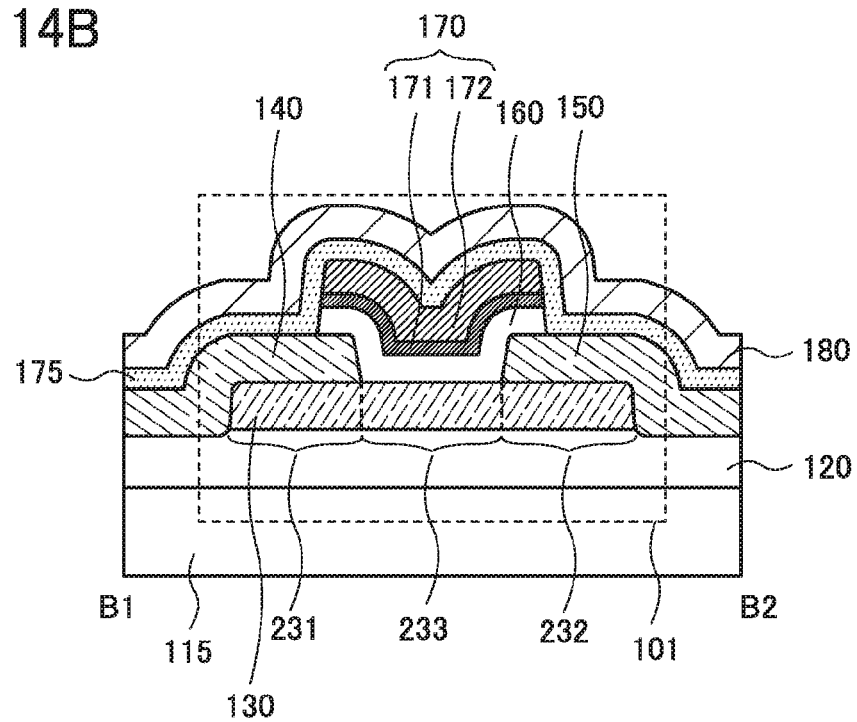

FIGS. 14(A) and 14(B) are a top view and a cross-sectional view illustrating a transistor 101 of one embodiment of the present invention. FIG. 14(A) is a top view, and a cross section in the direction of a dashed-dotted line B1-B2 in FIG. 14(A) corresponds to FIG. 14(B). A cross section in the direction of a dashed-dotted line B3-B4 in FIG. 14(A) corresponds to FIG. 20(A). In some cases, the direction of the dashed-dotted line B1-B2 is referred to as a channel length direction, and the direction of the dashed-dotted line B3-B4 is referred to as a channel width direction.

The transistor 101 includes an insulating layer 120 in contact with a substrate 115; an oxide semiconductor layer 130 in contact with the insulating layer 120; a conductive layer 140 and a conductive layer 150 electrically connected to the oxide semiconductor layer 130; an insulating layer 160 in contact with the oxide semiconductor layer 130, the conductive layer 140, and the conductive layer 150; a conductive layer 170 in contact with the insulating layer 160; an insulating layer 175 in contact with the conductive layer 140, the conductive layer 150, the insulating layer 160, and the conductive layer 170; and an insulating layer 180 in contact with the insulating layer 175. Furthermore, a function of a planarization film may be added to the insulating layer 180 as necessary.

Here, the conductive layer 140, the conductive layer 150, the insulating layer 160, and the conductive layer 170 can function as a source electrode layer, a drain electrode layer, a gate insulating film, and a gate electrode layer, respectively.

Furthermore, a region 231, a region 232, and a region 233 illustrated in FIG. 14(B) can function as a source region, a drain region, and a channel formation region, respectively. The region 231 and the region 232 are in contact with the conductive layer 140 and the conductive layer 150, respectively. When a conductive material that is easily bonded to oxygen is used for the conductive layer 140 and the conductive layer 150, the resistance of the region 231 and the region 232 can be reduced.

Specifically, since the oxide semiconductor layer 130 is in contact with the conductive layer 140 and the conductive layer 150, an oxygen vacancy is generated in the oxide semiconductor layer 130, and by interaction between the oxygen vacancy and hydrogen that remains in the oxide semiconductor layer 130 or diffuses into the oxide semiconductor layer 130 from the outside, the region 231 and the region 232 becomes n-type with low resistance.

Note that functions of a "source" and a "drain" of a transistor are sometimes replaced with each other when a transistor of opposite polarity is used or when the direction of current flow is changed in circuit operation, for example. Therefore, the terms "source" and "drain" can be replaced with each other in this specification. In addition, the term "electrode layer" can be replaced with the term "wiring".

Furthermore, an example in which the conductive layer 170 includes two layers, a conductive layer 171 and a conductive layer 172 is illustrated in the drawing, but a single layer or a stack of three or more layers may also be used. The structure can also be applied to other transistors described in this embodiment.

Moreover, an example in which each of the conductive layer 140 and the conductive layer 150 is a single layer is illustrated in the drawing, but a stack of two or more layers may also be used. The structure can also be applied to other transistors described in this embodiment.

Figure 15A:
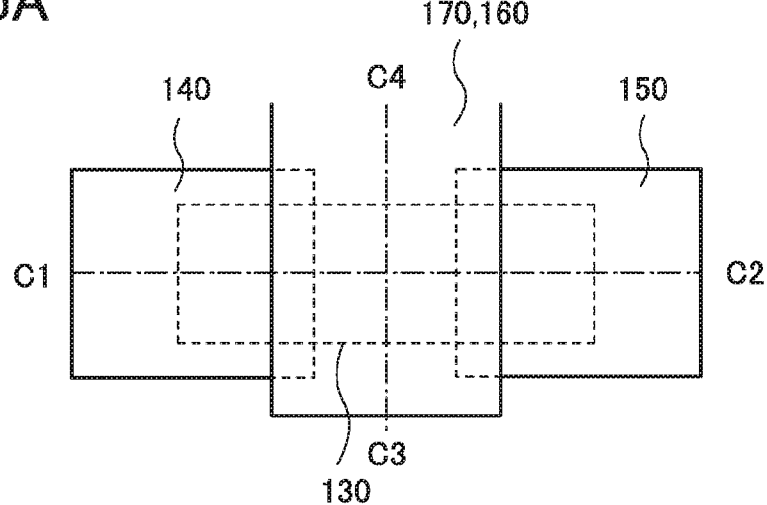
FIG. 15 A top view and a cross-sectional view illustrating a transistor.
Figure 15B:
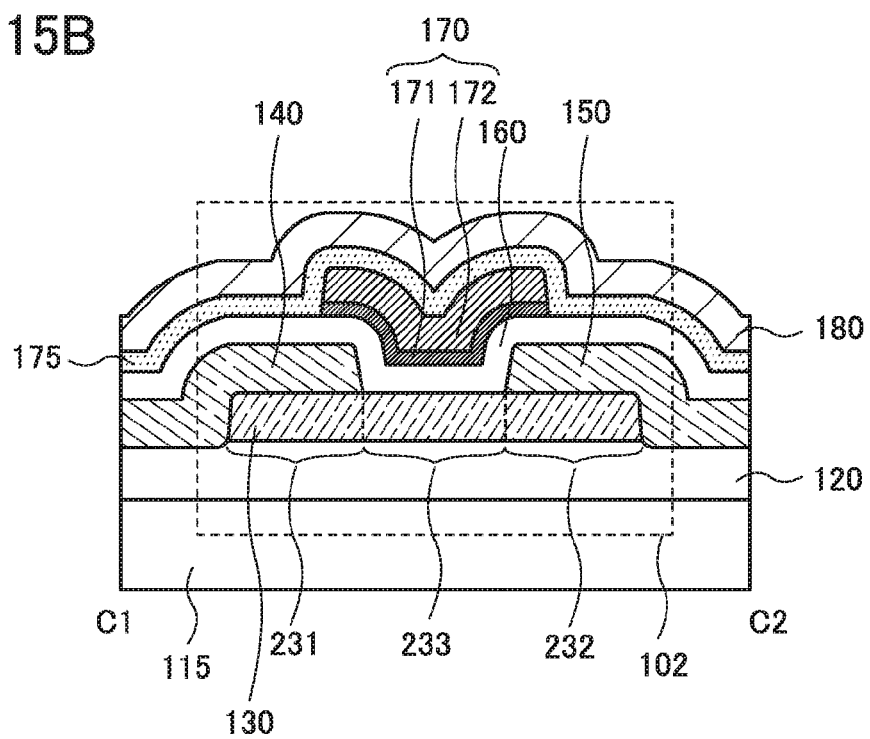

Furthermore, the transistor of one embodiment of the present invention may have a structure illustrated in FIGS. 15(A) and (B). FIG. 15(A) is a top view of a transistor 102. A cross section in the direction of a dashed-dotted line C1-C2 in FIG. 15(A) corresponds to FIG. 15(B). Moreover, a cross section in the direction of a dashed-dotted line C3-C4 in FIG. 15(A) corresponds to FIG. 20(B). In some cases, the direction of the dashed-dotted line C1-C2 is referred to as a channel length direction, and the direction of the dashed-dotted line C3-C4 is referred to as a channel width direction.

The transistor 102 has the same structure as the transistor 101 except that an end portion of the insulating layer 160 functioning as a gate insulating film is not aligned with an end portion of the conductive layer 170 functioning as a gate electrode layer. In the structure of the transistor 102, wide areas of the conductive layer 140 and the conductive layer 150 are covered with the insulating layer 160 and accordingly the resistance between the conductive layer 170 and the conductive layers 140 and 150 is high; therefore, a feature of low gate leakage current is included.

The transistor 101 and the transistor 102 each have a top-gate structure including a region where the conductive layer 170 overlaps with each of the conductive layers 140 and 150. To reduce parasitic capacitance, the width of the region in the channel length direction is preferably greater than or equal to 3 nm and less than 300 nm. Meanwhile, since an offset region is not formed in the oxide semiconductor layer 130, a transistor with high on-state current can be easily formed.

Figure 16A:
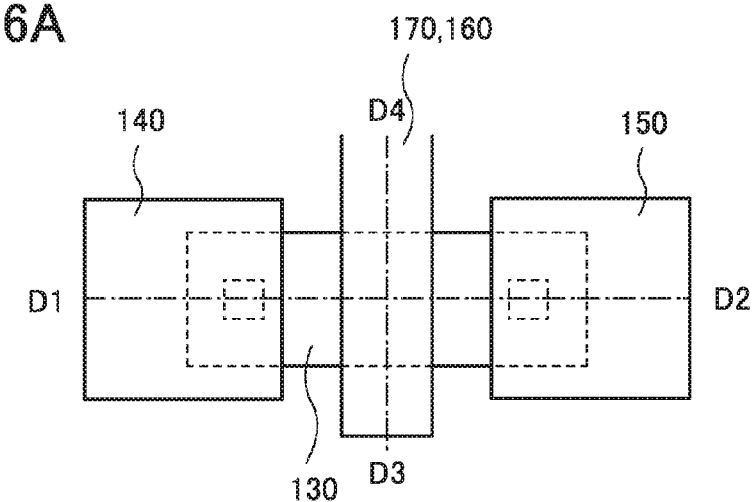
FIG. 16 A top view and a cross-sectional view illustrating a transistor.

The transistor of one embodiment of the present invention may have a structure illustrated in FIGS. 16(A) and (B). FIG. 16(A) is a top view of a transistor 103. A cross section in the direction of a dashed-dotted line D1-D2 in FIG. 16(A) corresponds to FIG. 16(B). Furthermore, a cross section in the direction of a dashed-dotted line D3-D4 in FIG. 16(A) is illustrated in FIG. 20(A). In some cases, the direction of the dashed-dotted line D1-D2 is referred to as a channel length direction, and the direction of the dashed-dotted line D3-D4 is referred to as a channel width direction.

The transistor 103 includes the insulating layer 120 in contact with the substrate 115; the oxide semiconductor layer 130 in contact with the insulating layer 120; the insulating layer 160 in contact with the oxide semiconductor layer 130; the conductive layer 170 in contact with the insulating layer 160; the insulating layer 175 covering the oxide semiconductor layer 130, the insulating layer 160, and the conductive layer 170; the insulating layer 180 in contact with the insulating layer 175; and the conductive layer 140 and the conductive layer 150 electrically connected to the oxide semiconductor layer 130 through openings provided in the insulating layer 175 and the insulating layer 180. Furthermore, an insulating layer (planarization film) in contact with the insulating layer 180, the conductive layer 140, and the conductive layer 150 or the like may be included as necessary.

Here, the conductive layer 140, the conductive layer 150, the insulating layer 160, and the conductive layer 170 can function as a source electrode layer, a drain electrode layer, a gate insulating film, and a gate electrode layer, respectively.

Figure 16B:
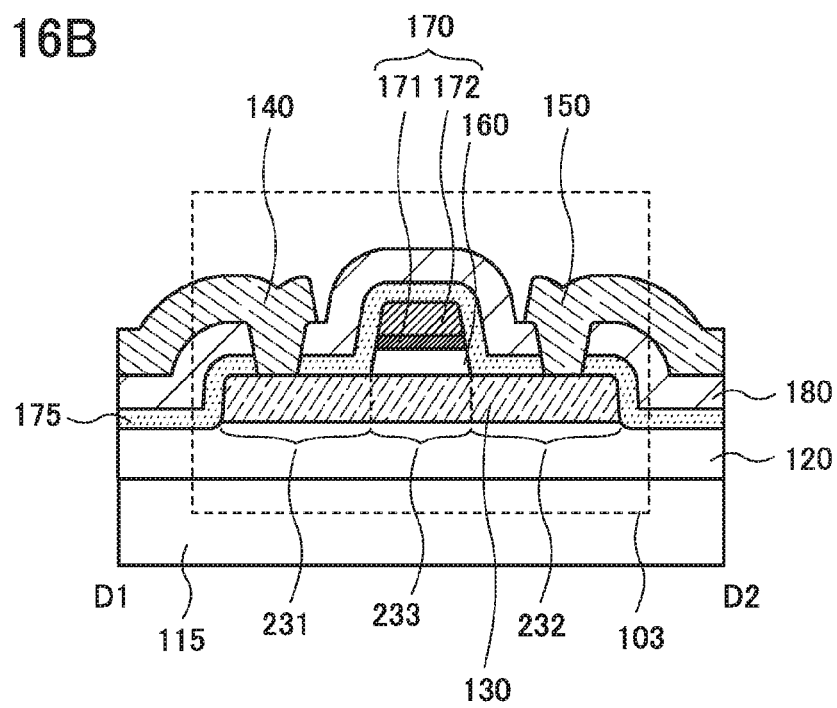

Furthermore, the region 231, the region 232, and the region 233 in FIG. 16(B) can function as a source region, a drain region, and a channel formation region, respectively. The region 231 and the region 232 are in contact with the insulating layer 175. When an insulating material containing hydrogen is used for the insulating layer 175, for example, the resistance of the region 231 and the region 232 can be reduced.

Specifically, by interaction between an oxygen vacancy generated in the region 231 and the region 232 by the steps up to the formation of the insulating layer 175 and hydrogen that diffuses into the region 231 and the region 232 from the insulating layer 175, the region 231 and the region 232 becomes n-type with low resistance. Note that as the insulating material containing hydrogen, for example, a silicon nitride film, an aluminum nitride film, or the like can be used.

Figure 17A:
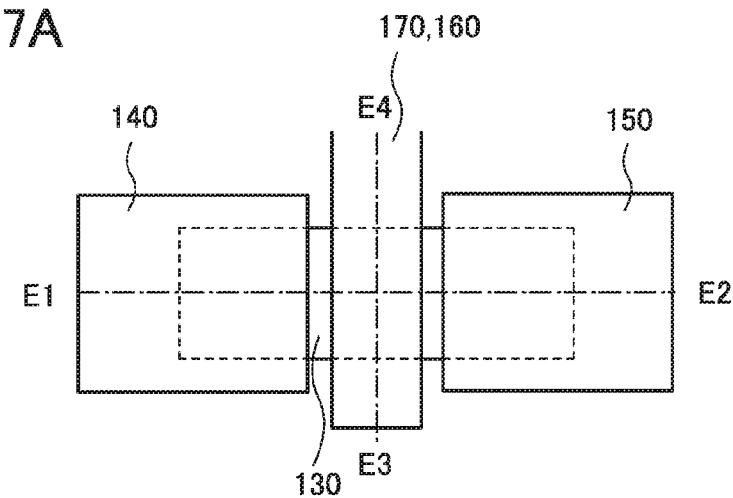
FIG. 17 A top view and a cross-sectional view illustrating a transistor.

Furthermore, the transistor of one embodiment of the present invention may have a structure illustrated in FIGS. 17(A) and (B). FIG. 17(A) is a top view of a transistor 104. A cross section in the direction of a dashed-dotted line E1-E2 in FIG. 17(A) corresponds to FIG. 17(B). Moreover, a cross section in the direction of a dashed-dotted line E3-E4 in FIG. 17(A) corresponds to FIG. 20(A). In some cases, the direction of the dashed-dotted line E1-E2 is referred to as a channel length direction, and the direction of the dashed-dotted line E3-E4 is referred to as a channel width direction.

The transistor 104 has the same structure as the transistor 103 except that the conductive layer 140 and the conductive layer 150 in contact with the oxide semiconductor layer 130 cover end portions thereof.

Figure 17B:
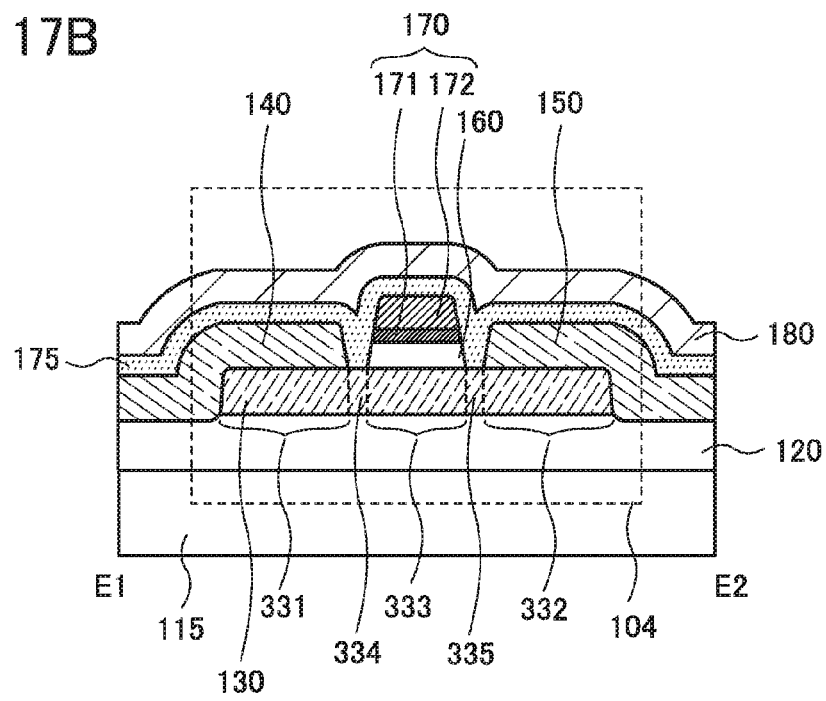

Furthermore, In FIG. 17(B), a region 331 and a region 334 can function as a source region, a region 332 and a region 335 can function as a drain region, and a region 333 can function as a channel formation region. The resistance of the region 331 and the region 332 can be reduced in a manner similar to that of the region 231 and the region 232 in the transistor 101. Moreover, the resistance of the region 334 and the region 335 can be reduced in a manner similar to that of the region 231 and the region 232 in the transistor 103. Note that in the case where the length of the region 334 and the region 335 in the channel length direction is less than or equal to 100 nm, preferably less than or equal to 50 nm, a gate electric field contributes to preventing a significant decrease in on-state current; therefore, a structure in which a reduction in resistance as described above is not performed can also be employed.

The transistor 103 and the transistor 104 each have a self-aligned structure not including a region where the conductive layer 170 overlaps with each of the conductive layers 140 and 150. A transistor with a self-aligned structure, which has extremely small parasitic capacitance between a gate electrode layer and source and drain electrode layers, is suitable for applications that require high-speed operation.

Figure 18A:
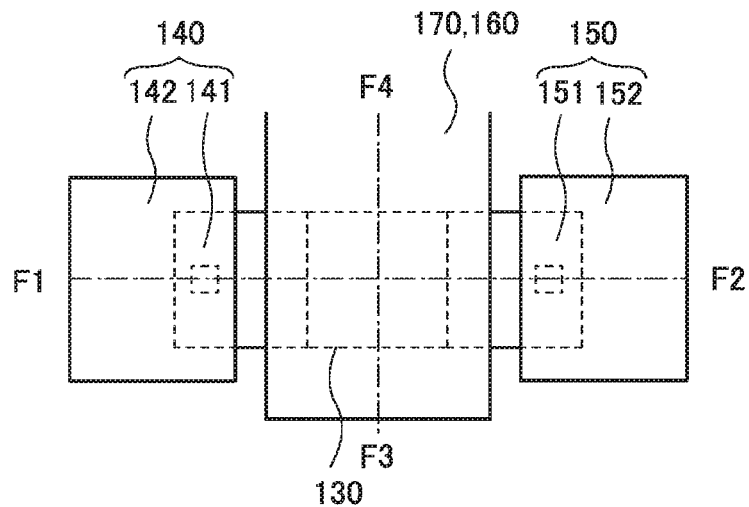
FIG. 18 A top view and a cross-sectional view illustrating a transistor.
Figure 18B:
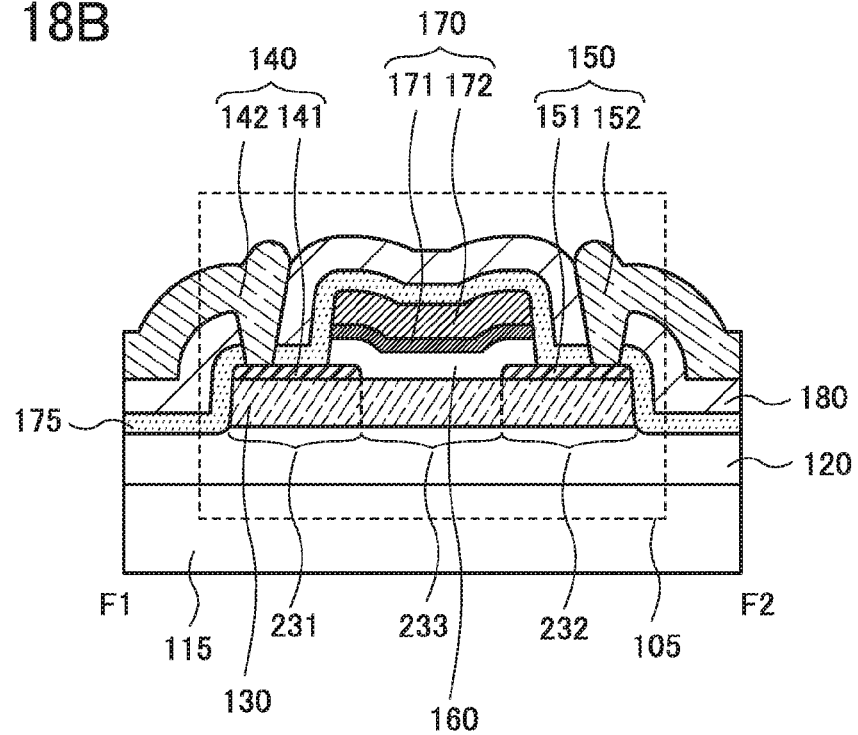

Furthermore, the transistor of one embodiment of the present invention may have a structure illustrated in FIGS. 18(A) and (B). FIG. 18(A) is a top view of a transistor 105. A cross section in the direction of a dashed-dotted line F1-F2 in FIG. 18(A) corresponds to FIG. 18(B). Moreover, a cross section in the direction of a dashed-dotted line F3-F4 in FIG. 18(A) corresponds to FIG. 20(A). In some cases, the direction of the dashed-dotted line F1-F2 is referred to as a channel length direction, and the direction of the dashed-dotted line F3-F4 is referred to as a channel width direction.

The transistor 105 includes the insulating layer 120 in contact with the substrate 115; the oxide semiconductor layer 130 in contact with the insulating layer 120; a conductive layer 141 and a conductive layer 151 electrically connected to the oxide semiconductor layer 130; the insulating layer 160 in contact with the oxide semiconductor layer 130, the conductive layer 141, and the conductive layer 151; the conductive layer 170 in contact with the insulating layer 160; the insulating layer 175 in contact with the oxide semiconductor layer 130, the conductive layer 141, the conductive layer 151, the insulating layer 160, and the conductive layer 170; the insulating layer 180 in contact with the insulating layer 175; and a conductive layer 142 and a conductive layer 152 electrically connected to the conductive layer 141 and the conductive layer 151, respectively, through openings provided in the insulating layer 175 and the insulating layer 180. In addition, the insulating layer or the like in contact with the insulating layer 180, the conductive layer 142, and the conductive layer 152 may be included as necessary.

Here, a structure in which the conductive layer 141 and the conductive layer 151 are in contact with the top surface of the oxide semiconductor layer 130 and are not in contact with side surfaces thereof is employed.

The transistor 105 has the same structure as the transistor 101 except that the conductive layer 141 and the conductive layer 151 are provided, that the openings are provided in the insulating layer 175 and the insulating layer 180, and that the conductive layer 142 and the conductive layer 152 electrically connected to the conductive layer 141 and the conductive layer 151, respectively, through the openings are provided. The conductive layer 140 (the conductive layer 141 and the conductive layer 142) can function as a source electrode layer, and the conductive layer 150 (the conductive layer 151 and the conductive layer 152) can function as a drain electrode layer.

Figure 19A:
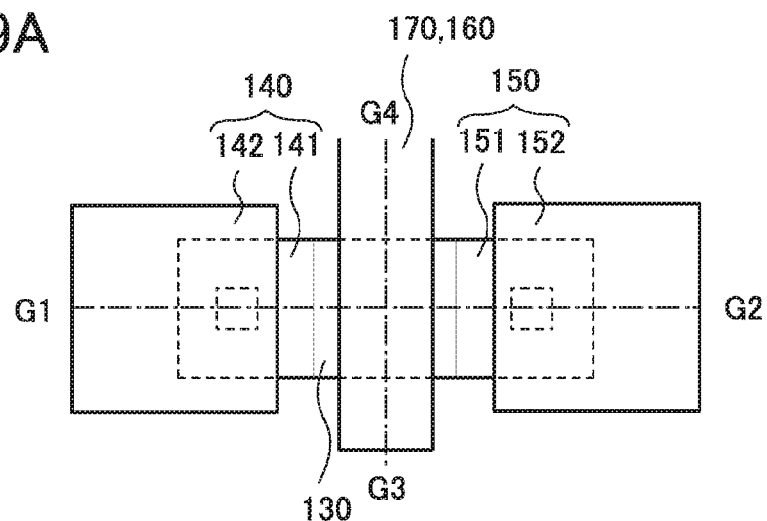
FIG. 19 A top view and a cross-sectional view illustrating a transistor.
Figure 19B:
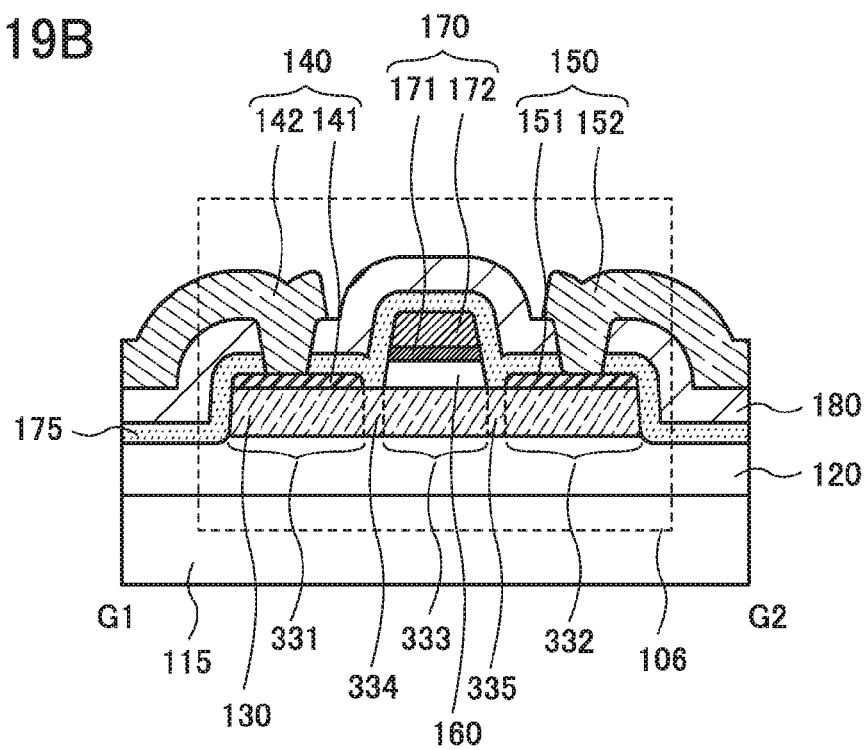

Furthermore, the transistor of one embodiment of the present invention may have a structure illustrated in FIGS. 19(A) and (B). FIG. 19(A) is a top view of a transistor 106. A cross section in the direction of a dashed-dotted line G1-G2 in FIG. 19(A) corresponds to FIG. 19(B). Moreover, a cross section in the direction of a dashed-dotted line G3-G4 in FIG. 19(A) corresponds to FIG. 20(A). In some cases, the direction of the dashed-dotted line G1-G2 is referred to as a channel length direction, and the direction of the dashed-dotted line G3-G4 is referred to as a channel width direction.

The transistor 106 includes the insulating layer 120 in contact with the substrate 115; the oxide semiconductor layer 130 in contact with the insulating layer 120; the conductive layer 141 and the conductive layer 151 electrically connected to the oxide semiconductor layer 130; the insulating layer 160 in contact with the oxide semiconductor layer 130; the conductive layer 170 in contact with the insulating layer 160; the insulating layer 175 in contact with the insulating layer 120, the oxide semiconductor layer 130, the conductive layer 141, the conductive layer 151, the insulating layer 160, and the conductive layer 170; the insulating layer 180 in contact with the insulating layer 175; and the conductive layer 142 and the conductive layer 152 electrically connected to the conductive layer 141 and the conductive layer 151, respectively, through openings provided in the insulating layer 175 and the insulating layer 180. In addition, an insulating layer (planarization film) in contact with the insulating layer 180, the conductive layer 142, and the conductive layer 152 or the like may be included as necessary.

Here, a structure in which the conductive layer 141 and the conductive layer 151 are in contact with the top surface of the oxide semiconductor layer 130 and are not in contact with side surfaces thereof is employed.

The transistor 106 has the same structure as the transistor 103 except that the conductive layer 141 and the conductive layer 151 are provided. The conductive layer 140 (the conductive layer 141 and the conductive layer 142) can function as a source electrode layer, and the conductive layer 150 (the conductive layer 151 and the conductive layer 152) can function as a drain electrode layer.

In each of the structures of the transistor 105 and the transistor 106, a structure in which the conductive layer 140 and the conductive layer 150 are not in contact with the insulating layer 120 is employed, which makes the insulating layer 120 less likely to be deprived of oxygen by the conductive layer 140 and the conductive layer 150 and can facilitate oxygen supply from the insulating layer 120 to the oxide semiconductor layer 130.

Note that an impurity for forming an oxygen vacancy to increase conductivity may be added to the region 231 and the region 232 in the transistor 103 and the region 334 and the region 335 in the transistor 104 and the transistor 106. As an impurity for forming an oxygen vacancy in an oxide semiconductor layer, for example, one or more selected from phosphorus, arsenic, antimony, boron, aluminum, silicon, nitrogen, helium, neon, argon, krypton, xenon, indium, fluorine, chlorine, titanium, zinc, and carbon can be used. As a method for adding the impurity, a plasma treatment method, an ion implantation method, an ion doping method, a plasma immersion ion implantation method, or the like can be used.

When the above element is added as an impurity element to the oxide semiconductor layer, a bond between a metal element and oxygen in the oxide semiconductor layer is cut, whereby an oxygen vacancy is formed. Interaction between an oxygen vacancy in the oxide semiconductor layer and hydrogen that remains in the oxide semiconductor layer or is added to the oxide semiconductor layer later can increase the conductivity of the oxide semiconductor layer.

Note that when hydrogen is added to an oxide semiconductor in which an oxygen vacancy is formed by addition of an impurity element, hydrogen enters an oxygen vacant site and forms a donor level in the vicinity of the conduction band. Consequently, an oxide conductor can be formed. Here, an oxide conductor refers to an oxide semiconductor having become a conductor.

The oxide conductor is a degenerate semiconductor and it is suggested that the conduction band edge equals to or substantially equals to the Fermi level. For that reason, an ohmic contact is made between an oxide conductor layer and conductive layers functioning as a source electrode layer and a drain electrode layer; thus, contact resistance between the oxide conductor layer and the conductive layers functioning as a source electrode layer and a drain electrode layer can be reduced.

Figure 21A:
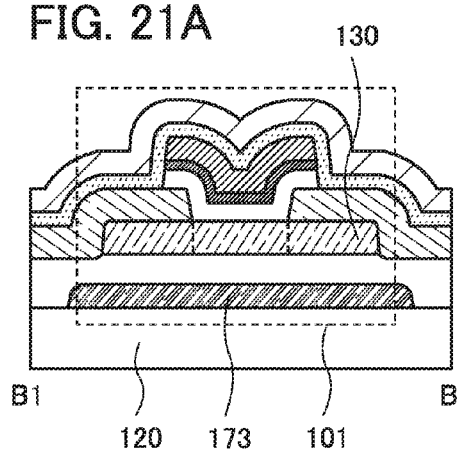
FIG. 21 Diagrams illustrating cross sections of transistors in a channel length direction.
Figure 21B:
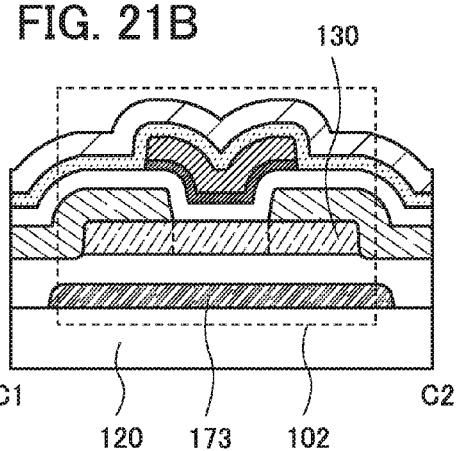
Figure 21C:
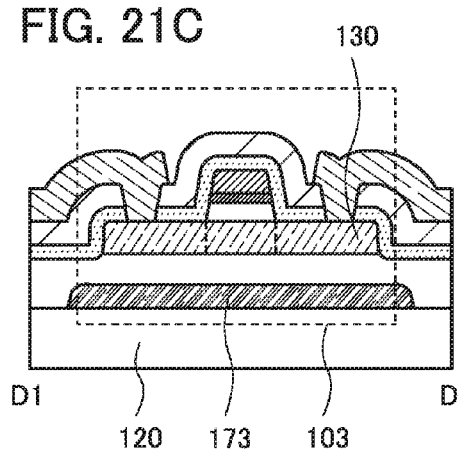
Figure 21D:
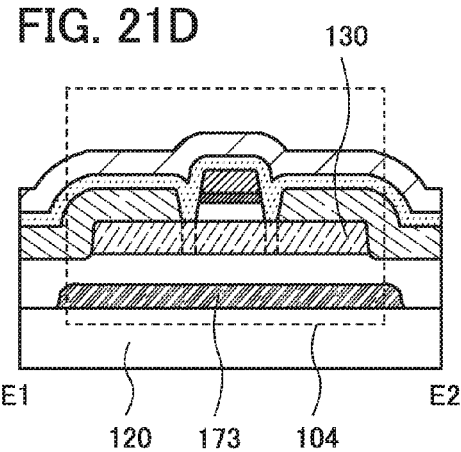
Figure 21E:
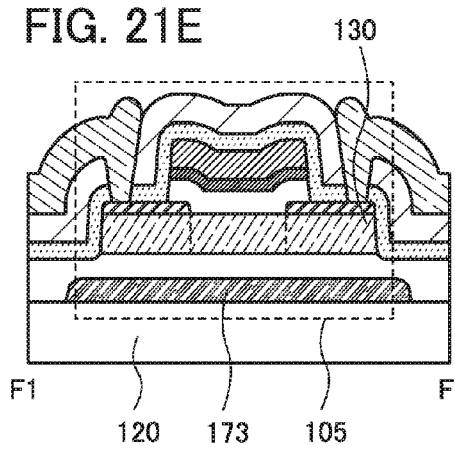
Figure 21F:
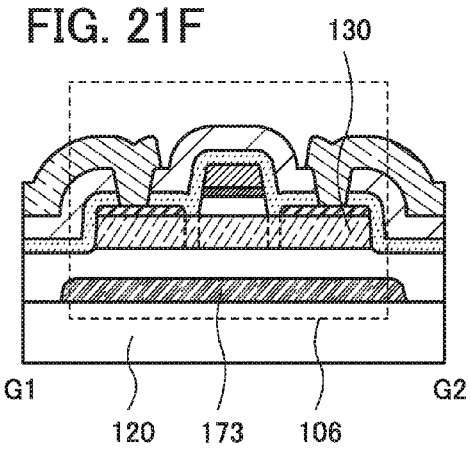

Furthermore, the transistor of one embodiment of the present invention may include a conductive layer 173 between the oxide semiconductor layer 130 and the substrate 115 as illustrated in the cross-sectional views in the channel length direction in FIGS. 21(A), (B), (C), (D), (E), and (F) and the cross-sectional views in the channel width direction in FIGS. 20(C) and (D). When the conductive layer is used as a second gate electrode layer (back gate), the on-state current can be increased or the threshold voltage can be controlled. In the cross-sectional views in FIGS. 21(A), (B), (C), (D), (E), and (F), the width of the conductive layer 173 may be shorter than that of the oxide semiconductor layer 130. Moreover, the width of the conductive layer 173 may be shorter than the width of the conductive layer 170.

In order to increase the on-state current, for example, the transistor is driven as a double-gate transistor by setting the conductive layer 170 and the conductive layer 173 to the same potential. Furthermore, to control the threshold voltage, a fixed potential, which is different from a potential of the conductive layer 170, may be supplied to the conductive layer 173. To set the conductive layer 170 and the conductive layer 173 at the same potential, for example, as shown in FIG. 20(D), the conductive layer 170 and the conductive layer 173 may be electrically connected to each other through a contact hole.

Although an example in which the oxide semiconductor layer 130 is a single layer in each of the transistor 101 to the transistor 106 in FIG. 14 to FIG. 19 is illustrated in the drawings, the oxide semiconductor layer 130 may be a stacked layer. The oxide semiconductor layer 130 in the transistor 101 to the transistor 106 can be replaced with the oxide semiconductor layer 130 illustrated in FIG. 22 or FIG. 23.

Figure 22A:
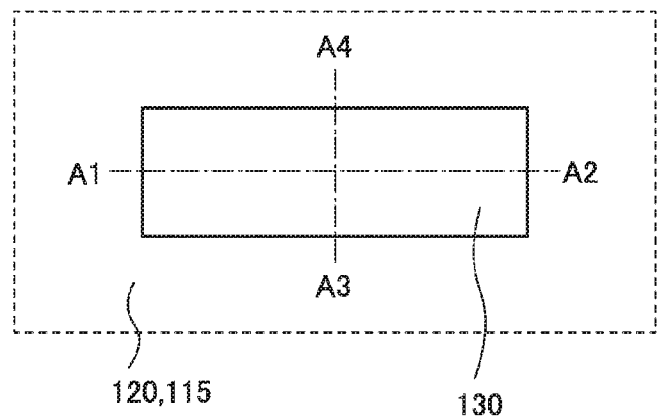
FIG. 22 A top view and cross-sectional views illustrating a semiconductor layer.
Figure 22B:
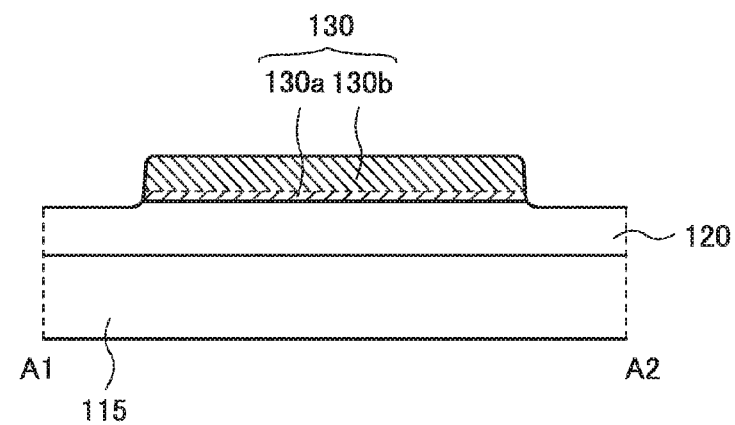
Figure 22C:
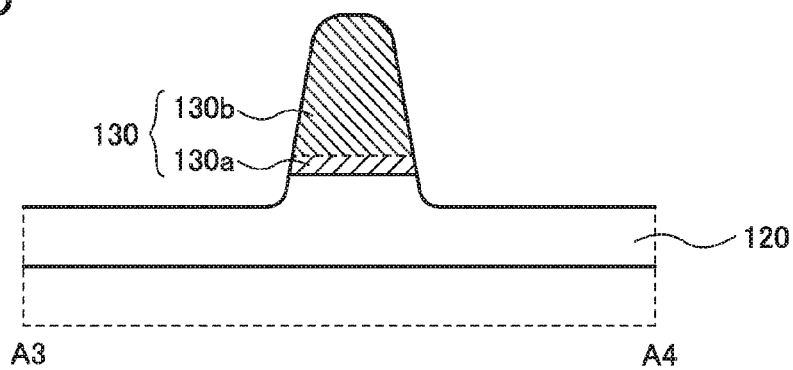

FIGS. 22(A), (B), and (C) are a top view and cross-sectional views of the oxide semiconductor layer 130 with a two-layer structure. FIG. 22(A) is the top view. A cross section in the direction of a dashed-dotted line A1-A2 in FIG. 22(A) corresponds to FIG. 22(B). Furthermore, a cross section in the direction of a dashed-dotted line A3-A4 in FIG. 22(A) corresponds to FIG. 22(C).

Figure 23A:
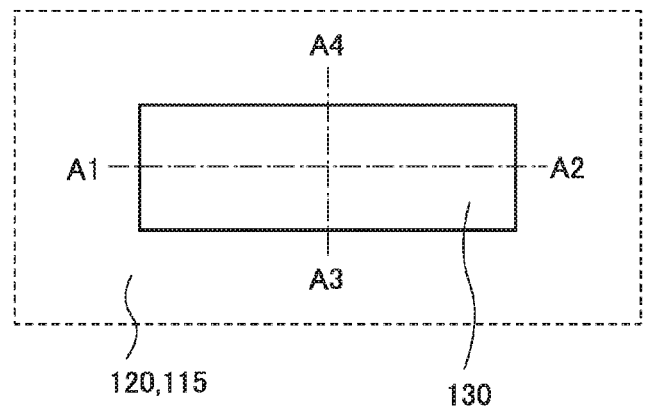
FIG. 23 A top view and cross-sectional views illustrating a semiconductor layer.
Figure 23B:
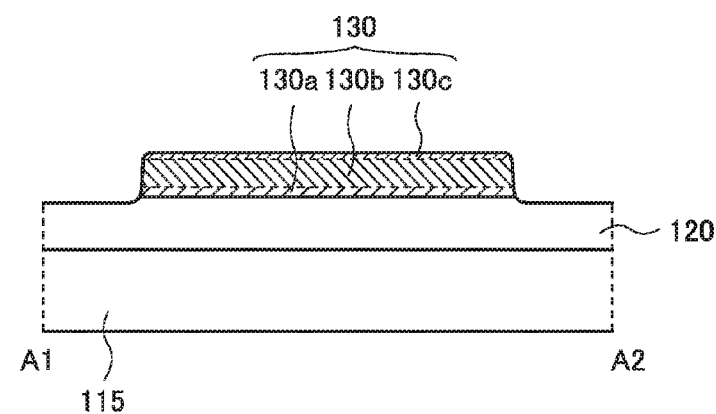
Figure 23C:
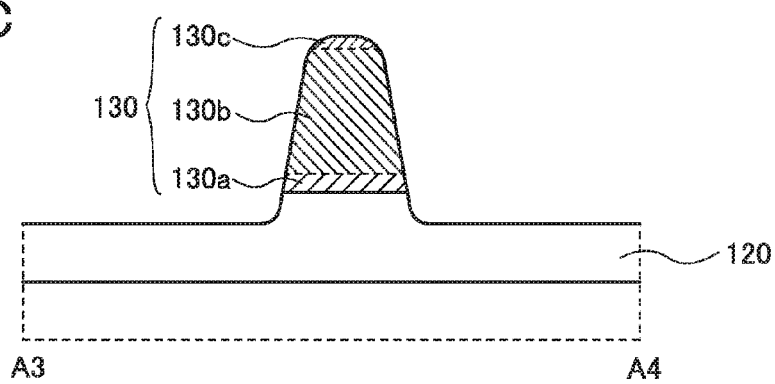

Moreover, FIGS. 23(A), (B), and (C) are a top view and cross-sectional views of the oxide semiconductor layer 130 with a three-layer structure. FIG. 23(A) is the top view. A cross section in the direction of a dashed-dotted line A1-A2 in FIG. 23(A) corresponds to FIG. 23(B). Furthermore, a cross section in the direction of a dashed-dotted line A3-A4 in FIG. 23(A) corresponds to FIG. 23(C).

Oxide semiconductor layers with different compositions, for example, can be used as an oxide semiconductor layer 130a, an oxide semiconductor layer 130b, and an oxide semiconductor layer 130c.

Figure 24A:
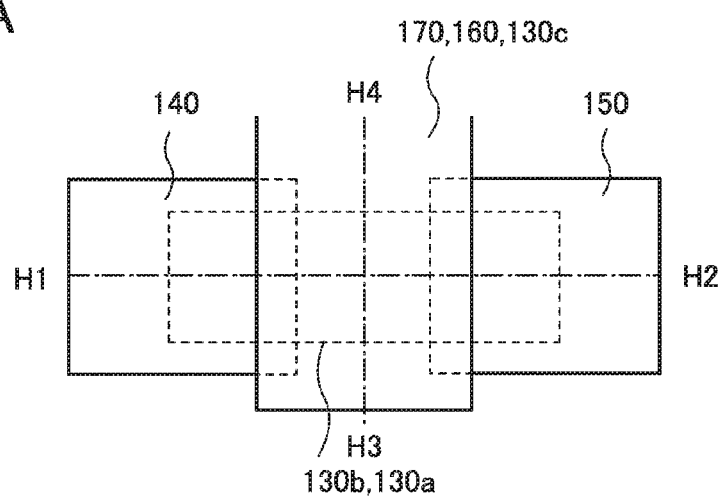
FIG. 24 A top view and a cross-sectional view illustrating a transistor.
Figure 24B:
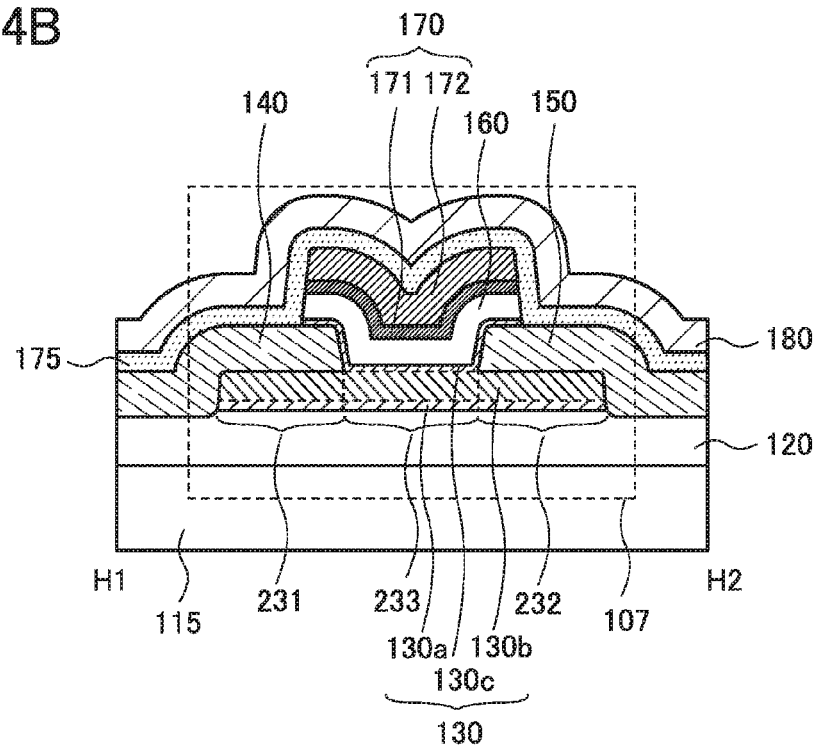
Figure 30A:
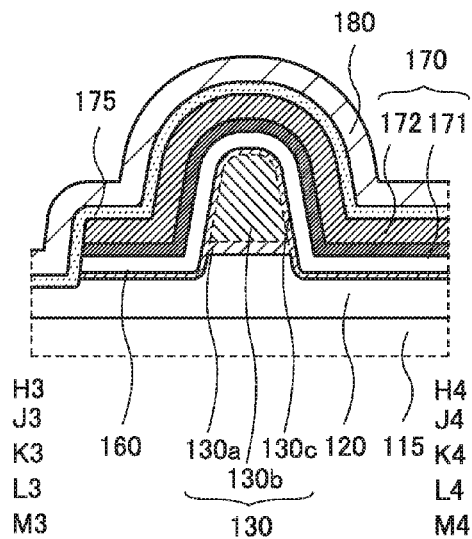
FIG. 30 Diagrams illustrating cross sections of transistors in a channel width direction.

Furthermore, the transistor of one embodiment of the present invention may have a structure illustrated in FIGS. 24(A) and (B). FIG. 24(A) is a top view of a transistor 107. A cross section in the direction of a dashed-dotted line H1-H2 in FIG. 24(A) corresponds to FIG. 24(B). Moreover, a cross section in the direction of a dashed-dotted line H3-H4 in FIG. 24(A) corresponds to FIG. 30(A). In some cases, the direction of the dashed-dotted line H1-H2 is referred to as a channel length direction, and the direction of the dashed-dotted line H3-H4 is referred to as a channel width direction.

The transistor 107 includes the insulating layer 120 in contact with the substrate 115; a stack of the oxide semiconductor layer 130a and the oxide semiconductor layer 130b, in contact with the insulating layer 120; the conductive layer 140 and the conductive layer 150 electrically connected to the stack; the oxide semiconductor layer 130c in contact with the stack, the conductive layer 140, and the conductive layer 150; the insulating layer 160 in contact with the oxide semiconductor layer 130c; the conductive layer 170 in contact with the insulating layer 160; the insulating layer 175 in contact with the conductive layer 140, the conductive layer 150, the oxide semiconductor layer 130c, the insulating layer 160, and the conductive layer 170; and the insulating layer 180 in contact with the insulating layer 175. Furthermore, a function of a planarization film may be added to the insulating layer 180 as necessary.

The transistor 107 has the same structure as the transistor 101 except that the oxide semiconductor layer 130 includes two layers (the oxide semiconductor layer 130a and the oxide semiconductor layer 130b) in the region 231 and the region 232, that the oxide semiconductor layer 130 includes three layers (the oxide semiconductor layer 130a, the oxide semiconductor layer 130b, and the oxide semiconductor layer 130c) in the region 233, and that part of the oxide semiconductor layer (the oxide semiconductor layer 130c) exists between the insulating layer 160 and the conductive layers 140 and 150.

Figure 25A:
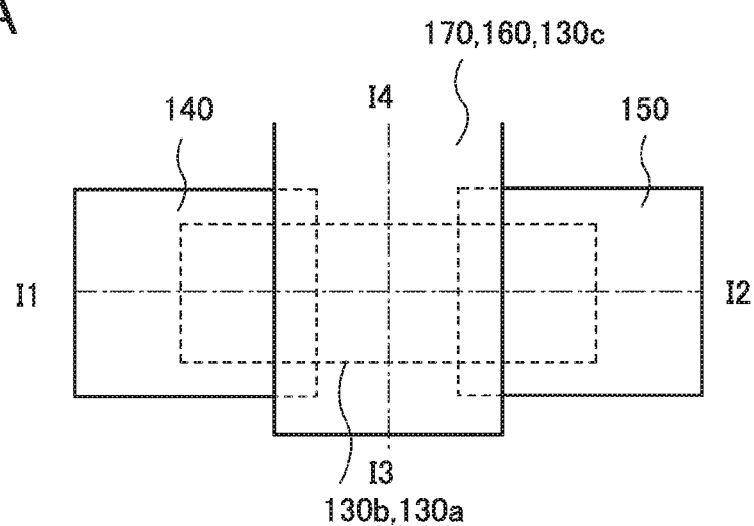
FIG. 25 A top view and a cross-sectional view illustrating a transistor.
Figure 25B:
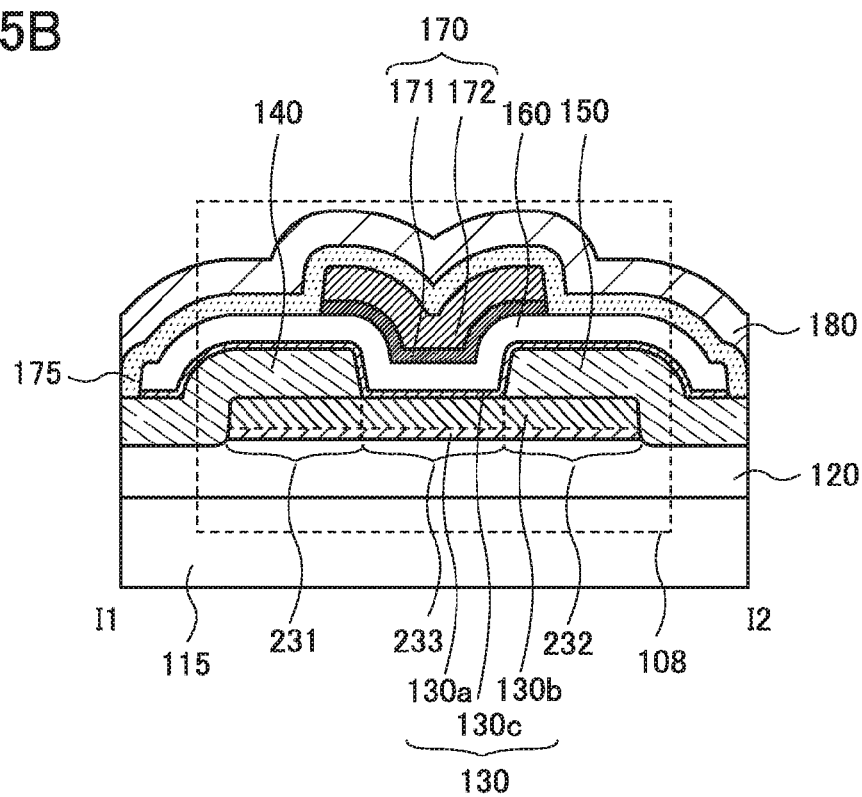
Figure 30B:
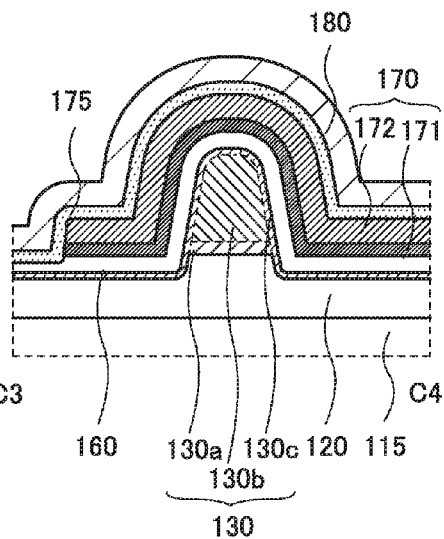

Furthermore, the transistor of one embodiment of the present invention may have a structure illustrated in FIGS. 25(A) and (B). FIG. 25(A) is a top view of a transistor 108. A cross section in the direction of a dashed-dotted line I1-I2 in FIG. 25(A) corresponds to FIG. 25(B). Moreover, a cross section in the direction of a dashed-dotted line I3-I4 in FIG. 25(A) corresponds to FIG. 30(B). In some cases, the direction of the dashed-dotted line I1-I2 is referred to as a channel length direction, and the direction of the dashed-dotted line I3-I4 is referred to as a channel width direction.

The transistor 108 differs from the transistor 107 in that the end portions of the insulating layer 160 and the oxide semiconductor layer 130c are not aligned with the end portion of the conductive layer 170.

Figure 26A:
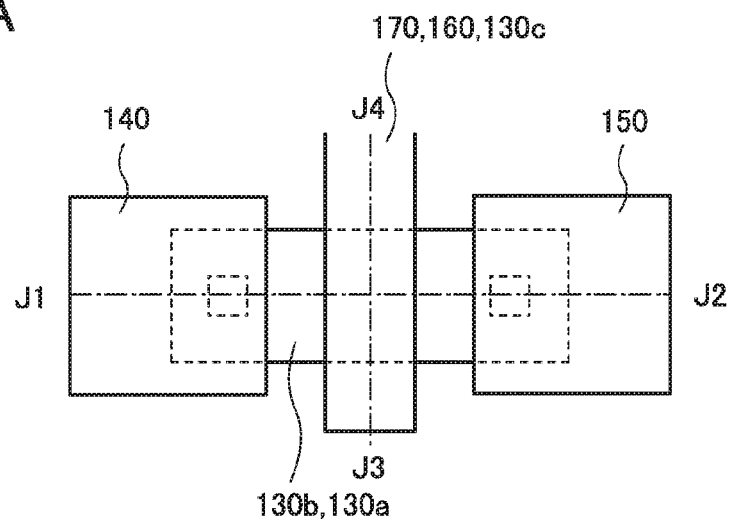
FIG. 26 A top view and a cross-sectional view illustrating a transistor.
Figure 26B:
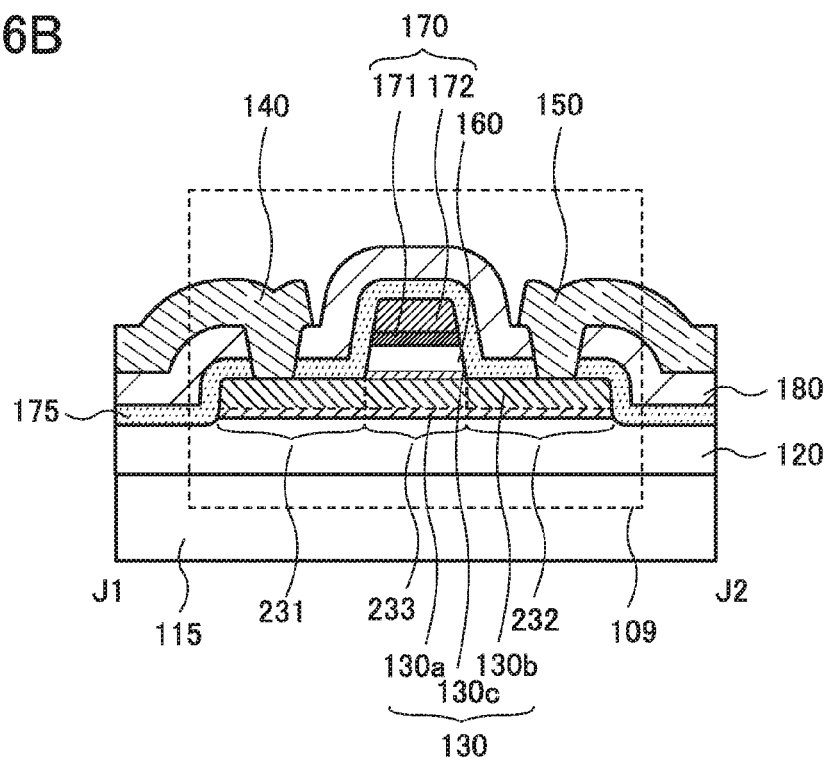

Furthermore, the transistor of one embodiment of the present invention may have a structure illustrated in FIGS. 26(A) and (B). FIG. 26(A) is a top view of a transistor 109. A cross section in the direction of a dashed-dotted line J1-J2 in FIG. 26(A) corresponds to FIG. 26(B). Moreover, a cross section in the direction of a dashed-dotted line J3-J4 in FIG. 26(A) corresponds to FIG. 30(A). In some cases, the direction of the dashed-dotted line J1-J2 is referred to as a channel length direction, and the direction of the dashed-dotted line J3-J4 is referred to as a channel width direction.

The transistor 109 includes the insulating layer 120 in contact with the substrate 115; a stack of the oxide semiconductor layer 130a and the oxide semiconductor layer 130b, in contact with the insulating layer 120; the oxide semiconductor layer 130c in contact with the stack; the insulating layer 160 in contact with the oxide semiconductor layer 130c; the conductive layer 170 in contact with the insulating layer 160; the insulating layer 175 covering the stack, the oxide semiconductor layer 130c, the insulating layer 160, and the conductive layer 170; the insulating layer 180 in contact with the insulating layer 175; and the conductive layer 140 and the conductive layer 150 electrically connected to the stack through openings provided in the insulating layer 175 and the insulating layer 180. In addition, an insulating layer (planarization film) or the like in contact with the insulating layer 180, the conductive layer 140, and the conductive layer 150 may be included as necessary.

The transistor 109 has the same structure as the transistor 103 except that the oxide semiconductor layer 130 includes two layers (the oxide semiconductor layer 130a and the oxide semiconductor layer 130b) in the region 231 and the region 232 and that the oxide semiconductor layer 130 includes three layers (the oxide semiconductor layer 130a, the oxide semiconductor layer 130b, and the oxide semiconductor layer 130c) in the region 233.

Figure 27A:
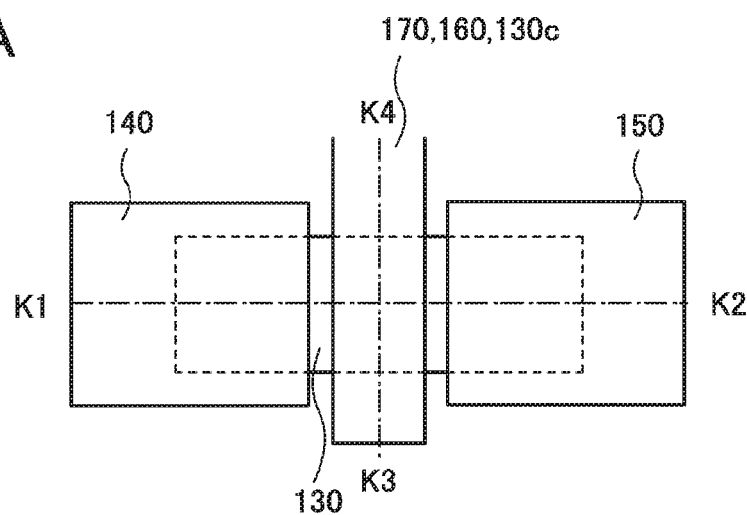
FIG. 27 A top view and a cross-sectional view illustrating a transistor.
Figure 27B:
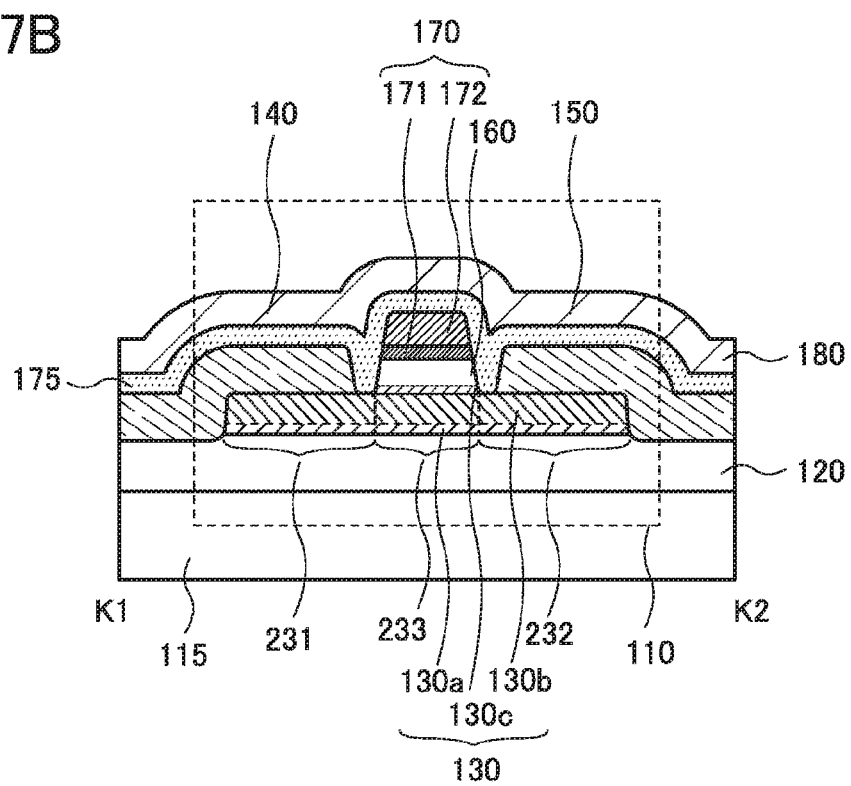

Furthermore, the transistor of one embodiment of the present invention may have a structure illustrated in FIGS. 27(A) and (B). FIG. 27(A) is a top view of a transistor 110. A cross section in the direction of a dashed-dotted line K1-K2 in FIG. 27(A) corresponds to FIG. 27(B). Moreover, a cross section in the direction of a dashed-dotted line K3-K4 in FIG. 27(A) corresponds to FIG. 30(A). In some cases, the direction of the dashed-dotted line K1-K2 is referred to as a channel length direction, and the direction of the dashed-dotted line K3-K4 is referred to as a channel width direction.

The transistor 110 has the same structure as the transistor 104 except that the oxide semiconductor layer 130 includes two layers (the oxide semiconductor layer 130a and the oxide semiconductor layer 130b) in the region 231 and the region 232 and that the oxide semiconductor layer 130 includes three layers (the oxide semiconductor layer 130a, the oxide semiconductor layer 130b, and the oxide semiconductor layer 130c) in the region 233.

Figure 28A:
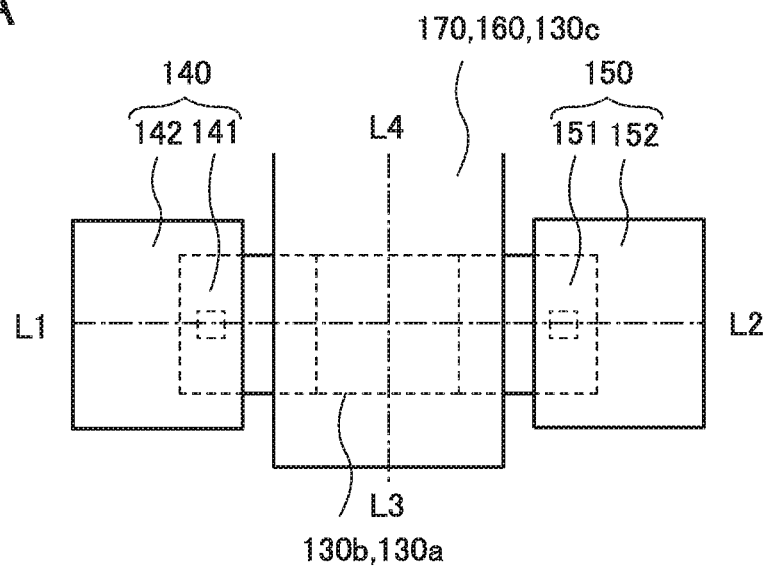
FIG. 28 A top view and a cross-sectional view illustrating a transistor.
Figure 28B:
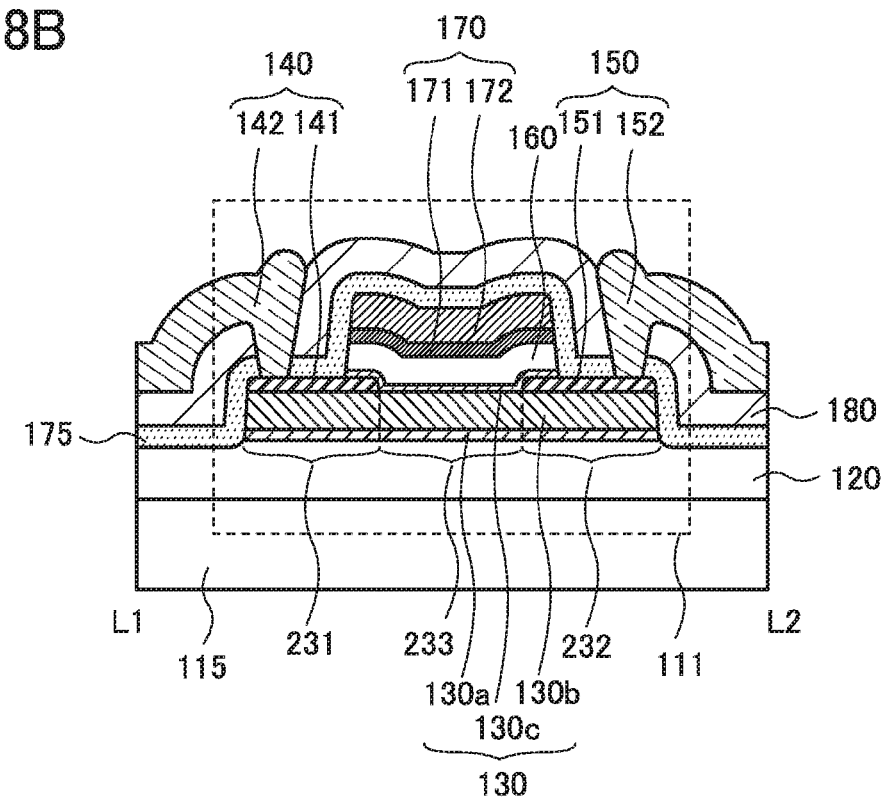

Furthermore, the transistor of one embodiment of the present invention may have a structure illustrated in FIGS. 28(A) and (B). FIG. 28(A) is a top view of a transistor 111. A cross section in the direction of a dashed-dotted line L1-L2 in FIG. 28(A) corresponds to FIG. 28(B). Moreover, a cross section in the direction of a dashed-dotted line L3-L4 in FIG. 28(A) corresponds to FIG. 30(A). In some cases, the direction of the dashed-dotted line L1-L2 is referred to as a channel length direction, and the direction of the dashed-dotted line L3-L4 is referred to as a channel width direction.

The transistor 111 includes the insulating layer 120 in contact with the substrate 115; a stack of the oxide semiconductor layer 130a and the oxide semiconductor layer 130b, in contact with the insulating layer 120; the conductive layer 141 and the conductive layer 151 electrically connected to the stack; the oxide semiconductor layer 130c in contact with the stack, the conductive layer 141, and the conductive layer 151; the insulating layer 160 in contact with the oxide semiconductor layer 130c; the conductive layer 170 in contact with the insulating layer 160; the insulating layer 175 in contact with the stack, the conductive layer 141, the conductive layer 151, the oxide semiconductor layer 130c, the insulating layer 160, and the conductive layer 170; the insulating layer 180 in contact with the insulating layer 175; and the conductive layer 142 and the conductive layer 152 electrically connected to the conductive layer 141 and the conductive layer 151, respectively, through openings provided in the insulating layer 175 and the insulating layer 180. In addition, an insulating layer (planarization film) or the like in contact with the insulating layer 180, the conductive layer 142, and the conductive layer 152 may be included as necessary.

The transistor 111 has the same structure as the transistor 105 except that the oxide semiconductor layer 130 includes two layers (the oxide semiconductor layer 130a and the oxide semiconductor layer 130b) in the region 231 and the region 232, that the oxide semiconductor layer 130 includes three layers (the oxide semiconductor layer 130a, the oxide semiconductor layer 130b, and the oxide semiconductor layer 130c) in the region 233, and that part of the oxide semiconductor layer (the oxide semiconductor layer 130c) exists between the insulating layer 160 and the conductive layers 141 and 151.

Figure 29A:
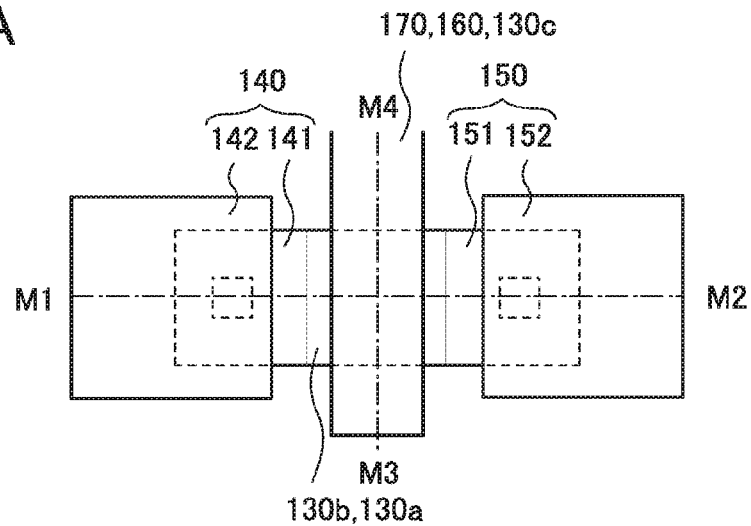
FIG. 29 A top view and a cross-sectional view illustrating a transistor.
Figure 29B:
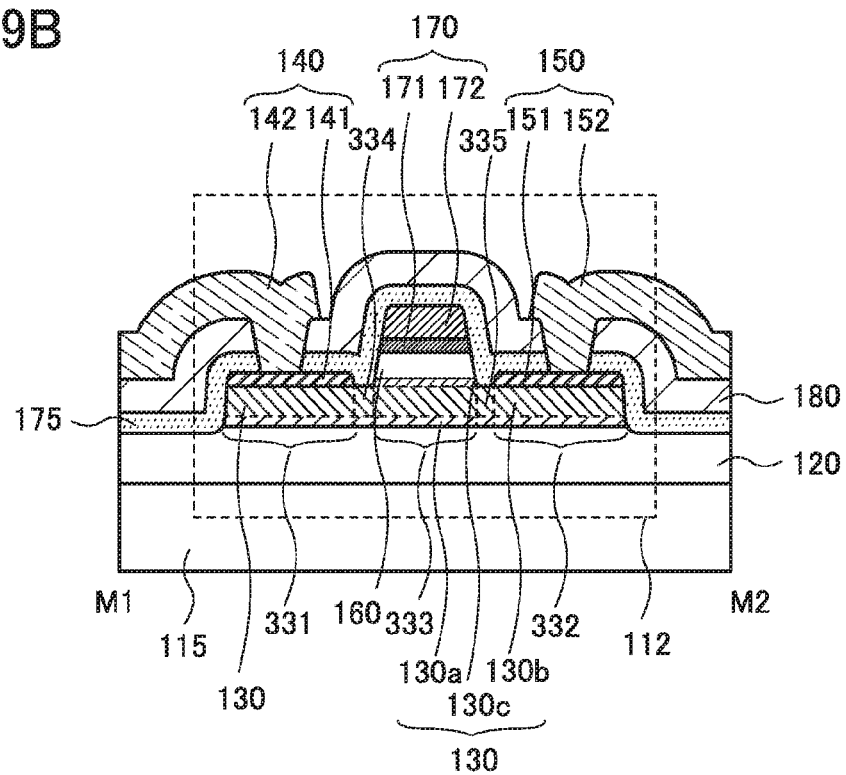

Furthermore, the transistor of one embodiment of the present invention may have a structure illustrated in FIGS. 29(A) and (B). FIG. 29(A) is a top view of a transistor 112. A cross section in the direction of a dashed-dotted line M1-M2 in FIG. 29(A) corresponds to FIG. 29(B). Moreover, a cross section in the direction of a dashed-dotted line M3-M4 in FIG. 29(A) corresponds to FIG. 30(A). In some cases, the direction of the dashed-dotted line M1-M2 is referred to as a channel length direction, and the direction of the dashed-dotted line M3-M4 is referred to as a channel width direction.

The transistor 112 has the same structure as the transistor 106 except that the oxide semiconductor layer 130 includes two layers (the oxide semiconductor layer 130a and the oxide semiconductor layer 130b) in the region 331, the region 332, the region 334, and the region 335 and that the oxide semiconductor layer 130 includes three layers (the oxide semiconductor layer 130a, the oxide semiconductor layer 130b, and the oxide semiconductor layer 130c) in the region 333.

Figure 30C:
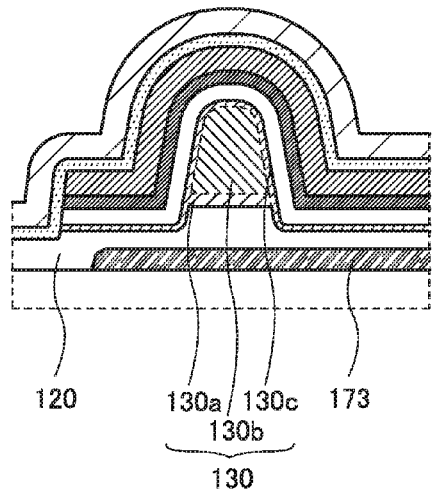
Figure 30D:
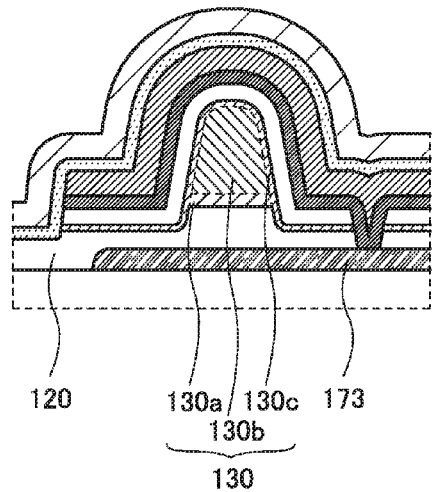

Furthermore, the transistor of one embodiment of the present invention may include the conductive layer 173 between the oxide semiconductor layer 130 and the substrate 115 as illustrated in the cross-sectional views in the channel length direction in FIGS. 31(A), (B), (C), (D), (E), and (F) and the cross-sectional views in the channel width direction in FIGS. 30(C) and (D). When the conductive layer is used as a second gate electrode layer (back gate), the on-state current can be increased or the threshold voltage can be controlled. Note that in the cross-sectional views in FIGS. FIGS. 31(A), (B), (C), (D), (E), and (F), the width of the conductive layer 173 may be shorter than that of the oxide semiconductor layer 130. Moreover, the width of the conductive layer 173 may be shorter than that of the conductive layer 170.

Figure 32A:
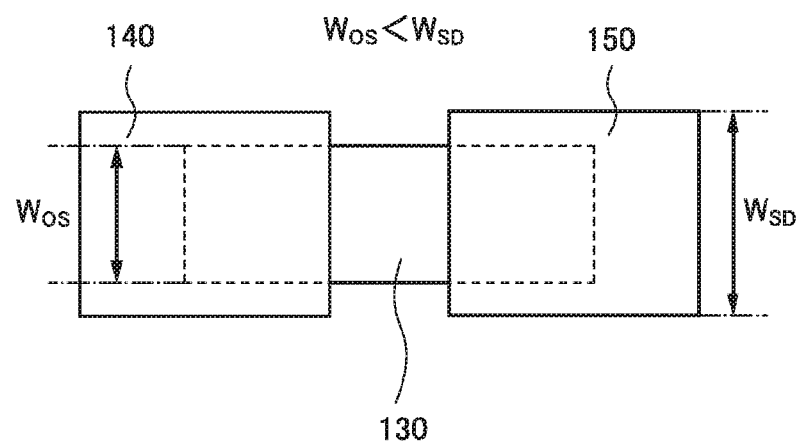
FIG. 32 Top views illustrating a transistor.
Figure 32B:
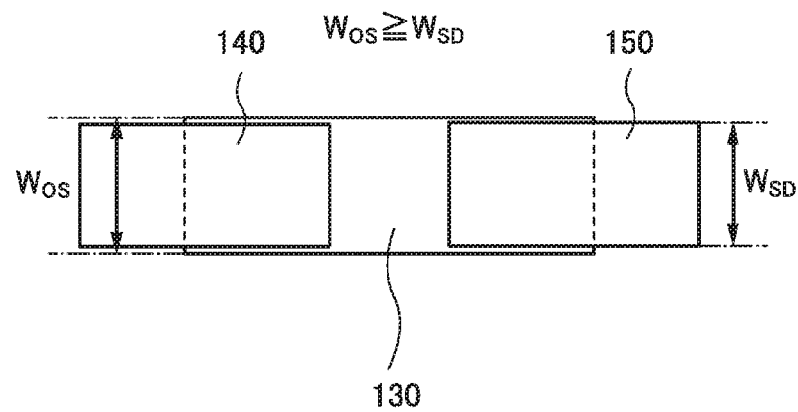

Furthermore, as for the conductive layer 140 (source electrode layer) and the conductive layer 150 (drain electrode layer) in the transistor of one embodiment of the present invention, as shown in the top views in FIGS. 32(A) and (B) (showing only the oxide semiconductor layer 130, the conductive layer 140, and the conductive layer 150), the width ($W_{SD}$) of the conductive layer 140 and the conductive layer 150 may formed to be either longer or shorter than the width ($W_{OS}$) of the oxide semiconductor layer. When $W_{OS} \geq W_{SD}$ ($W_{SD}$ is less than or equal to $W_{OS}$) is satisfied, a gate electric field is easily applied to the entire oxide semiconductor layer 130, so that electrical characteristics of the transistor can be improved.

In the transistor of one embodiment of the present invention (any of the transistor 101 to the transistor 109), in any of the structures, the conductive layer 170 functioning as a gate electrode layer electrically surrounds the oxide semiconductor layer 130 in the channel width direction with the insulating layer 160 functioning as a gate insulating film positioned therebetween, and thus the on-state current is increased. Such a transistor structure is referred to as a surrounded channel (s-channel) structure.

In the transistor including the oxide semiconductor layer 130b and the oxide semiconductor layer 130c and the transistor including the oxide semiconductor layer 130a, the oxide semiconductor layer 130b, and the oxide semiconductor layer 130c, selecting appropriate materials for the two or three layers forming the oxide semiconductor layer 130 allows current to flow in the oxide semiconductor layer 130b. Since current flows in the oxide semiconductor layer 130b, there is little influence by interface scattering, leading to a high on-state current. Note that increasing the thickness of the oxide semiconductor layer 130b can increase the on-state current. The thickness of the oxide semiconductor layer 130b may be, for example, 100 nm to 200 nm.

A semiconductor device using a transistor with any of the above structures can have favorable electrical characteristics.

Note that in this specification, the channel length refers to, for example, a distance between a source (a source region or a source electrode) and a drain (a drain region or a drain electrode) in a region where a semiconductor (or a portion where a current flows in a semiconductor when a transistor is in an on state) and a gate electrode overlap with each other or a region where a channel is formed in a top view of the transistor. Note that in one transistor, channel lengths in all regions do not necessarily have the same value. In other words, the channel length of one transistor is not limited to one value in some cases. Therefore, in this specification, the channel length is any one of values, the maximum value, the minimum value, or the average value in a region where a channel is formed.

Furthermore, the channel width refers to, for example, the length of a portion where a source and a drain face each other in a region where a semiconductor (or a portion where a current flows in a semiconductor when a transistor is in an on state) and a gate electrode overlap with each other, or a region where a channel is formed. Note that in one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in the case of a transistor having a gate electrode covering a side surface of a semiconductor, an effective channel width is greater than an apparent channel width, and its influence cannot be ignored in some cases. For example, in a miniaturized transistor having a gate electrode covering a side surface of a semiconductor, the proportion of a channel region formed in a side surface of a semiconductor is higher than the proportion of a channel region formed in a top surface of a semiconductor in some cases. In that case, an effective channel width is greater than an apparent channel width.

In such a case, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, an apparent channel width is referred to as a "surrounded channel width (SCW: Surrounded Channel Width)" in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by analyzing a cross-sectional TEM image and the like.

Note that in the case where field-effect mobility, a current value per channel width, and the like of a transistor are obtained by calculation, a surrounded channel width may be used for the calculation. In that case, a value different from one in the case where an effective channel width is used for the calculation is obtained in some cases.

The structure described in this embodiment can be used in appropriate combination with any of the structures described in the other embodiments.

Embodiment 4

In this embodiment, components of the transistors described in Embodiment 5 are described in detail.

The substrate 115 includes a silicon substrate provided with a transistor and/or a photodiode; and an insulating layer, a wiring, a conductor functioning as a contact plug, and the like that are provided over the silicon substrate. Note that in the case where p-channel transistors are formed using the silicon substrate, a silicon substrate with n⁻-type conductivity is preferably used. Alternatively, it is also possible to use an SOI substrate including an n⁻-type or i-type silicon layer. Furthermore, a surface of the silicon substrate where the transistor is formed preferably has a (110) plane orientation. Forming a p-channel transistor with the (110) plane can increase mobility.

The insulating layer 120 can have a function of supplying oxygen to the oxide semiconductor layer 130 as well as a function of preventing diffusion of impurities from a component included in the substrate 115. Therefore, the insulating layer 120 is preferably an insulating film containing oxygen and is further preferably an insulating film containing oxygen in which the oxygen content is higher than that in the stoichiometric composition. For example, a film in which the amount of released oxygen when converted into oxygen atoms is $1.0 \times 10^{19}$ atoms/cm³ or more in a TDS method performed in heat treatment in which the film surface temperature is higher than or equal to 100° C. and lower than or equal to 700° C., preferably higher than or equal to 100° C. and lower than or equal to 500° C. is given. Furthermore, the insulating layer 120 has a function as an interlayer insulating film and may be subjected to planarization treatment such as CMP (chemical mechanical polishing) treatment so as to have a flat surface.

For example, for the insulating layer 120, an oxide insulating film including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like, a nitride insulating film including silicon nitride, silicon nitride oxide, aluminum nitride, aluminum nitride oxide, or the like, or a mixed material of any of these can be used. Furthermore, a stack of any of the above materials may also be used.

Note that in this embodiment, detailed description is given mainly on the case where the oxide semiconductor layer 130 of the transistor has a three-layer structure in which the oxide semiconductor layer 130a, the oxide semiconductor layer 130b, and the oxide semiconductor layer 130c are stacked in this order from the insulating layer 120 side.

Note that in the case where the oxide semiconductor layer 130 is a single layer, a layer corresponding to the oxide semiconductor layer 130b and described in this embodiment may be used.

In the case where the oxide semiconductor layer 130 includes two layers, a stack in which a layer corresponding to the oxide semiconductor layer 130b and a layer corresponding to the oxide semiconductor layer 130c described in this embodiment are stacked in this order from the insulating layer 120 side may be used. In the case of this structure, the oxide semiconductor layer 130b and the oxide semiconductor layer 130c can be replaced with each other.

Furthermore, in the case where the oxide semiconductor layer 130 includes four or more layers, for example, a structure in which another oxide semiconductor layer is stacked over the three-layer stack of the oxide semiconductor layer 130 described in this embodiment can be employed.

For the oxide semiconductor layer 130b, for example, an oxide semiconductor whose electron affinity (an energy difference between a vacuum level and the conduction band minimum) is higher than those of the oxide semiconductor layer 130a and the oxide semiconductor layer 130c is used. The electron affinity can be obtained as a value obtained by subtracting an energy difference between the conduction band minimum and the valence band maximum (an energy gap) from an energy difference between the vacuum level and the valence band maximum (an ionization potential).

The oxide semiconductor layer 130a and the oxide semiconductor layer 130c each contain one or more kinds of metal elements contained in the oxide semiconductor layer 130b, and for example, are preferably formed using an oxide semiconductor whose conduction band minimum is closer to a vacuum level than that of the oxide semiconductor layer 130b by any of 0.05 eV or more, 0.07 eV or more, 0.1 eV or more, and 0.15 eV or more and any of 2 eV or less, 1 eV or less, 0.5 eV or less, and 0.4 eV or less.

In such a structure, when an electric field is applied to the conductive layer 170, a channel is formed in the oxide semiconductor layer 130b whose conduction band minimum is the lowest in the oxide semiconductor layer 130.

Further, since the oxide semiconductor layer 130a contains one or more kinds of metal elements contained in the oxide semiconductor layer 130b, an interface state is unlikely to be formed at the interface between the oxide semiconductor layer 130b and the oxide semiconductor layer 130a, compared with the interface in the case where the oxide semiconductor layer 130b is in contact with the insulating layer 120. The interface state sometimes forms a channel; therefore, the threshold voltage of the transistor is changed in some cases. Thus, by provision of the oxide semiconductor layer 130a, fluctuations in electrical characteristics of the transistor, such as a threshold voltage, can be reduced. Furthermore, the reliability of the transistor can be improved.

Furthermore, since the oxide semiconductor layer 130c contains one or more kinds of metal elements contained in the oxide semiconductor layer 130b, scattering of carriers is unlikely to occur at the interface between the oxide semiconductor layer 130b and the oxide semiconductor layer 130c, compared with the interface in the case where the oxide semiconductor layer 130b is in contact with the gate insulating film (the insulating layer 160). Thus, by provision of the oxide semiconductor layer 130c, the field-effect mobility of the transistor can be increased.

For the oxide semiconductor layer 130a and the oxide semiconductor layer 130c, for example, a material containing Al, Ti, Ga, Ge, Y, Zr, Sn, La, Ce, or Hf with a higher atomic ratio than that used for the oxide semiconductor layer 130b can be used. Specifically, the atomic ratio is 1.5 times or more, preferably 2 times or more, further preferably 3 times or more. Any of the above elements is strongly bonded to oxygen and thus has a function of suppressing generation of an oxygen vacancy in the oxide semiconductor layers. That is, it can be said that an oxygen vacancy is less likely to be generated in the oxide semiconductor layer 130a and the oxide semiconductor layer 130c than in the oxide semiconductor layer 130b.

Furthermore, an oxide semiconductor that can be used for each of the oxide semiconductor layer 130a, the oxide semiconductor layer 130b, and the oxide semiconductor layer 130c preferably contains at least In or Zn. Alternatively, both In and Zn are preferably contained. Moreover, in order to reduce fluctuations in electrical characteristics of the transistor including the oxide semiconductor, a stabilizer is preferably contained in addition to them.

As a stabilizer, Ga, Sn, Hf, Al, Zr, and the like can be given. Furthermore, as another stabilizer, lanthanoid such as La, Ce, Pr, Nd, Sm, Eu, Gd, Tb, Dy, Ho, Er, Tm, Yb, or Lu can be given.

As the oxide semiconductor, for example, indium oxide, tin oxide, gallium oxide, zinc oxide, an In—Zn oxide, a Sn—Zn oxide, an Al—Zn oxide, a Zn—Mg oxide, a Sn—

Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide can be used.

Note that here, for example, "In—Ga—Zn oxide" means an oxide containing In, Ga, and Zn as its main components. Furthermore, another metal element in addition to In, Ga, and Zn may be contained. Moreover, in this specification, a film containing the In—Ga—Zn oxide is also referred to as an IGZO film.

Furthermore, a material represented by $InMO_3(ZnO)_m$ (m>0 and m is not an integer) may be used. Note that M represents one or more metal elements selected from Ga, Y, Zr, La, Ce, and Nd. Alternatively, a material represented by $In_2SnO_5(ZnO)_n$ (n>0 and n is an integer) may be used.

Note that when each of the oxide semiconductor layer 130a, the oxide semiconductor layer 130b, and the oxide semiconductor layer 130c is an In-M-Zn oxide containing at least indium, zinc, and M (a metal such as Al, Ti, Ga, Ge, Y, Zr, Sn, La, Ce, or Hf), and when the oxide semiconductor layer 130a has an atomic ratio of In to M and Zn which is $x_1:y_1:z_1$, the oxide semiconductor layer 130b has an atomic ratio of In to M and Zn which is $x_2:y_2:z_2$, and the oxide semiconductor layer 130c has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably 2 times or more, further preferably 3 times or more as large as $y_2/x_2$. At this time, when $y_2$ is greater than or equal to $x_2$ in the oxide semiconductor layer 130b, the transistor can have stable electrical characteristics. However, when $y_2$ is 3 times or more as large as $x_2$, the field-effect mobility of the transistor is reduced; accordingly, $y_2$ is preferably smaller than 3 times $x_2$.

In the case where Zn and O are not taken into consideration, the proportion of In and the proportion of M in each of the oxide semiconductor layer 130a and the oxide semiconductor layer 130c are preferably less than 50 atomic % and greater than or equal to 50 atomic %, respectively, further preferably less than 25 atomic % and greater than or equal to 75 atomic %, respectively. Furthermore, in the case where Zn and O are not taken into consideration, the proportion of In and the proportion of M in the oxide semiconductor layer 130b are preferably greater than or equal to 25 atomic % and less than 75 atomic %, respectively, further preferably greater than or equal to 34 atomic % and less than 66 atomic %, respectively.

Furthermore, the indium content in the oxide semiconductor layer 130b is preferably higher than those in the oxide semiconductor layer 130a and the oxide semiconductor layer 130c. In an oxide semiconductor, the s orbital of heavy metal mainly contributes to carrier transfer, and when the proportion of In is increased, overlap of the s orbitals is likely to be increased. Therefore, an oxide in which the proportion of In is higher than that of M has higher mobility than an oxide in which the proportion of In is equal to or lower than that of M. Thus, with the use of an oxide having a high content of indium for the oxide semiconductor layer 130b, a transistor having high field-effect mobility can be obtained.

The thickness of the oxide semiconductor layer 130a is greater than or equal to 3 nm and less than or equal to 100 nm, preferably greater than or equal to 5 nm and less than or equal to 50 nm, further preferably greater than or equal to 5 nm and less than or equal to 25 nm. Furthermore, the thickness of the oxide semiconductor layer 130b is greater than or equal to 3 nm and less than or equal to 200 nm, preferably greater than or equal to 10 nm and less than or equal to 150 nm, further preferably greater than or equal to 15 nm and less than or equal to 100 nm. Moreover, the thickness of the oxide semiconductor layer 130c is greater than or equal to 1 nm and less than or equal to 50 nm, preferably greater than or equal to 2 nm and less than or equal to 30 nm, further preferably greater than or equal to 3 nm and less than or equal to 15 nm. In addition, the oxide semiconductor layer 130b is preferably thicker than the oxide semiconductor layer 130a and the oxide semiconductor layer 130c.

Note that in order that a transistor in which an oxide semiconductor layer serves as a channel have stable electrical characteristics, it is effective to reduce the concentration of impurities in the oxide semiconductor layer to make the oxide semiconductor layer intrinsic (i-type) or substantially intrinsic. Here, the term "substantially intrinsic" refers to the state where an oxide semiconductor layer has a carrier density lower than $1 \times 10^{17}/cm^3$, lower than $1 \times 10^{15}/cm^3$, or lower than $1 \times 10^{13}/cm^3$.

Furthermore, in the oxide semiconductor layer, hydrogen, nitrogen, carbon, silicon, and a metal element other than main components are impurities. For example, hydrogen and nitrogen contribute to formation of donor levels to increase the carrier density. In addition, silicon in the oxide semiconductor layer contributes to formation of an impurity level. The impurity level serves as a trap and might cause deterioration of electrical characteristics of the transistor. Accordingly, in the layers of the oxide semiconductor layer 130a, the oxide semiconductor layer 130b, and the oxide semiconductor layer 130c and at each interface, the impurity concentration is preferably reduced.

In order to make the oxide semiconductor layer intrinsic or substantially intrinsic, the oxide semiconductor layer is controlled to have a region in which the concentration of silicon estimated by SIMS (secondary ion mass spectrometry) is lower than $1 \times 10^{19}$ atoms/cm$^3$, preferably lower than $5 \times 10^{18}$ atoms/cm$^3$, further preferably lower than $1 \times 10^{18}$ atoms/cm$^3$. Control is performed such that a region in which the concentration of hydrogen is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, and still further preferably lower than or equal to $5 \times 10^{18}$ atoms/cm$^3$ is included. Furthermore, the concentration of nitrogen at a certain depth of the oxide semiconductor layer or in a region of the oxide semiconductor layer is lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, and still further preferably lower than or equal to $5 \times 10^{17}$ atoms/cm$^3$.

When silicon and carbon are contained at a high concentration, the crystallinity of the oxide semiconductor layer is lowered in some cases. In order not to lower the crystallinity of the oxide semiconductor layer, for example, control is performed to have a region in which the concentration of silicon is lower than $1 \times 10^{19}$ atoms/cm$^3$, preferably lower than $5 \times 10^{18}$ atoms/cm$^3$, further preferably lower than $1\times10^{18}$ atoms/cm³. Furthermore, control is performed to have a region in which the concentration of carbon is lower than $1\times10^{19}$ atoms/cm³, preferably lower than $5\times10^{18}$ atoms/cm³, and further preferably lower than $1\times10^{18}$ atoms/cm³.

Furthermore, a transistor in which a highly purified oxide semiconductor film is used for a channel formation region as described above has an extremely low off-state current. For example, in the case where the voltage between the source and the drain is set to approximately 0.1 V, 5 V, or 10 V, the off-state current per the channel width of the transistor can be as low as several yA/μm to several zA/μm.

Note that as the gate insulating film of the transistor, an insulating film containing silicon is used in many cases; thus, it can be said that it is preferable that, as in the transistor of one embodiment of the present invention, a region of the oxide semiconductor layer, which serves as a channel, not be in contact with the gate insulating film for the above-described reason. Furthermore, in the case where a channel is formed at the interface between the gate insulating film and the oxide semiconductor layer, scattering of carriers occurs at the interface, whereby the field-effect mobility of the transistor is reduced. Also from such a point of view, it can be said that it is preferable that the region of the oxide semiconductor layer, which serves as a channel, be separated from the gate insulating film.

Accordingly, with the oxide semiconductor layer 130 having a stacked-layer structure including the oxide semiconductor layer 130a, the oxide semiconductor layer 130b, and the oxide semiconductor layer 130c, a channel can be formed in the oxide semiconductor layer 130b; thus, a transistor having a high field-effect mobility and stable electrical characteristics can be formed.

In a band structure, the conduction band minimums of the oxide semiconductor layer 130a, the oxide semiconductor layer 130b, and the oxide semiconductor layer 130c are changed continuously. This can be understood also from the fact that the compositions of the oxide semiconductor layer 130a, the oxide semiconductor layer 130b, and the oxide semiconductor layer 130c are close to one another and oxygen is easily diffused mutually. Thus, it can be said that the oxide semiconductor layer 130a, the oxide semiconductor layer 130b, and the oxide semiconductor layer 130c is a stack of layers having different compositions but physically continuous, and each interface of the stack is indicated by a dotted line.

The oxide semiconductor layer 130 in which layers containing the same main components are stacked is formed to have not only a simple layered structure of the respective layers but also continuous junction (here, in particular, a well structure having a U shape in which the conduction band minimum is continuously changed between the respective layers (U-shape well)). In other words, the stacked-layer structure is formed such that there exists no impurity that forms a defect level such as a trap center or a recombination center at each interface. If impurities exist between the layers of the stacked oxide semiconductor layers, the continuity of the energy band is lost and carriers disappear by a trap or recombination at the interface.

For example, an In—Ga—Zn oxide or the like with In:Ga:Zn=1:3:2, 1:3:3, 1:3:4, 1:3:6, 1:4:5, 1:6:4, 1:9:6 (atomic ratio) or the like can be used for the oxide semiconductor layer 130a and the oxide semiconductor layer 130c, and an In—Ga—Zn oxide with In:Ga:Zn=1:1:1, 2:1:3, 5:5:6, or 3:1:2 (atomic ratio) can be used for the oxide semiconductor layer 130b. Note that each of the atomic ratios in the oxide semiconductor layer 130a, the oxide semiconductor layer 130b, and the oxide semiconductor layer 130c includes a variation within ±20% of the above atomic ratio as an error.

The oxide semiconductor layer 130b of the oxide semiconductor layer 130 serves as a well (well), so that a channel is formed in the oxide semiconductor layer 130b. Note that since the conduction band minimums are changed continuously, the oxide semiconductor layer 130 can also be referred to as a U-shaped well. Furthermore, a channel formed to have such a structure can also be referred to as a buried channel.

Furthermore, trap levels due to impurities or defects might be formed in the vicinity of the interface between an insulating layer such as a silicon oxide film and each of the oxide semiconductor layer 130a and the oxide semiconductor layer 130c. The oxide semiconductor layer 130b can be distanced away from the trap levels owing to existence of the oxide semiconductor layer 130a and the oxide semiconductor layer 130c.

However, when the energy differences between the conduction band minimum of the oxide semiconductor layer 130b and the conduction band minimum of each of the oxide semiconductor layer 130a and the oxide semiconductor layer 130c are small, an electron in the oxide semiconductor layer 130b might reach the trap level by passing over the energy differences. When the electron is trapped in the trap level, a negative charge is generated at the interface with the insulating layer, whereby the threshold voltage of the transistor is shifted in the positive direction.

The oxide semiconductor layer 130a, the oxide semiconductor layer 130b, and the oxide semiconductor layer 130c preferably include crystal parts. In particular, when crystals with c-axis alignment are used, the transistor can have stable electrical characteristics. Moreover, crystals with c-axis alignment are resistant to bending; therefore, the reliability of a semiconductor device using a flexible substrate can be improved.

As the conductive layer 140 functioning as a source electrode layer and the conductive layer 150 functioning as a drain electrode layer, for example, a single layer or a stacked layer formed using a material selected from Al, Cr, Cu, Ta, Ti, Mo, W, Ni, Mn, Nd, and Sc and alloys of any of these metal materials can be used. Typically, it is preferable to use Ti, which is particularly easily bonded to oxygen, or W, which has a high melting point and thus allows subsequent process temperatures to be relatively high. It is also possible to use a stack of any of the above materials and Cu or an alloy such as Cu—Mn, which has low resistance. Note that in the transistor 105, the transistor 106, the transistor 111, and the transistor 112, for example, it is possible to use W for the conductive layer 141 and the conductive layer 151 and use a stack of Ti and Al for the conductive layer 142 and the conductive layer 152.

The above materials have a property of extracting oxygen from an oxide semiconductor film. Therefore, in a region of the oxide semiconductor layer that is in contact with any of the above materials, oxygen is released from the oxide semiconductor layer and an oxygen vacancy is formed. Hydrogen slightly contained in the layer and the oxygen vacancy are bonded to each other, whereby the region is changed to n-type. Accordingly, the region changed to n-type can serve as a source or a drain of the transistor.

For the insulating layer 160 functioning as a gate insulating film, an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide can be used. Furthermore, the insulating layer 160 may be a stack including any of the above materials. Note that the insulating layer 160 may contain La, nitrogen, Zr, or the like as an impurity.

Furthermore, an example of a stacked-layer structure of the insulating layer 160 will be described. The insulating layer 160 includes, for example, oxygen, nitrogen, silicon, hafnium, or the like. Specifically, hafnium oxide and silicon oxide or silicon oxynitride are preferably included.

Hafnium oxide and aluminum oxide have higher dielectric constant than silicon oxide and silicon oxynitride. Therefore, the thickness can be made large as compared with the case where silicon oxide is used; thus, leakage current due to tunnel current can be low. That is, it is possible to obtain a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. As examples of the crystalline structure, a monoclinic crystal structure, a cubic crystal structure, and the like can be given. Note that one embodiment of the present invention is not limited to these.

Furthermore, the insulating layer 120 and the insulating layer 160 in contact with the oxide semiconductor layer 130 may include a region with a low density of states of nitrogen oxide. As the oxide insulating layer with a low density of states of a nitrogen oxide, a silicon oxynitride film that releases less nitrogen oxide, an aluminum oxynitride film that releases less nitrogen oxide, or the like can be used.

Note that a silicon oxynitride film that releases less nitrogen oxide is a film of which the amount of released ammonia is larger than the amount of released nitrogen oxide in thermal desorption spectroscopy (TDS (Thermal Desorption Spectroscopy)); the amount of released ammonia is typically greater than or equal to $1 \times 10^{18}$ molecules/cm$^3$ and less than or equal to $5 \times 10^{19}$ molecules/cm$^3$. Note that the amount of released ammonia is the release amount by heat treatment with which the surface temperature of a film becomes higher than or equal to 50° C. and lower than or equal to 650° C., preferably higher than or equal to 50° C. and lower than or equal to 550° C.

By using the above oxide insulating layer for the insulating layer 120 and the insulating layer 160, a shift in the threshold voltage of the transistor can be reduced, which leads to reduced fluctuations in the electrical characteristics of the transistor.

For the conductive layer 170 functioning as a gate electrode layer, for example, a conductive film formed using Al, Ti, Cr, Co, Ni, Cu, Y, Zr, Mo, Ru, Ag, Mn, Nd, Sc, Ta, W, or the like can be used. It is also possible to use an alloy or a conductive nitride of any of the above materials. It is also possible to use a stack of a plurality of materials selected from the above materials, alloys of the above materials, and conductive nitrides of the above materials. Typically, tungsten, a stack of tungsten and titanium nitride, a stack of tungsten and tantalum nitride, or the like can be used. It is also possible to use Cu or an alloy such as Cu—Mn, which has low resistance, or a stack of any of the above materials and Cu or an alloy such as Cu—Mn. In this embodiment, tantalum nitride is used for the conductive layer 171 and tungsten is used for the conductive layer 172 to form the conductive layer 170.

As the insulating layer 175, a silicon nitride film, an aluminum nitride film, or the like containing hydrogen can be used. In the transistors 103, 104, 106, 109, 110, and 112 described in Embodiment 2, using an insulating film containing hydrogen as the insulating layer 175 allows the oxide semiconductor layer to be partly changed to n-type. In addition, a nitride insulating film functions as a blocking film against moisture and the like and can improve the reliability of the transistor.

Furthermore, an aluminum oxide film can also be used as the insulating layer 175. It is particularly preferable to use an aluminum oxide film as the insulating layer 175 in the transistor 101, the transistor 102, the transistor 105, the transistor 107, the transistor 108, and the transistor 111 described in Embodiment 2. The aluminum oxide film has a high blocking effect of preventing penetration of both oxygen and impurities such as hydrogen and moisture. Accordingly, during and after the manufacturing process of the transistor, the aluminum oxide film can suitably be used as a protective film that has effects of preventing entry of impurities such as hydrogen and moisture into the oxide semiconductor layer 130, preventing release of oxygen from the oxide semiconductor layer, and preventing unnecessary release of oxygen from the insulating layer 120. Furthermore, oxygen contained in the aluminum oxide film can be diffused into the oxide semiconductor layer.

Furthermore, the insulating layer 180 is preferably formed over the insulating layer 175. As the insulating layer, an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide can be used. Moreover, the insulating layer may be a stack of any of the above materials.

Here, like the insulating layer 120, the insulating layer 180 preferably contains oxygen more than that in the stoichiometric composition. Oxygen released from the insulating layer 180 can be diffused into the channel formation region in the oxide semiconductor layer 130 through the insulating layer 160, so that oxygen vacancies formed in the channel formation region can be filled with the oxygen. Accordingly, stable electrical characteristics of the transistor can be obtained.

High integration of a semiconductor device requires miniaturization of a transistor. However, it is known that miniaturization of a transistor causes deterioration of electrical characteristics of the transistor. In particular, a decrease in channel width causes a reduction in on-state current.

In the transistor 107 to the transistor 112 of embodiments of the present invention, the oxide semiconductor layer 130c is formed to cover the oxide semiconductor layer 130b where a channel is formed; thus, a structure in which a channel formation layer is not in contact with the gate insulating film is employed. Accordingly, scattering of carriers at the interface between the channel formation layer and the gate insulating film can be suppressed and the on-state current of the transistor can be increased.

Furthermore, in the transistor of one embodiment of the present invention, as described above, the gate electrode layer (the conductive layer 170) is formed to electrically surround the oxide semiconductor layer 130 in the channel width direction; accordingly, a gate electric field is applied to the oxide semiconductor layer 130 in a direction perpendicular to its side surface in addition to a direction perpendicular to its top surface. In other words, a gate electric field is applied to the entire channel formation layer and an effective channel width is increased, leading to a further increase in the on-state current.

Furthermore, in the transistor of one embodiment of the present invention in which the oxide semiconductor layer 130 includes two layers or three layers, since the oxide semiconductor layer 130b where a channel is formed is provided over the oxide semiconductor layer 130a, an effect of making an interface state less likely to be formed is obtained. Moreover, in the transistor of one embodiment of the present invention in which the oxide semiconductor layer 130 includes three layers, since the oxide semiconductor layer 130b is a layer positioned at the middle of the three-layer structure, an effect of eliminating the influence of an impurity that enters from above and below is obtained as well. Therefore, not only the increase in the on-state current of the above transistor but also stabilization of the threshold voltage and a reduction in the S value (subthreshold value) can be achieved. Thus, Icut (current when gate voltage VG is 0 V) can be reduced and power consumption can be reduced. Furthermore, since the threshold voltage of the transistor becomes stable, long-term reliability of the semiconductor device can be improved. In addition, it can be said that the transistor of one embodiment of the present invention is suitable for formation of a highly integrated semiconductor device because deterioration of electrical characteristics due to miniaturization is suppressed.

The structure described in this embodiment can be used in appropriate combination with any of the structures described in the other embodiments.

Embodiment 5

In this embodiment, methods for manufacturing the transistor 101 and the transistor 107 described in Embodiment 3 are described.

First, a method for manufacturing a silicon transistor included in the substrate 115 is described. An n⁻-type single crystal silicon substrate is used as a silicon substrate, and an element formation region isolated with an insulating layer (also referred to as a field oxide film) is formed in the surface. For formation of the element isolation region, a LOCOS (Local Oxidation of Silicon) method, an STI (Shallow Trench Isolation) method, or the like can be used.

Here, the substrate is not limited to the single crystal silicon substrate. An SOI (Silicon on Insulator) substrate or the like can be used as well.

Next, a gate insulating film is formed so as to cover the element formation region. For example, a silicon oxide film is formed by oxidation of a surface of the element formation region by heat treatment. Furthermore, after the silicon oxide film is formed, a surface of the silicon oxide film may be nitrided by nitriding treatment.

Next, a conductive film is formed so as to cover the gate insulating film. The conductive film can be formed using an element selected from Ta, W, Ti, Mo, Al, Cu, Cr, Nb, and the like, or an alloy material or a compound material containing any of these elements as a main component. Alternatively, formation with a metal nitride film obtained by nitridation of any of these elements is also possible. Alternatively, formation with a semiconductor material typified by polycrystalline silicon doped with an impurity element such as phosphorus is also possible.

Then, the conductive film is selectively etched, whereby a gate electrode layer is formed over the gate insulating film.

Next, an insulating film such as a silicon oxide film or a silicon nitride film is formed to cover the gate electrode layer and etch back is performed, whereby sidewalls are formed on side surfaces of the gate electrode layer.

Next, a resist mask is selectively formed so as to cover regions except the element formation region, and an impurity element is added with the use of the resist mask and the gate electrode layer as masks, whereby pt-type impurity regions are formed. Here, in order to form a p-ch transistor, an impurity element imparting p-type such as B or Ga can be used as the impurity element.

In the above manner, a p-ch transistor including an active region in the silicon substrate is completed. Note that a passivation film such as a silicon nitride film or an aluminum oxide film is preferably formed over the transistor.

Next, an interlayer insulating film is formed over the silicon substrate where the transistor is formed, and various contact plugs and various wirings are formed.

Subsequently, a method for manufacturing the transistor 102 is described with reference to FIG. 33 and FIG. 34. Note that a cross section of the transistor in the channel length direction is shown on the left side in the drawing, and a cross section in the channel width direction is shown on the right side. Furthermore, the drawings in the channel width direction are enlarged views; therefore, the apparent thickness of each component varies between the right and left drawings.

The case where the oxide semiconductor layer 130 has a three-layer structure of the oxide semiconductor layer 130a, the oxide semiconductor layer 130b, and the oxide semiconductor layer 130c is described as an example. In the case where the oxide semiconductor layer 130 has a two-layer structure, the oxide semiconductor layer 130a and the oxide semiconductor layer 130b are used. In the case where the oxide semiconductor layer 130 has a single-layer structure, one layer, the oxide semiconductor layer 130b is used.

First, the insulating layer 120 is formed over the substrate 115. The description of Embodiment 4 can be referred to for the kinds of the substrate 115 and a material used for the insulating layer 120. Note that the insulating layer 120 can be formed by a sputtering method, a CVD method, an MBE (Molecular Beam Epitaxy) method, or the like.

Furthermore, oxygen may be added to the insulating layer 120 by an ion implantation method, an ion doping method, a plasma immersion ion implantation method, a plasma treatment method, or the like. Adding oxygen enables the insulating layer 120 to supply oxygen more easily to the oxide semiconductor layer 130.

Note that in the case where a surface of the substrate 115 is made of an insulator and there is no influence of impurity diffusion to the oxide semiconductor layer 130 to be formed later, a structure in which the insulating layer 120 is not provided can be employed.

Figure 33A:
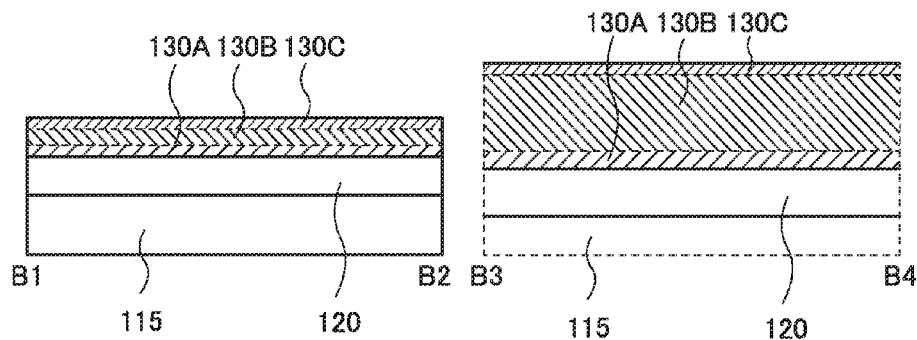
FIG. 33 Diagrams illustrating a method for manufacturing a transistor.

Next, an oxide semiconductor film 130A to be the oxide semiconductor layer 130a, an oxide semiconductor film 130B to be the oxide semiconductor layer 130b, and an oxide semiconductor film 130C to be the oxide semiconductor layer 130c are formed over the insulating layer 120 by a sputtering method, a CVD method, an MBE method, or the like (see FIG. 33(A)).

In the case where the oxide semiconductor layer 130 has a stacked-layer structure, oxide semiconductor films are preferably stacked successively without exposure to the air with the use of a multi-chamber deposition apparatus (e.g., a sputtering apparatus) including a load lock chamber. It is preferable that each chamber of the sputtering apparatus be able to be evacuated to a high vacuum (approximately $5\times10^{-7}$ Pa to $1\times10^{-4}$ Pa) by an adsorption vacuum evacuation pump such as a cryopump and that the chamber be able to heat a substrate to 100° C. or higher, preferably 500° C. or higher, so that water and the like acting as impurities of an oxide semiconductor are removed as much as possible. Alternatively, a combination of a turbo molecular pump and a cold trap is preferably used to prevent back-flow of a gas containing a carbon component, moisture, or the like from an exhaust system into the chamber. Alternatively, a combination of a turbo molecular pump and a cryopump may be used as an exhaust system.

Not only high vacuum evacuation of the chamber but also high purity of a sputtering gas is preferred to obtain a highly purified intrinsic oxide semiconductor. An oxygen gas or an argon gas used as a sputtering gas is highly purified to have a dew point of −40° C. or lower, preferably −80° C. or lower, further preferably −100° C. or lower, whereby entry of moisture or the like into the oxide semiconductor film can be prevented as much as possible.

For the oxide semiconductor film 130A, the oxide semiconductor film 130B, and the oxide semiconductor film 130C, any of the materials described in Embodiment 4 can be used. In the case where a sputtering method is used for deposition, formation can be performed using any of the materials described in Embodiment 4 as a target.

Note that as described in detail in Embodiment 4, a material that has an electron affinity higher than that of the oxide semiconductor film 130A and that of the oxide semiconductor film 130C is used for the oxide semiconductor film 130B.

Note that for formation of the oxide semiconductor films, a sputtering method is preferably used. As a sputtering method, an RF sputtering method, a DC sputtering method, an AC sputtering method, or the like can be used.

After the oxide semiconductor film 130C is formed, first heat treatment may be performed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate released oxygen. The first heat treatment can increase the crystallinity of the oxide semiconductor film 130A, the oxide semiconductor film 130B, and the oxide semiconductor film 130C and remove impurities such as water and hydrogen from the insulating layer 120, the oxide semiconductor film 130A, the oxide semiconductor film 130B, and the oxide semiconductor film 130C. Note that the first heat treatment may be performed after etching for forming the oxide semiconductor layer 130a, the oxide semiconductor layer 130b, and the oxide semiconductor layer 130c described later.

Next, a first conductive layer is formed over the oxide semiconductor film 130A. The first conductive layer can be, for example, formed by the following method.

First, the first conductive film is formed over the oxide semiconductor film 130A. As the first conductive film, a single layer or a stacked layer of a material selected from Al, Cr, Cu, Ta, Ti, Mo, W, Ni, Mn, Nd, and Sc and alloys of any of these metal materials can be used.

Next, a resist film is formed over the first conductive film and the resist film is exposed to light by a method such as electron beam exposure, liquid immersion exposure, or EUV exposure and development treatment is performed, so that a first resist mask is formed. Note that an organic coating film is preferably formed as an adherence agent between the first conductive film and the resist film. Alternatively, the first resist mask may be formed by nanoimprint lithography.

Then, the first conductive film is selectively etched using the first resist mask and the first resist mask is subjected to ashing; thus, the conductive layer is formed.

Figure 33B:
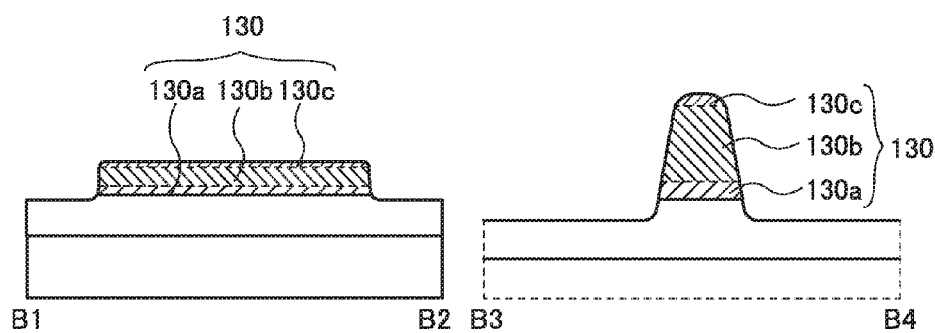
Figure 33C:
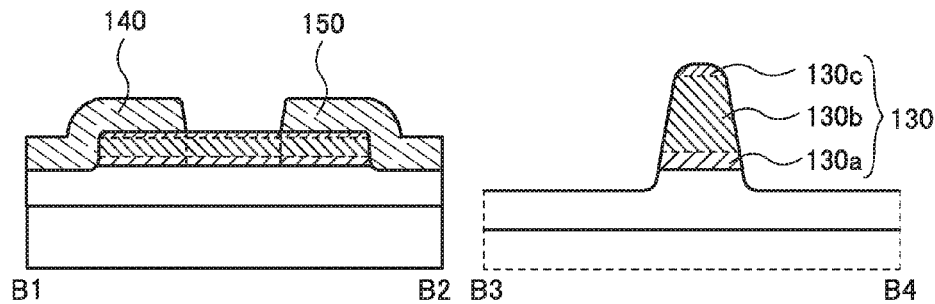

Next, the oxide semiconductor film 130A, the oxide semiconductor film 130B, and the oxide semiconductor film 130C are selectively etched using the conductive layer as a hard mask and the conductive layer is removed; thus, the oxide semiconductor layer 130 including a stack of the oxide semiconductor layer 130a, the oxide semiconductor layer 130b, and the oxide semiconductor layer 130c is formed (see FIG. 33(B)). Note that the oxide semiconductor layer 130 may be formed using the first resist mask, without forming the conductive layer. Here, oxygen ions may be implanted into the oxide semiconductor layer 130.

Next, a second conductive film is formed to cover the oxide semiconductor layer 130. The second conductive film can be formed using a material that can be used for the conductive layer 140 and the conductive layer 150 described in Embodiment 6. A sputtering method, a CVD method, an MBE method, or the like can be used for the formation of the second conductive film.

Then, a second resist mask is formed over portions to be a source region and a drain region. Then, part of the second conductive film is etched, whereby the conductive layer 140 and the conductive layer 150 are formed (see FIG. 33(C)).

Next, an insulating film 160A is formed over the oxide semiconductor layer 130, the conductive layer 140, and the conductive layer 150. The insulating film 160A can be formed using a material that can be used for the insulating layer 160 described in Embodiment 4. A sputtering method, a CVD method, an MBE method, or the like can be used for the formation of the insulating film 160A.

Next, second heat treatment may be performed. The second heat treatment can be performed in a condition similar to that of the first heat treatment. By the second heat treatment, oxygen implanted to the oxide semiconductor layer 130 can be diffused into the entire oxide semiconductor layer 130. Note that it is also possible to obtain the above effect by third heat treatment, without performing the second heat treatment.

Then, a third conductive film 171A and a fourth conductive film 172A to be the conductive layer 170 are formed over the insulating film 160A. The third conductive film 171A and the fourth conductive film 172A can be formed using materials that can be used for the conductive layer 171 and the conductive layer 172 described in Embodiment 4. A sputtering method, a CVD method, an MBE method, or the like can be used for the formation of the third conductive film 171A and the fourth conductive film 172A.

Figure 34A:
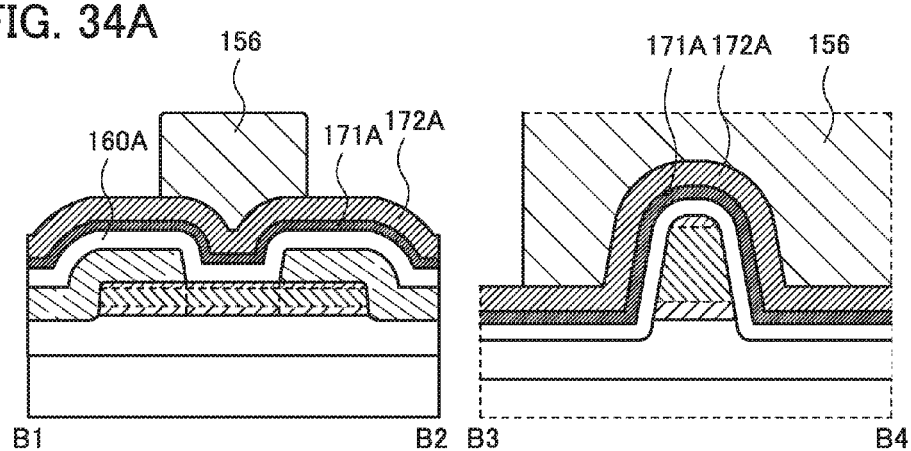
FIG. 34 Diagrams illustrating a method for manufacturing a transistor.
Figure 34B:
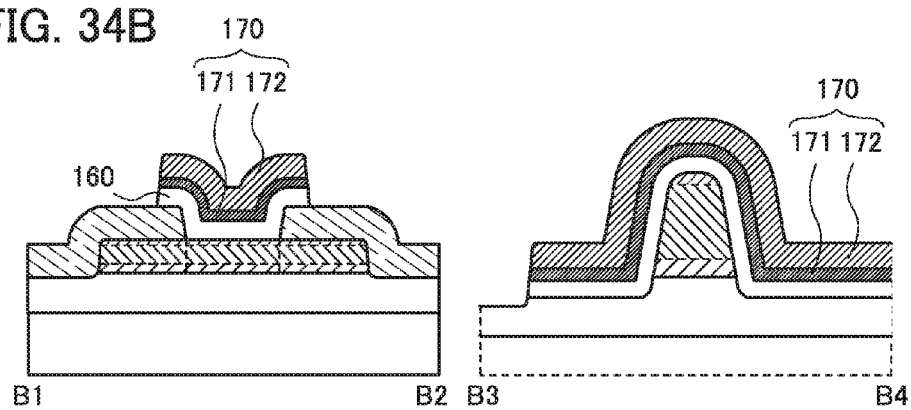

Next, a third resist mask 156 is formed over the fourth conductive film 172A (see FIG. 34(A)). Then, the third conductive film 171A, the fourth conductive film 172A, and the insulating film 160A are selectively etched using the third resist mask 156, whereby the conductive layer 170 including the conductive layer 171 and the conductive layer 172 and the insulating layer 160 are formed (see FIG. 34(B)). Note that if a structure in which the insulating film 160A is not etched is employed, the transistor 102 can be manufactured.

Next, the insulating layer 175 is formed over the oxide semiconductor layer 130, the conductive layer 140, the conductive layer 150, the insulating layer 160, and the conductive layer 170. The description of Embodiment 3 can be referred to for a material used for the insulating layer 175. In the case of the transistor 101, an aluminum oxide film is preferably used. The insulating layer 175 can be formed by a sputtering method, a CVD method, an MBE method, or the like.

Figure 34C:
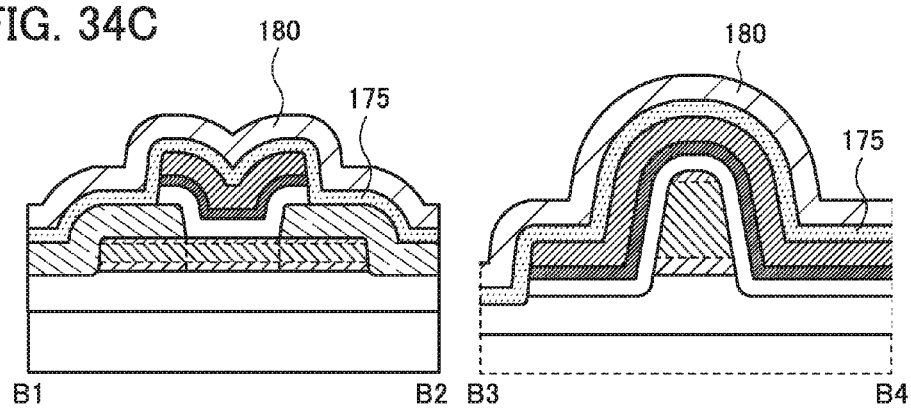

Next, the insulating layer 180 is formed over the insulating layer 175 (see FIG. 34(C)). The description of Embodiment 4 can be referred to for a material used for the insulating layer 180. Furthermore, the insulating layer 180 can be formed by a sputtering method, a CVD method, an MBE method, or the like.

Furthermore, Oxygen may be added to the insulating layer 175 and/or the insulating layer 180 by an ion implantation method, an ion doping method, a plasma immersion ion implantation method, a plasma treatment method, or the like. Adding oxygen enables the insulating layer 175 and/or the insulating layer 180 to supply oxygen more easily to the oxide semiconductor layer 130.

Next, third heat treatment may be performed. The third heat treatment can be performed in a condition similar to that of the first heat treatment. By the third heat treatment, excess oxygen is easily released from the insulating layer 120, the insulating layer 175, and the insulating layer 180, so that oxygen vacancies in the oxide semiconductor layer 130 can be reduced.

Next, a method for manufacturing the transistor 107 is described. Note that detailed description of steps similar to the method for manufacturing the transistor 101 described above is omitted.

Figure 35A:
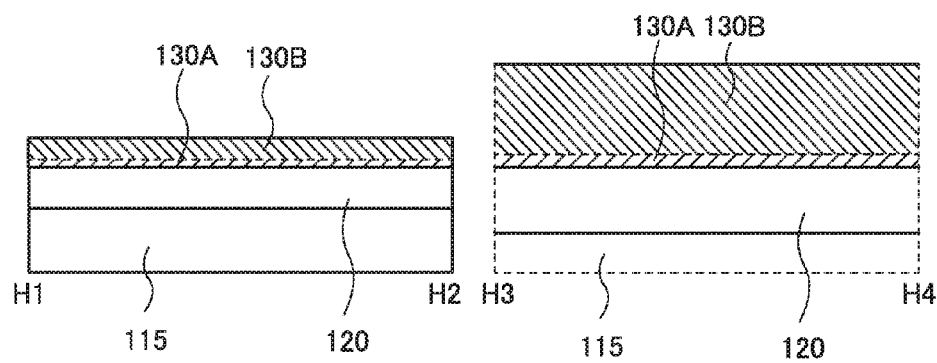
FIG. 35 Diagrams illustrating a method for manufacturing a transistor.

The insulating layer 120 is formed over the substrate 115, and the oxide semiconductor film 130A to be the oxide semiconductor layer 130a and the oxide semiconductor film 130B to be the oxide semiconductor layer 130b are formed over the insulating layer by a sputtering method, a CVD method, an MBE method, or the like (see FIG. 35(A)).

Figure 35B:
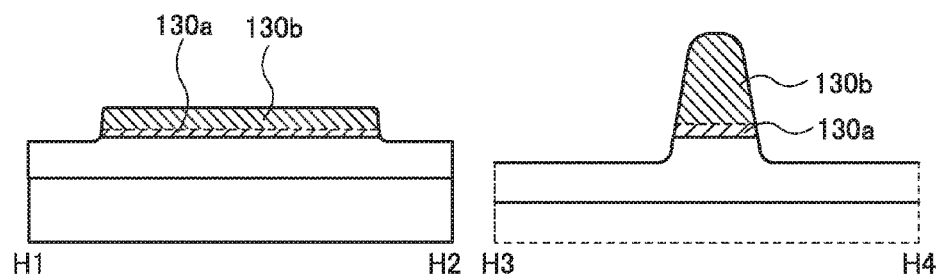

Next, a first conductive film is formed over the oxide semiconductor film 130B, and a conductive layer is formed using a first resist mask by a method similar to the above. Then, the oxide semiconductor film 130A and the oxide semiconductor film 130B are selectively etched using the conductive layer as a hard mask and the conductive layer is removed; thus, a stack of the oxide semiconductor layer 130a and the oxide semiconductor layer 130b is formed (see FIG. 35(B)). Note that the stack may be formed using the first resist mask, without forming the hard mask. Here, oxygen ions may be implanted into the oxide semiconductor layer 130a and the oxide semiconductor layer 130b.

Figure 35C:
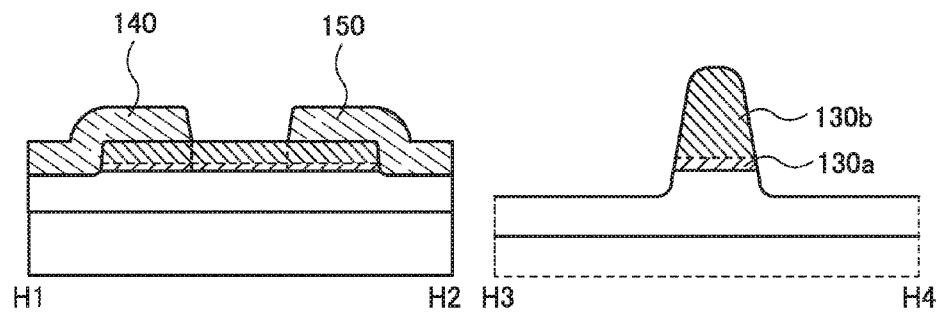

Next, a second conductive film is formed to cover the stack. Then, a second resist mask is formed over portions to be a source region and a drain region, and part of the second conductive film is etched using the second resist mask, whereby the conductive layer 140 and the conductive layer 150 are formed (see FIG. 35(C)).

Next, the oxide semiconductor film 130C to be the oxide semiconductor layer 130c is formed over the stack of the oxide semiconductor layer 130a and the oxide semiconductor layer 130b, the conductive layer 140, and the conductive layer 150. Furthermore, the insulating film 160A, the third conductive film 171A, and the fourth conductive film 172A are formed over the oxide semiconductor film 130C.

Figure 36A:
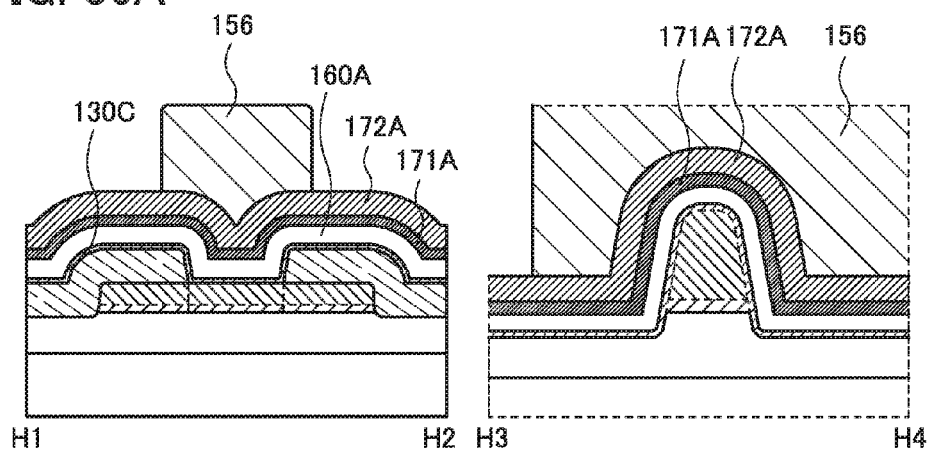
FIG. 36 Diagrams illustrating a method for manufacturing a transistor.
Figure 36B:
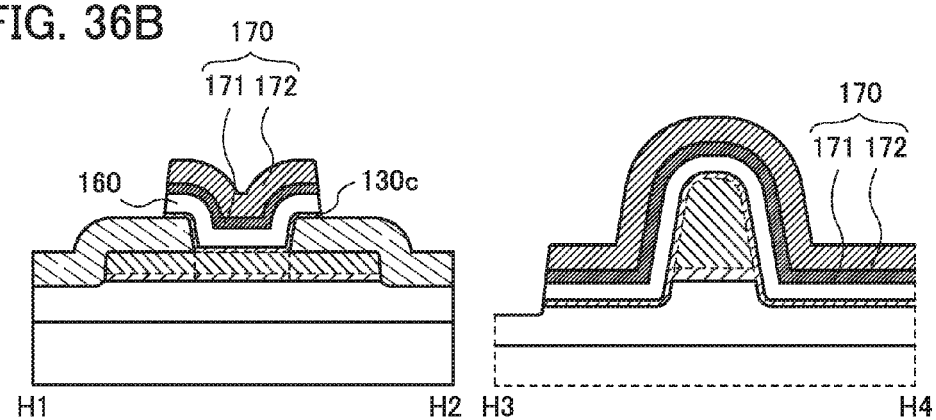

Next, the third resist mask 156 is formed over the fourth conductive film 172A (see FIG. 36(A)). Then, the third conductive film 171A, the fourth conductive film 172A, the insulating film 160A, and the oxide semiconductor film 130C are selectively etched using the resist mask, whereby the conductive layer 170 including the conductive layer 171 and the conductive layer 172, the insulating layer 160, and the oxide semiconductor layer 130c are formed (see FIG. 36(B)). Note that if the insulating film 160A and the oxide semiconductor film 130C are etched using a fourth resist mask, the transistor 108 can be manufactured.

Figure 36C:
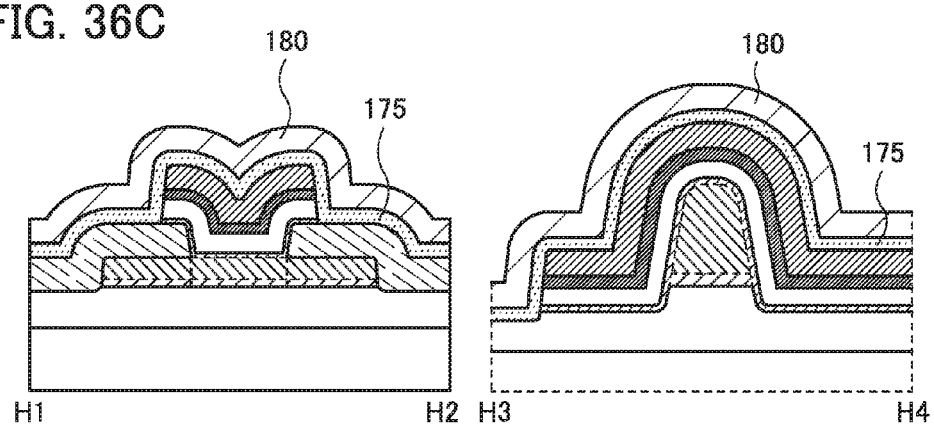

Next, the insulating layer 175 and the insulating layer 180 are formed over the insulating layer 120, the oxide semiconductor layer 130 (the oxide semiconductor layer 130a, the oxide semiconductor layer 130b, and the oxide semiconductor layer 130c), the conductive layer 140, the conductive layer 150, the insulating layer 160, and the conductive layer 170 (see FIG. 36(C)).

Through the above steps, the transistor 107 can be manufactured.

Next, a method for manufacturing the transistor 111 is described. Note that detailed description of steps similar to the method for manufacturing the transistor 102 described above is omitted.

The insulating layer 120 is formed over the substrate 115, and the oxide semiconductor film 130A to be the oxide semiconductor layer 130a and the oxide semiconductor film 130B to be the oxide semiconductor layer 130b are formed over the insulating layer by a sputtering method, a CVD method, an MBE method, or the like. Then, a first conductive film is formed over the oxide semiconductor film 130B, and a conductive layer 141a is formed using a first resist mask (see FIG. 37(A)).

Then, the oxide semiconductor film 130A and the oxide semiconductor film 130B are selectively etched using the conductive layer 141a as a hard mask, whereby a stack of the oxide semiconductor layer 130a, the oxide semiconductor layer 130b, and the conductive layer 141a is formed (see FIG. 37(B)). Here, oxygen ions may be implanted into the oxide semiconductor layer 130a and the oxide semiconductor layer 130b.

Then, a second resist mask is formed over portions to be a source region and a drain region, and part of the conductive layer 141a is etched using the second resist mask, whereby the conductive layer 141 and the conductive layer 151 are formed (see FIG. 37(C)).

Next, the oxide semiconductor film 130C to be the oxide semiconductor layer 130c is formed over the stack of the oxide semiconductor layer 130a and the oxide semiconductor layer 130b, the conductive layer 141, and the conductive layer 151. Furthermore, the insulating film 160A, the third conductive film 171A, and the fourth conductive film 172A are formed over the oxide semiconductor film 130C.

Next, the third resist mask 156 is formed over the fourth conductive film 172A (see FIG. 38(A)). Then, the third conductive film 171A, the fourth conductive film 172A, the insulating film 160A, and the oxide semiconductor film 130C are selectively etched using the resist mask, whereby the conductive layer 170 including the conductive layer 171 and the conductive layer 172, the insulating layer 160, and the oxide semiconductor layer 130c are formed (see FIG. 38(B)).

Next, the insulating layer 175 and the insulating layer 180 are formed over the insulating layer 120, the oxide semiconductor layer 130 (the oxide semiconductor layer 130a, the oxide semiconductor layer 130b, and the oxide semiconductor layer 130c), the conductive layer 140, the conductive layer 150, the insulating layer 160, and the conductive layer 170.

Next, openings reaching the conductive layer 141 and the conductive layer 151 are provided in the insulating layer 175 and the insulating layer 180, and a fifth conductive film is formed to cover the openings. Then, a fourth resist mask is provided over the fifth conductive film and the fifth conductive film is selectively etched using the resist mask, whereby the conductive layer 142 and the conductive layer 152 are formed (see FIG. 38(C)).

Through the above steps, the transistor 107 can be manufactured.

Note that the variety of films such as the metal films, the semiconductor films, and the inorganic insulating films which are described in this embodiment typically can be formed by a sputtering method or a plasma CVD method but may be formed by another method, e.g., a thermal CVD method. A MOCVD (Metal Organic Chemical Vapor Deposition) method or an ALD (Atomic Layer Deposition) method may be employed as an example of a thermal CVD method.

A thermal CVD method is a formation method in which plasma is not used and thus has an advantage that no defect due to plasma damage is generated.

Furthermore, in a thermal CVD method, deposition may be performed by deposition over the substrate in such a manner that a source gas and an oxidizer are supplied to the chamber at a time, the pressure in the chamber is set to an atmospheric pressure or a reduced pressure, and reaction is caused in the vicinity of the substrate or over the substrate.

Deposition by an ALD method is performed in such a manner that the pressure in a chamber is set to an atmospheric pressure or a reduced pressure, source gases for reaction are introduced into the chamber and reacted, and then this is repeated. An inert gas (argon, nitrogen, or the like) may be introduced as a carrier gas together with the source gas. For example, two or more kinds of source gases may be sequentially supplied to the chamber. At this time, after reaction of a first source gas, an inert gas is introduced, and then a second source gas is introduced so that the plural kinds of source gases are not mixed. Alternatively, the first source gas may be exhausted by vacuum evacuation instead of introduction of the inert gas, and then the second source gas may be introduced. The first source gas is adsorbed on the surface of the substrate and causes a reaction to form a first layer; then the second source gas introduced later is adsorbed and causes a reaction, so that a second layer is stacked over the first layer to form a thin film. This sequence of the gas introduction is repeated a plurality of times while being controlled until a desired thickness is obtained, so that a thin film with excellent step coverage can be formed. The thickness of the thin film can be adjusted by the number of repetition times of gas introduction; therefore, accurate adjustment of a thickness is possible, and thus the method is suitable for a case of manufacturing a minute FET.

The variety of films such as the metal film, the semiconductor film, and the inorganic insulating film which have been disclosed in the embodiments described above can be formed by a thermal CVD method such as a MOCVD method or an ALD method. For example, in the case where an In—Ga—Zn—O film is formed, trimethylindium (In($CH_3$)$_3$), trimethylgallium (Ga($CH_3$)$_3$)), and dimethylzinc (Zn($CH_3$)$_2$) can be used. Without limitation to these combinations, triethylgallium (Ga($C_2H_5$)$_3$) can be used instead of trimethylgallium and diethylzinc (Zn($C_2H_5$)$_2$) can be used instead of dimethylzinc.

For example, in the case where a hafnium oxide film is formed with a deposition apparatus using ALD, two kinds of gases, i.e., ozone ($O_3$) as an oxidizer and a source material gas that is obtained by vaporizing liquid containing a solvent and a hafnium precursor (hafnium alkoxide and a hafnium amide such as tetrakis(dimethylamide)hafnium (TDMAH, Hf[N($CH_3$)$_2$]$_4$) and tetrakis(ethylmethylamide)hafnium) are used.

For example, in the case where an aluminum oxide film is formed using a deposition apparatus employing ALD, two kinds of gases, i.e., $H_2O$ as an oxidizer and a source gas which is obtained by vaporizing liquid containing a solvent and an aluminum precursor (trimethylaluminum (TMA, Al($CH_3$)$_3$, or the like) are used. As another material, tris(dimethylamide)aluminum, triisobutylaluminum, aluminum tris(2,2,6,6-tetramethyl-3,5-heptanedionate), or the like can be given.

For example, in the case where a silicon oxide film is formed with a deposition apparatus employing ALD, hexachlorodisilane is adsorbed on a surface where a film is to be formed, chlorine contained in the adsorbate is removed, and radicals of an oxidizing gas ($O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced to form an initial tungsten film, and then a $WF_6$ gas and an $H_2$ gas are sequentially introduced, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus employing ALD, an In($CH_3$)$_3$ gas and an $O_3$ gas are sequentially introduced to form an In—O layer, then a Ga($CH_3$)$_3$ gas and an $O_3$ gas are sequentially introduced to form a GaO layer, and then Zn($CH_3$)$_2$ and an $O_3$ gas are sequentially introduced to form a ZnO layer. Note that the order of these layers is not limited to this example. A mixed compound layer such as an In—Ga—O layer, an In—Zn—O layer, or a Ga—Zn—O layer may be formed by using any of these gases. Note that although an $H_2O$ gas which is obtained by bubbling with an inert gas such as Ar may be used instead of an $O_3$ gas, it is preferable to use an $O_3$ gas, which does not contain H.

The structure described in this embodiment can be used in appropriate combination with any of the structures described in the other embodiments.

Embodiment 6

A structure of an oxide semiconductor film that can be used in one embodiment of the present invention is described below.

Note that in this specification, "parallel" indicates a state where the angle formed between two straight lines is greater than or equal to −10° and less than or equal to 10°, and accordingly also includes the case where the angle is greater than or equal to −5° and less than or equal to 5°. In addition, "perpendicular" indicates a state where the angle formed between two straight lines is greater than or equal to 80° and less than or equal to 100°, and accordingly also includes the case where the angle is greater than or equal to 85° and less than or equal to 95°.

Furthermore, in the case where a crystal is trigonal or rhombohedral in this specification, it is expressed as a hexagonal crystal system.

An oxide semiconductor film is classified roughly into a single-crystal oxide semiconductor film and a non-single-crystal oxide semiconductor film. The non-single-crystal oxide semiconductor film includes any of a CAAC-OS (C-Axis Aligned Crystalline Oxide Semiconductor) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

When a combined analysis image (also referred to as a high-resolution TEM image) of a bright-field image and a diffraction pattern of the CAAC-OS film is observed with a transmission electron microscope (TEM: Transmission Electron Microscope), a plurality of crystal parts is seen.

However, in the high-resolution TEM image, a boundary between crystal parts, that is, a grain boundary (also referred to as a grain boundary) is not clearly observed. Thus, it can be said that in the CAAC-OS film, a reduction in electron mobility due to the grain boundary is less likely to occur.

According to the high-resolution cross-sectional TEM image of the CAAC-OS film observed in a direction substantially parallel to a sample surface, it can be found that metal atoms are arranged in a layered manner in the crystal parts. Each metal atom layer has a morphology reflecting unevenness of a surface over which the CAAC-OS film is formed (hereinafter, also referred to as a formation surface) or a top surface thereof, and is arranged parallel to the formation surface or the top surface of the CAAC-OS film.

On the other hand, according to the high-resolution planar TEM image of the CAAC-OS film observed in a direction substantially perpendicular to the sample surface, it can be found that metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD: X-Ray Diffraction) apparatus. For example, when the CAAC-OS film including an $InGaZnO_4$ crystal is analyzed by an out-of-plane method, a peak appears in some cases when the diffraction angle ($2\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic arrangement of the oxide semiconductor film and causes a decrease in crystallinity when contained in the oxide semiconductor film. Note that the impurity contained in the oxide semiconductor film might serve as a carrier trap or a carrier generation source.

Furthermore, the CAAC-OS film is an oxide semiconductor film having a low density of defect states. In some cases, oxygen vacancies in the oxide semiconductor film serve as carrier traps or serve as carrier generation sources by capturing hydrogen.

That the impurity concentration is low and the density of defect states is low (the number of oxygen vacancies is small) is referred to as "highly purified intrinsic" or "substantially highly purified intrinsic". A highly purified intrinsic or substantially highly purified intrinsic oxide semiconductor film has few carrier generation sources, and thus can have a low carrier density. Thus, a transistor including the oxide semiconductor film rarely has electrical characteristics of negative threshold voltage (is rarely normally on). The highly purified intrinsic or substantially highly purified intrinsic oxide semiconductor film has few carrier traps. Accordingly, the transistor including the oxide semiconductor film is a transistor having little variation in electrical characteristics and high reliability. Note that electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

Furthermore, in a transistor using the CAAC-OS film, variation in the electrical characteristics due to irradiation with visible light or ultraviolet light is small.

Next, a microcrystalline oxide semiconductor film is described.

A microcrystalline oxide semiconductor film has a region where a crystal part is observed and a region where a crystal part is not clearly observed in a high resolution TEM image. In many cases, a crystal part in the microcrystalline oxide semiconductor film has a size greater than or equal to 1 nm and less than or equal to 100 nm, or greater than or equal to 1 nm and less than or equal to 10 nm. An oxide semiconductor film including a nanocrystal (nc: nanocrystal) which is a microcrystal with a size greater than or equal to 1 nm and less than or equal to 10 nm, or a size greater than or equal to 1 nm and less than or equal to 3 nm is particularly referred to an nc-OS (nanocrystalline Oxide Semiconductor) film. Furthermore, in a high resolution TEM image of the nc-OS film, a grain boundary cannot be found clearly sometimes for example.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Furthermore, there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Furthermore, a diffraction pattern like a halo pattern is observed when the nc-OS film is subjected to electron diffraction (also referred to as a selected-area electron diffraction) using an electron beam having a probe diameter (e.g., larger than or equal to 50 nm) larger than a crystal part. Meanwhile, spots are observed when the nc-OS film is subjected to nanobeam electron diffraction using an electron beam having a probe diameter close to or smaller than the size of a crystal part. Furthermore, when the nc-OS film is subjected to nanobeam electron diffraction, circumferentially distributed spots are observed in some cases. Also, when the nc-OS film is subjected to nanobeam electron diffraction, a plurality of spots is observed in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film. Hence, the nc-OS film has a higher density of defect states than the CAAC-OS film.

Next, an amorphous oxide semiconductor film is described.

The amorphous oxide semiconductor film is an oxide semiconductor film which has disordered atomic arrangement and no crystal part. An example thereof is an oxide semiconductor film with a non-crystalline state like quartz glass.

In the high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. Furthermore, a halo pattern is observed when the amorphous oxide semiconductor film is subjected to electron diffraction. Furthermore, a halo pattern is observed but a spot is not observed when the amorphous oxide semiconductor film is subjected to nanobeam electron diffraction.

Note that an oxide semiconductor film may have a structure having physical properties between the nc-OS film and the amorphous oxide semiconductor film. The oxide semiconductor film having such a structure is specifically referred to as an amorphous-like oxide semiconductor (amorphous-like OS: amorphous-like Oxide Semiconductor) film.

In a high-resolution TEM image of the amorphous-like OS film, a void (also referred to as a void) may be seen. Furthermore, in the high-resolution TEM image, there are a region where a crystal part is clearly observed and a region where a crystal part is not observed. In the amorphous-like OS film, crystallization by irradiation with a slight amount of electrons used for TEM observation occurs and growth of the crystal part is found sometimes. In contrast, crystallization by a slight amount of electron beam used for TEM observation is less observed in the nc-OS film having good quality.

Note that the crystal part size in the amorphous-like OS film and the nc-OS film can be measured using high-resolution TEM images. For example, an InGaZnO$_4$ crystal has a layered structure in which two Ga—Zn—O layers are included between In—O layers. A unit cell of the InGaZnO$_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, with a focus on lattice fringes in the high-resolution TEM image, lattice fringes in which the lattice spacing therebetween is greater than or equal to 0.28 nm and less than or equal to 0.30 nm each correspond to the a-b plane of the InGaZnO$_4$ crystal.

Note that an oxide semiconductor film may be a stacked film including two or more of an amorphous oxide semiconductor film, an amorphous-like OS film, a microcrystalline oxide semiconductor film, and a CAAC-OS film, for example.

The structure described in this embodiment can be used in combination with any of the structures described in the other embodiments as appropriate.

Embodiment 7

An imaging device according to one embodiment of the present invention and a semiconductor device including the imaging device can be used for display devices, personal computers, and image reproducing devices provided with recording media (typically, devices that reproduce the content of recording media such as digital versatile discs (DVDs) and have displays for displaying the reproduced images). Other than the above, as an electronic devices which can use the imaging device according to one embodiment of the present invention or the semiconductor device including the imaging device, mobile phones, game consoles including portable game consoles, portable information terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), vending machines, and the like can be given. FIG. 39 illustrates specific examples of these electronic devices.

Figure 39A:
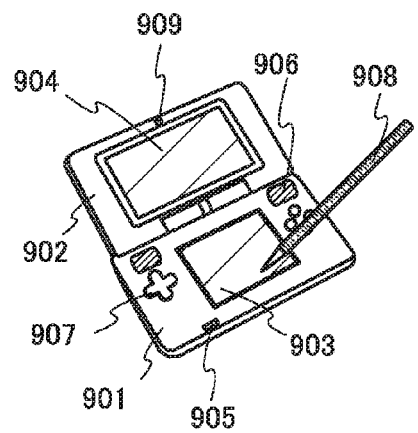
FIG. 39 Diagrams each illustrating an electronic device.

FIG. 39(A) illustrates a portable game console including a housing 901, a housing 902, a display portion 903, a display portion 904, a microphone 905, a speaker 906, an operation key 907, a stylus 908, a camera 909, and the like. Although the portable game console illustrated in FIG. 39(A) has the two display portions 903 and 904, the number of display portions included in a portable game console is not limited to this. The imaging device of one embodiment of the present invention can be used in the camera 909.

Figure 39B:
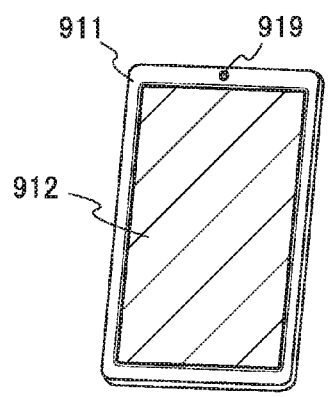

FIG. 39(B) illustrates a portable information terminal, which includes a first housing 911, a display portion 912, a camera 919, and the like. A touch panel function of the display portion 912 enables input and output of information. The imaging device of one embodiment of the present invention can be used in the camera 909.

Figure 39C:
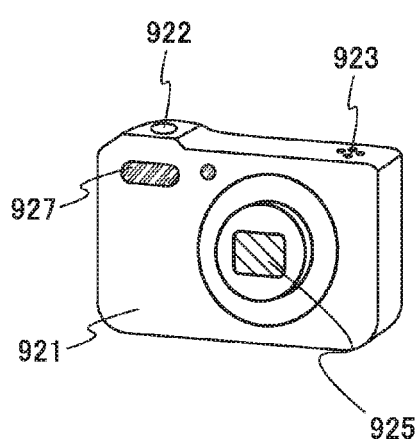

FIG. 39(C) illustrates a digital camera including a housing 921, a shutter button 922, a microphone 923, a light-emitting portion 927, a lens 925, and the like. The imaging device of one embodiment of the present invention can be used in a portion corresponding to a focus of the lens 925.

Figure 39D:
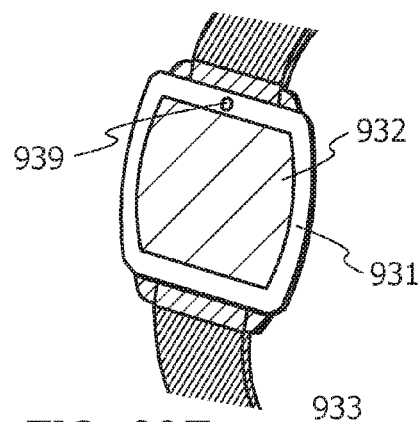

FIG. 39(D) illustrates a wrist-watch-type information terminal, which includes a housing 931, a display portion 932, a wristband 933, a camera 939, and the like. The display portion 932 may be a touch panel. The imaging device of one embodiment of the present invention can be used in the camera 909.

Figure 39E:
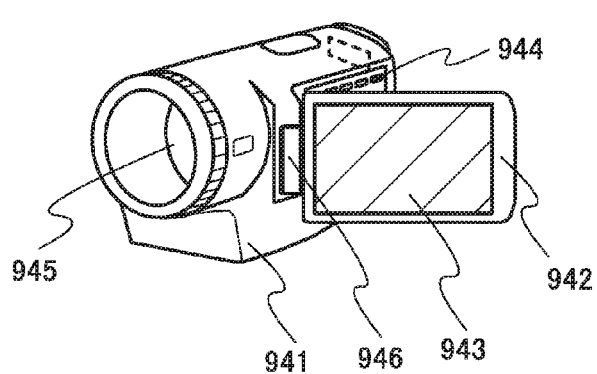

FIG. 39(E) illustrates a video camera including a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. A structure in which images displayed on the display portion 943 is switched in accordance with the angle at the joint 946 between the first housing 941 and the second housing 942 may be employed. The imaging device of one embodiment of the present invention can be used in a portion corresponding to a focus of the lens 945.

Figure 39F:
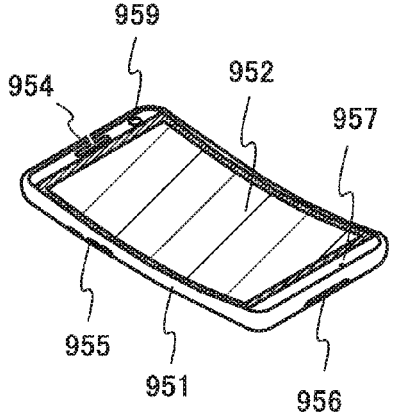

FIG. 39(F) illustrates a mobile phone which includes a display portion 952, a microphone 957, a speaker 954, a camera 959, an input/output terminal 956, an operation button 955, and the like in a housing 951. The imaging device of one embodiment of the present invention can be used in the camera 959.

Note that this embodiment can be combined with any of the other embodiments in this specification as appropriate.

REFERENCE NUMERALS

31: circuit, 32: circuit, 33: circuit, 34: circuit, 40: silicon substrate, 51: transistor, 52: transistor, 53: transistor, 54: transistor, 55: transistor, 56: transistor, 57: transistor, 58: transistor, 59: transistor, 60: photodiode, 61: photodiode, 62: photodiode, 63: photodiode, 65B: spectroscopic element, 65G: spectroscopic element, 65R: spectroscopic element, 66: region, 67: mirror, 80: insulating layer, 90: circuit portion, 92: circuit portion, 101: transistor, 102: transistor, 103: transistor, 104: transistor, 105: transistor, 106: transistor, 107: transistor, 108: transistor, 109: transistor, 110: transistor, 111: transistor, 112: transistor, 115: substrate, 120: insulating layer, 130: oxide semiconductor layer, 130a: oxide semiconductor layer, 130A: oxide semiconductor film, 130b: oxide semiconductor layer, 130B: oxide semiconductor film, 130c: oxide semiconductor layer, 130C: oxide semiconductor film, 140: conductive layer, 141: conductive layer, 141a: conductive layer, 142: conductive layer, 150: conductive layer, 151: conductive layer, 152: conductive layer, 156: resist mask, 160: insulating layer, 160A: insulating film, 170: conductive layer, 171: conductive layer, 171A: conductive film, 172: conductive layer, 172A: conductive film, 173: conductive layer, 175: insulating layer, 180: insulating layer, 231: region, 232: region, 233: region, 331: region, 332: region, 333: region, 334: region, 335: region, 501: signal, 502: signal, 503: signal, 504: signal, 505: signal, 506: signal, 507: signal, 508: signal, 509: signal, 510: signal, 511: signal, 512: signal, 515: period, 516: period, 517: period, 615: period, 617: period, 621: period, 622: period, 623: period, 901: housing, 902: housing, 903: display portion, 904: display portion, 905: microphone, 906: speaker, 907: operation key, 908: stylus, 909: camera, 911: housing, 912: display portion, 919: camera, 921: housing, 922: shutter button, 923: microphone, 923: microphone, 925: lens, 927: light-emitting portion, 931: housing, 932: display portion, 933: wristband, 939: camera, 941: housing, 942: housing, 943: display portion, 944: operation key, 945: lens, 946: joint, 951: housing, 952: display portion, 954: speaker, 955: button, 956: input/output terminal, 957: microphone, 959: camera, 1500: element isolation layer, 1510: light-blocking layer, 1540: microlens, 1541: microlens.

The invention claimed is:

1. An imaging device comprising:
a pixel circuit; and
a spectroscopic element,
wherein the pixel circuit comprises a first circuit, a second circuit, a third circuit, and a first capacitor,
wherein the first circuit comprises a first photoelectric conversion element, a first transistor, and a second transistor,
wherein the second circuit comprises a second photoelectric conversion element, a third transistor, and a fourth transistor,
wherein the third circuit comprises a fifth transistor, a sixth transistor, a seventh transistor, and a second capacitor,
wherein the spectroscopic element is provided over the first photoelectric conversion element or the second photoelectric conversion element,
wherein one of terminals of the first photoelectric conversion element is electrically connected to one of a source and a drain of the first transistor,
wherein one of a source and a drain of the second transistor is electrically connected to the one of the source and the drain of the first transistor,
wherein the other of the source and the drain of the first transistor is electrically connected to one of terminals of the first capacitor,
wherein one of terminals of the second photoelectric conversion element is electrically connected to one of a source and a drain of the third transistor,
wherein one of a source and a drain of the fourth transistor is electrically connected to the one of the source and the drain of the third transistor,
wherein the other of the source and the drain of the fourth transistor is electrically connected to the one of the terminals of the first capacitor,
wherein one of a source and a drain of the fifth transistor is electrically connected to the other of the terminals of the first capacitor,
wherein one of terminals of the second capacitor is electrically connected to the other of the terminals of the first capacitor,
wherein a gate of the sixth transistor is electrically connected to the other of the terminals of the first capacitor, and
wherein one of a source and a drain of the sixth transistor is electrically connected to one of a source and a drain of the seventh transistor.

2. The imaging device according to claim 1, wherein the first photoelectric conversion element and the second photoelectric conversion element have the same structure.

3. The imaging device according to claim 1, wherein the first capacitor has a higher capacitance value than the second capacitor.

4. The imaging device according to claim 1, wherein the capacitance value between the one of the terminals of the first photoelectric conversion element, the one of the source and the drain of the first transistor, and the one of the terminals of the first capacitor is the same as the capacitance value between the one of the terminals of the second photoelectric conversion element, the one of the source and the drain of the third transistor, and the one of the terminals of the first capacitor.

5. The imaging device according to claim 1, wherein the spectroscopic element is provided over the first photoelectric conversion element, and thus a structure can be employed in which light of W−R, W−G, or W−B obtained by excluding any one of light components of wavelengths corresponding to red (R), green (G), and blue (B) from light (W) which enters the pixel circuit enters the first photoelectric conversion element; and light of W+R, W+G, or W+B obtained by synthesizing light (W) which enters the pixel circuit and the excluded light enters the second photoelectric conversion element.

6. The imaging device according to claim 5, wherein part of the excluded light in a pixel adjacent to a pixel including the pixel circuit enters the second photoelectric conversion element.

7. The imaging device according to claim 1, wherein the spectroscopic element is provided over the second photoelectric conversion element, and thus a structure can be employed in which light of W−(R/2)−(B/2), W−(R/2)−(G/2), or W−(B/2)−(G/2) obtained by excluding any two of ½ light components of wavelengths corresponding to red (R), green (G), and blue (B) from light (W) which enters the pixel circuit enters the second photoelectric conversion element; and W+(R/2)+(B/2), W+(R/2)+(G/2), or W+(B/2)+(G/2) obtained by synthesizing light (W) which enters the pixel circuit and the excluded light enters the first photoelectric conversion element.

8. The imaging device according to claim 7, wherein part of the excluded light in an adjacent pixel enters the second photoelectric conversion element.

9. The imaging device according to claim 1, wherein some or all of the first to seventh transistors include oxide semiconductors in active layers, and the oxide semiconductor comprises In, Zn, and M (M is Al, Ti, Ga, Sn, Y, Zr, La, Ce, Nd, or Hf).

10. An electronic device comprising:
the imaging device according to claim 1, and
a display device, an operation key, or a shutter button.

* * * * *